United States Patent [19]

Glaser et al.

[11] Patent Number: 5,036,457
[45] Date of Patent: Jul. 30, 1991

[54] BIT STRING COMPRESSOR WITH BOOLEAN OPERATION PROCESSING CAPABILITY

[75] Inventors: Edward L. Glaser, Santa Monica; Paul R. DesJardins, Long Beach; Douglas W. Caldwell, Los Angeles; Eliot D. Glaser, Van Nuys, all of Calif.

[73] Assignee: Nucleus International Corporation, Culver City, Calif.

[21] Appl. No.: 185,888

[22] Filed: Apr. 22, 1988

Related U.S. Application Data

[63] Continuation-in-part of Ser. No. 100,761, Sep. 24, 1987, abandoned.

[51] Int. Cl.$^5$ ............................................. H03M 7/00
[52] U.S. Cl. ............................... 364/200; 364/259; 364/259.1; 364/259.2; 364/259.8; 364/260.4; 364/260.6; 341/50; 341/63; 341/64; 341/51
[58] Field of Search ............... 364/200, 900, 300; 341/50, 51, 55, 95

[56] References Cited

U.S. PATENT DOCUMENTS

| | | | |
|---|---|---|---|
| 2,853,698 | 9/1958 | Nettleton et al. | 341/51 |
| 3,400,380 | 9/1968 | Packard et al. | 341/51 |
| 3,717,851 | 2/1973 | Cocke et al. | 364/200 |
| 4,117,470 | 9/1978 | Elliott | 340/750 |
| 4,319,225 | 3/1982 | Klose | 341/51 |
| 4,464,650 | 8/1984 | Eastman et al. | 341/51 |
| 4,558,302 | 12/1985 | Welch | 341/51 |
| 4,586,027 | 4/1986 | Tsukiyama | 341/95 |
| 4,626,829 | 12/1986 | Hauck | 341/63 |
| 4,706,265 | 11/1987 | Furukawa | 375/122 |

OTHER PUBLICATIONS

"Run-Length Encodings"-Solomon W. Golomb, Department of Electrical Engineering, University of Southern California, Los Angeles, Calif., (1966).

"Optimizing a Scheme for Run Length Encoding"-Stevan D. Bradley, (Published *Proceedings of the IEEE*, Jan., 1969).

"Encoding Verbal Information as Unique Numbers"-W. D. Hagamen et al., (Published *IBM Syst. J.*, No. 4, 1972, pp. 278-315).

*Primary Examiner*—Gareth D. Shaw
*Assistant Examiner*—Kevin A. Kriess
*Attorney, Agent, or Firm*—Christie, Parker & Hale

[57] ABSTRACT

An apparatus and method, for use with a computer, for converting an uncompressed one-dimensional array of binary bits into a compressed binary bit string and/or for processing a Boolean operation on a first and a second compressed bit string. The first and second bit strings each contain one or more impulses. An impulse contains a run, which is a string of one or more bits of the same binary value, and an ending bit having a polarity opposite the polarity of the run. The impulses are encoded in one or more compressed impulse formats. Each compressed impulse format contains at least a first and a second indicator. The first indicator is for indicating the binary value of one or more same polarity bits of the run and the second indicator is for indicating the length of bits of the impulse. The length of bits is a quantity of the same polarity bits of the run and/or the ending bit having a polarity opposite the run.

179 Claims, 24 Drawing Sheets

| INPUT OPERATION | INPUTS/OUTPUTS | POLARITY | | | |
|---|---|---|---|---|---|
| AND | SHORTER IMPULSE | 0 | 1 | 0 | 1 |
| | LONGER IMPULSE | 0 | 0 | 1 | 1 |
| | INTERMEDIATE RESULT (F$_2$) | 0 RUN | 0 RUN | 0 IMPULSE | 1 IMPULSE |
| OR | SHORTER IMPULSE | 0 | 1 | 0 | 1 |
| | LONGER IMPULSE | 0 | 0 | 1 | 1 |
| | INTERMEDIATE RESULT (F$_2$) | 0 IMPULSE | 1 IMPULSE | 1 RUN | 1 RUN |
| XOR | SHORTER IMPULSE | 0 | 1 | 0 | 1 |
| | LONGER IMPULSE | 0 | 0 | 1 | 1 |
| | INTERMEDIATE RESULT (F$_2$) | 0 IMPULSE | 1 IMPULSE | 1 IMPULSE | 0 IMPULSE |

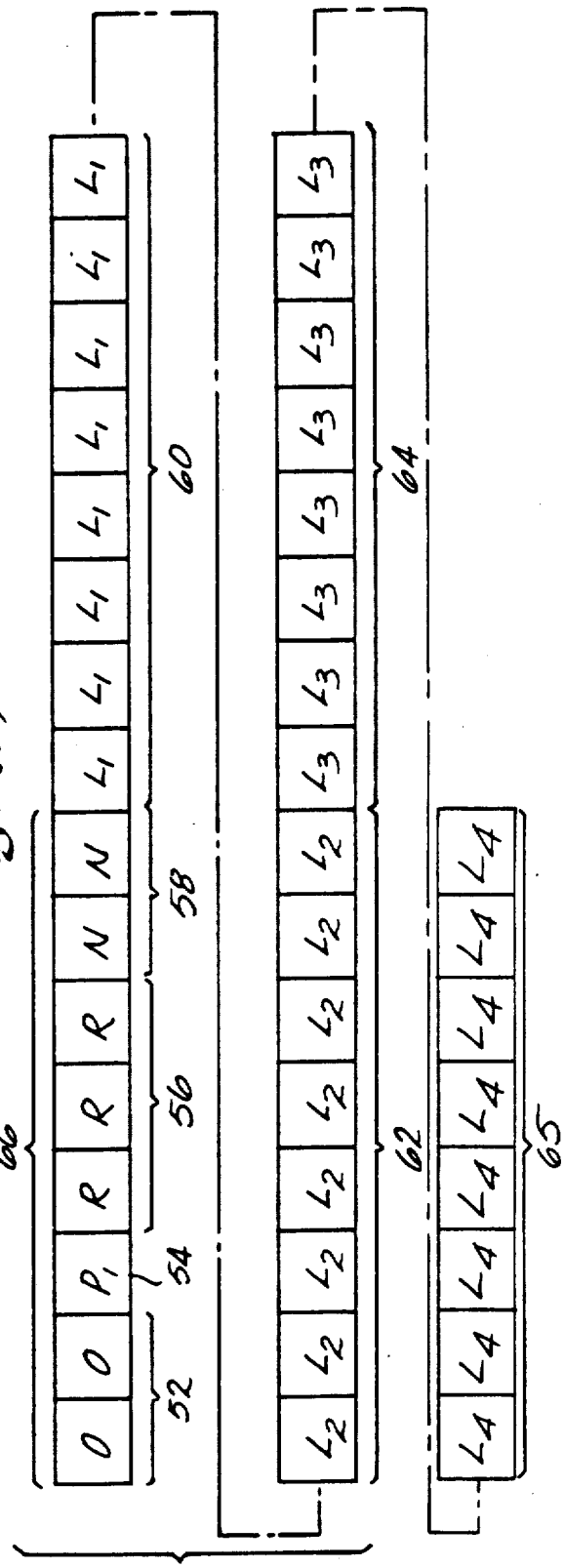

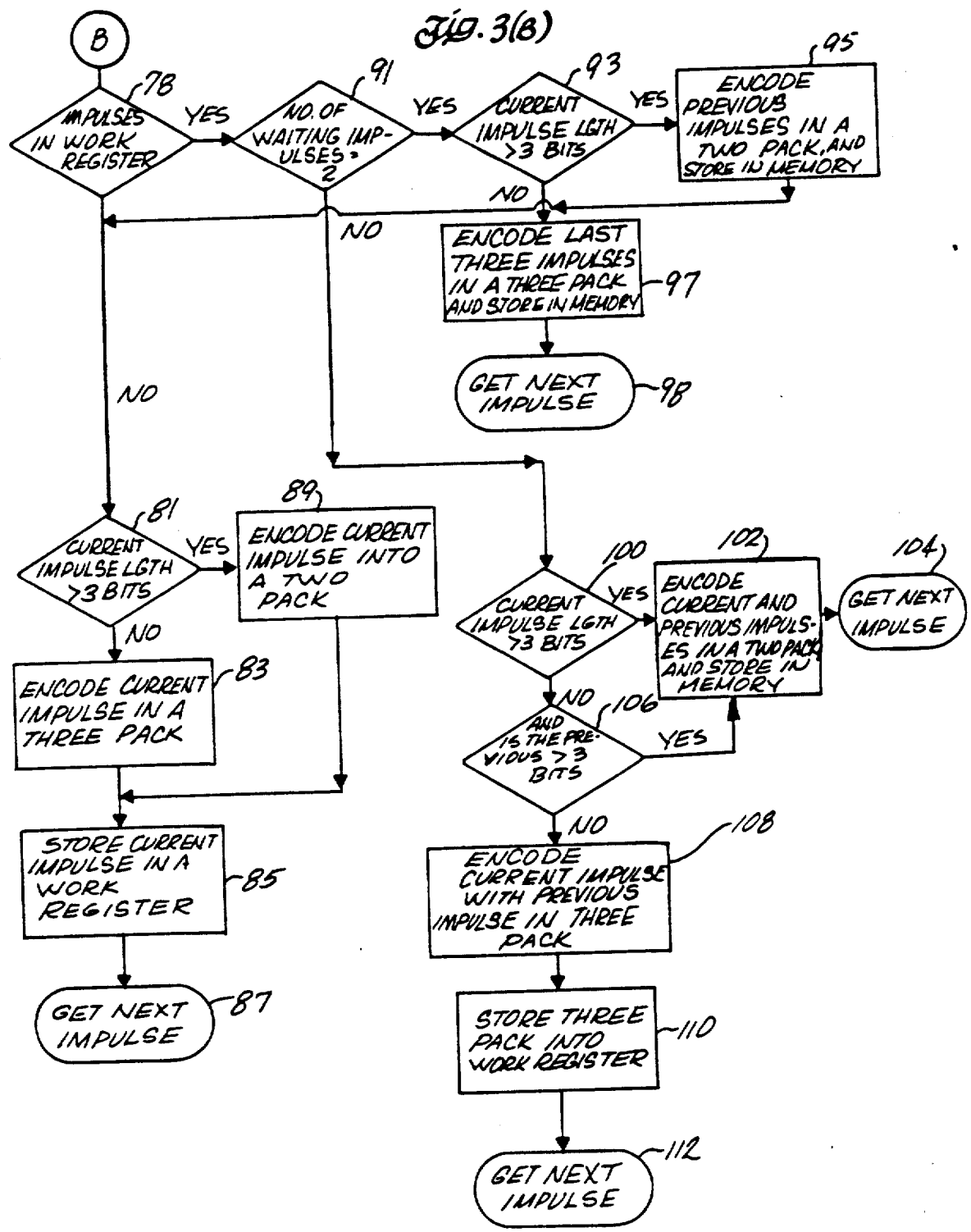

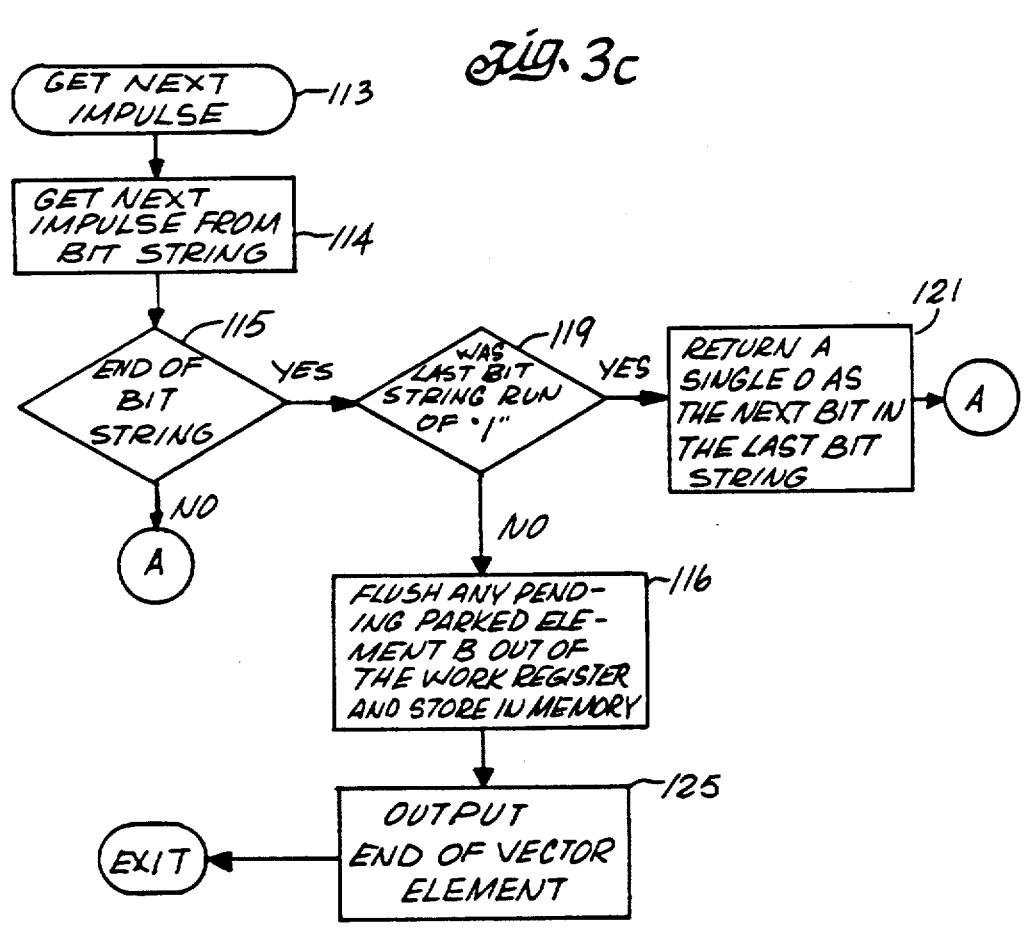

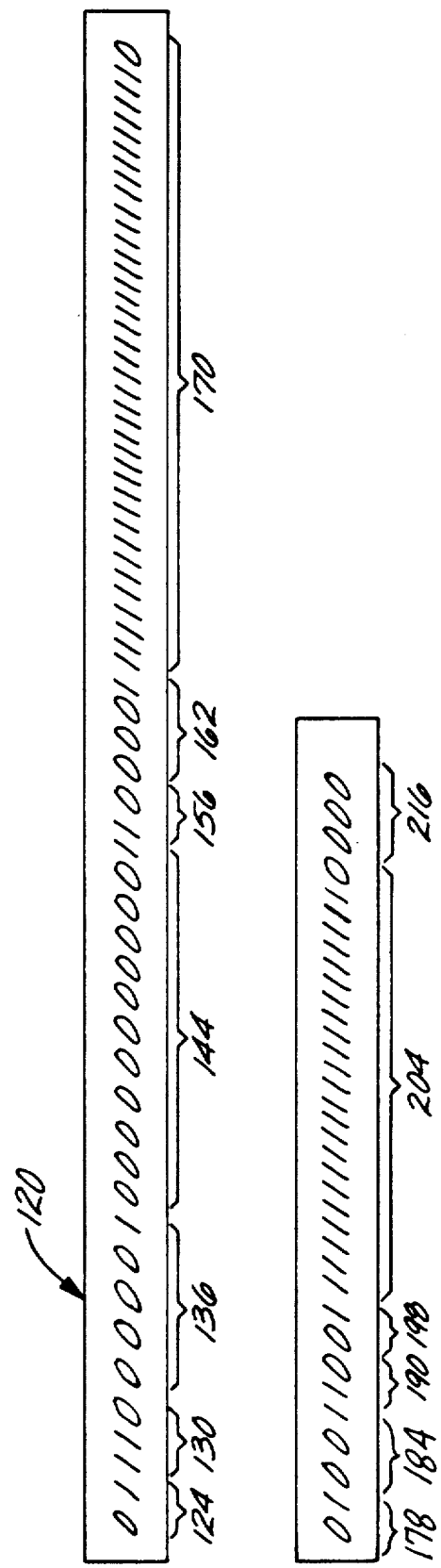

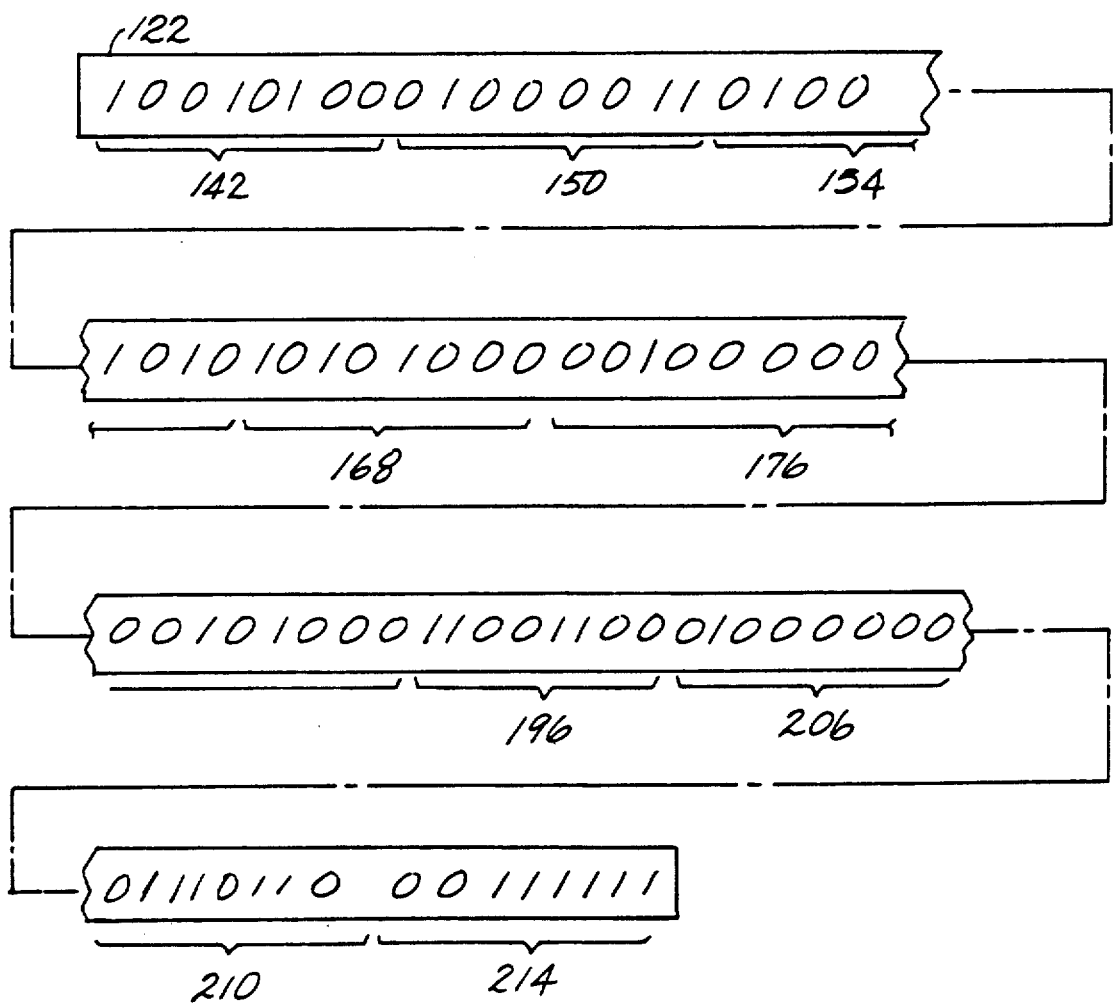

FIG. 5(A)

| | IMPULSE POLARITY | IMPULSE LENGTH | CONTENTS OF WORK REGISTER | RESULTING COMPRESSED IMPULSE |
|---|---|---|---|---|
| 126 | 0 | 2 | | (SEE FIG. 4B) |
| 128 | | | THREE PACK<br>1 1 0 P$_2$ P$_3$ L$_2$ L$_3$ 0 | |
| 132 | 1 | 3 | | |
| 134 | | | THREE PACK<br>1 1 0 1 P$_3$ 1 L$_3$ 0 | |
| 138 | 0 | 5 | | |
| 140 | | | TWO PACK<br>1 0 0 P$_2$ L$_2$ L$_2$ 1 1 | TWO PACK<br>1 0 0 1 0 1 0 0 (142) |
| 146 | 0 | 12 | | |
| 148 | | | | ONE PACK<br>0 1 0 0 0 0 1 1 (150) |
| 152 | | | | ONE PACK<br>0 1 0 0 1 0 1 0 (154) |
| 158 | 1 | 2 | | |
| 160 | | | THREE PACK<br>1 1 1 P$_2$ P$_3$ L$_2$ L$_3$ 0 | |
| 164 | 0 | 4 | | |
| 166 | | | | TWO PACK<br>1 0 1 0 1 0 0 0 (168) |
| 172 | 1 | 40 | | |
| 174 | | | | EXTENDED ELEMENT<br>0010000000101000 (176) |
| 180 | 0 | 2 | | |
| 182 | | | THREE PACK<br>1 1 0 P$_2$ P$_3$ L$_2$ L$_3$ 0 | |
| 186 | 0 | 3 | | |
| 188 | | | THREE PACK<br>1 1 0 0 P$_3$ 1 L$_3$ 0 | |
| 192 | 1 | 2 | | |
| 194 | | | | THREE PACK<br>1 1 0 0 1 1 0 0 (196) |

FIG. 5(B)

| | IMPULSE POLARITY | IMPULSE LENGTH | CONTENTS OF THE WORK REGISTER | RESULTING COMPRESSED IMPULSE |
|---|---|---|---|---|
| 200 | 0 | 2 | | |
| 202 | | | THREE PACK<br>1 1 0 $P_2$ $P_3$ $L_2$ $L_3$ 0 | |
| 205 | 1 | 24 | | |
| 207 | | | | ONE PACK<br>01000000 (206) |
| 208 | | | | ONE PACK<br>01110110 (210) |
| 212 | | | | EXTENDED ELEMENT<br>00111111 (214) |

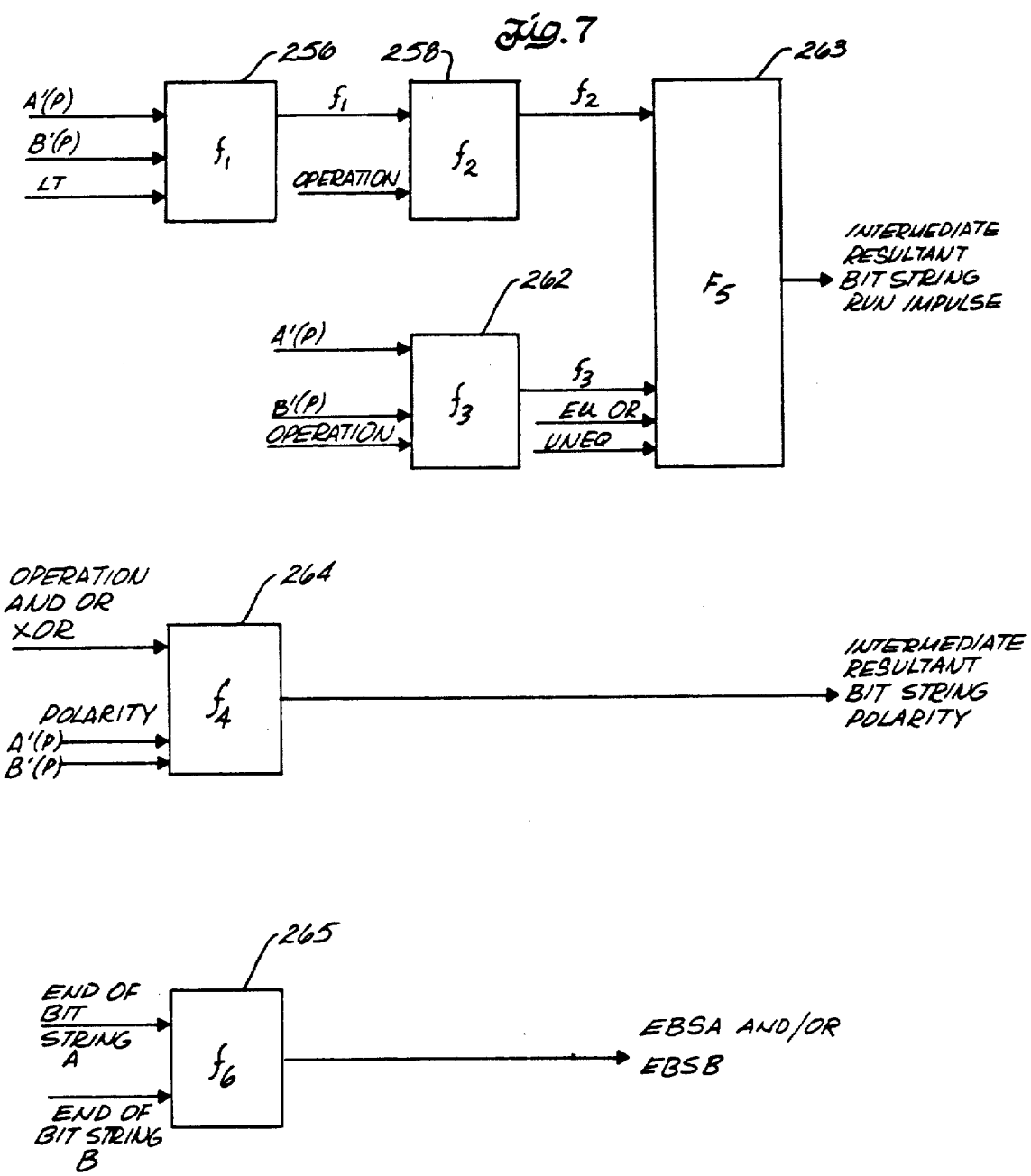

Fig. 8(A)

| INPUT OPERATION INPUTS & OUTPUTS 251, 253 | | POLARITY 225 | | | | | | |
|---|---|---|---|---|---|---|---|---|
| AND | SHORTER IMPULSE | 0 | 0 | 0 | 1 | 1 | | |
| | LONGER IMPULSE | 0 | 0 | 1 | 0 | 1 | | |
| | INTERMEDIATE RESULT ($F_2$) | 0 RUN | 0 RUN | 0 IMPULSE | 1 IMPULSE | 1 IMPULSE | | |
| OR | SHORTER IMPULSE | 0 | 1 | 0 | 0 | 1 | | |
| | LONGER IMPULSE | 0 | 0 | 1 | 0 | 1 | | |
| | INTERMEDIATE RESULT ($F_2$) | 0 IMPULSE | 1 IMPULSE | 1 RUN | 0 RUN | 1 RUN | | |
| XOR | SHORTER IMPULSE | 0 | 1 | 0 | 0 | 1 | | |
| | LONGER IMPULSE | 0 | 0 | 1 | 0 | 1 | | |
| | INTERMEDIATE RESULT ($F_2$) | 0 IMPULSE | 1 IMPULSE | 1 IMPULSE | 0 IMPULSE | 0 IMPULSE | | |

266, 267, 268

| 271 INPUT OPERATION | 273 INPUT/OUTPUT | 278 | 275 POLARITY | 276 | 278 |
|---|---|---|---|---|---|
| AND | IMPULSE A' | 0 | 0 | 1 | 1 |
|  | IMPULSE B' | 0 | 1 | 0 | 1 / IMPULSE |
|  | INTERMEDIATE RESULT (F3) | 0 / IMPULSE | 0 RUN | 0 RUN | 1 / IMPULSE |
| OR | IMPULSE A' | 0 | 0 | 1 | 1 |
|  | IMPULSE B' | 0 | 1 | 0 | 1 / IMPULSE |
|  | INTERMEDIATE RESULT (F3) | 0 / IMPULSE | 1 RUN | 1 RUN | 1 / IMPULSE |
| XOR | IMPULSE A' | 0 | 0 | 1 | 1 |
|  | IMPULSE B' | 0 | 1 | 0 | 1 |
|  | INTERMEDIATE RESULT (F3) | 0 RUN | 1 RUN | 1 RUN | 0 RUN |

| POLARITIES | | A > B | A < B | CONDITION |
|---|---|---|---|---|
| A(1) | B(1) | 0 | 1 | |
| 0 | 0 | 0 | 0 | |
| 0 | 1 | 0 | 1 | |
| 1 | 0 | 1 | 0 | RESULTS OF $F_1$ |
| 1 | 1 | 1 | 1 | |

FIG. 9(B)

| | 0 | 1 | RESULTS OF $F_1$ |
|---|---|---|---|
| AND | 0 | 1 | |
| OR | 1 | 0 | RESULTS OF $F_2$ |
| XOR | 0 | 0 | |

FIG. 9(C)

| | 0 | 0 | 1 | 1 | A(P) |
|---|---|---|---|---|---|
| | 0 | 1 | 0 | 1 | B(P) POLARITIES |
| AND | 0 | 0 | 0 | 1 | |
| OR | 0 | 1 | 1 | 1 | RESULTS OF $F_4$ |
| XOR | 0 | 1 | 1 | 0 | |

FIG. 9(D)

| OPERATION | 0 | 1 | 0 | 0 | 011 A(P) |
|---|---|---|---|---|---|
| | | | | 1 | B(P) POLARITIES |
| AND | 1 | 0 | 0 | 1 | |
| OR | 1 | 0 | 0 | 1 | $F_3$ RESULTS |
| XOR | 0 | 0 | 0 | 0 | |

FIG. 9(E)
CONDITION

| OPERATION | EBSA | EBSB | EBSA + EBSB |
|---|---|---|---|
| AND | EBSA + EBSB | EBSA + EBSA | EBSA + EBSB |
| OR | EBSA | EBSB | EBSA + EBSB | RESULTS OF $F_6$ |
| XOR | EBSA | EBSB | EBSA EBSB |

FIG. 9(F)
EQ

|  |  | 0 | 1 |  |
|---|---|---|---|---|
|  | 0  0 | 0 | 0 | RESULTS OF F5 |
| $F_2, F_3$ | 0  1 | 0 | 1 |  |
|  | 1  0 | 1 | 0 |  |
|  | 1  1 | 1 | 1 |  |
|  |  | THE RESULTS OF $F_2$ | THE RESULTS OF $F_3$ |  |

Fig. 10

FIRST INDEX TABLE

A' = FIRST BIT STRING IMPULSE
B' = SECOND BIT STRING IMPULSE

| A':B' | AND | | | | | | EBSB |
|---|---|---|---|---|---|---|---|
| | B'01 | | | B'10 | | | |
| | < | = | > | < | = | > | |
| A'01 | 00 | 01 | 00 | 01 | 00 | 00 | "EBSA+EBSB" |
| A'10 | 00 | 00 | 01 | 10 | 10 | 10 | |
| EBSA | | "EBSA+EBSB" | | | | | "EBSA+EBSA" |

| A':B' | OR | | | | | | EBSB |
|---|---|---|---|---|---|---|---|
| | B'01 | | | B'10 | | | |
| | < | = | > | < | = | > | |
| A'01 | 01 | 01 | 01 | 11 | 11 | 10 | "EBSB" |
| A'10 | 10 | 11 | 11 | 11 | 10 | 11 | |
| EBSA | | "EBSA" | | | | | "EBSA+EBSB" |

| A':B' | XOR | | | | | | EBSB |
|---|---|---|---|---|---|---|---|
| | B'10 | | | B'01 | | | |
| | < | = | > | < | = | > | |
| A'01 | 01 | 00 | 01 | 10 | 11 | 10 | "EBSB" |
| A'10 | 10 | 11 | 10 | 01 | 00 | 01 | |
| EBSA | | "EBSA" | | | | | "EBSB+EBSA" |

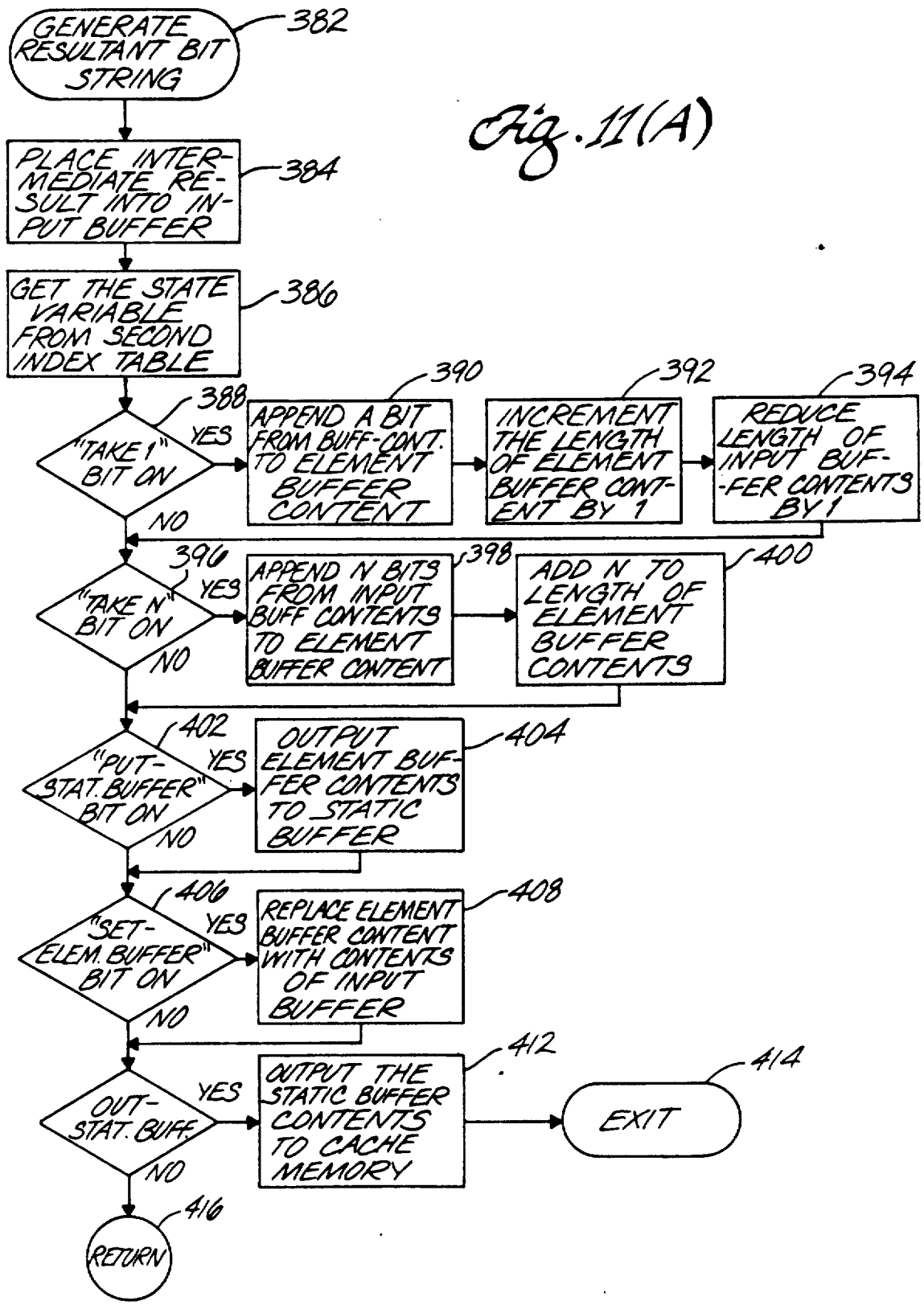

FIG. 12(A)

| NO. | 432 ELEMENT BUFFER INDEX | 434 01 | 436 10 | 438 00 | 440 11 | 442 ESBA + EBSB |
|---|---|---|---|---|---|---|
| 444 | 01 | 454 01-XX  00110 | 464 01-XX  00110 | 474 01-XX  00110 | 484 01-XX  00110 | 494 01-ESBA + EBSB  00101 |
| 446 | 10 | 456 10-XX  00110 | 466 10-XX  00110 | 476 10-XX  00110 | 486 10-XX  00110 | 496 10-ESBA + EBSB  00101 |
| 448 | 00 | 458 00-01  01000 | 468 00-1X  10110 | 478 00-00  01000 | 488 00-1X  10110 | 498 PUT-ESBA + EBSB  00001 |
| 450 | 11 | 460 11-0X  10110 | 470 11-10  01000 | 480 11-0X  10110 | 490 11-11  01000 | 500 11-ESBA + EBSB  10101 |
| 452 | MTY | 462 SET-ELEM BUFF  00010 | 472 SET-ELEM BUFF  00010 | 482 SET-ELEM BUFF  00010 | 492 SET-ELEM BUFF  00010 | 502 PUT-ESBA + EBSB  00001 |

FIG. 12(B)

| | 532 RESULT NAME | 534 NAVIGATION VECTOR | 536A COMBINE | 538A RESULT FORM | 540 OUTPUT TO STATIC BUFF | 542 SET ELEM BUFF OR OUTPUT STATIC BUFF |
|---|---|---|---|---|---|---|
| 504 | 01--XX | 00110 | | 01 | PUT-STAT BUFF | SET-ELEM BUFF |
| 506 | 10--XX | 00110 | | 10 | PUT-STAT BUFF | SET-ELEM BUFF |
| 508 | 01--EBSA+EBSB | 00101 | | 01 | PUT-STAT BUFF | OUT-STAT BUFF |
| 510 | 10--EBSA+EBSB | 00101 | | 10 | PUT-STAT BUFF | OUT-STAT BUFF |
| 512 | 00--00 | 01000 | TAKE N | 00 | | |
| 514 | 00--01 | 01000 | TAKE N | 01 | | |
| 516 | 00--1X | 10110 | TAKE 1 | 01 | PUT-STAT BUFF | SET-ELEM BUFF |
| 518 | 11--0X | 10110 | TAKE 1 | 10 | PUT-STAT BUFF | SET-ELEM BUFF |
| 520 | 11--10 | 01000 | TAKE N | 10 | | |
| 524 | 11--11 | 01000 | TAKE N | 11 | | |
| 526 | 11--EBSA+EBSB | 10101 | TAKE 1 | 10 | PUT-STAT BUFF | OUT-STAT BUFF |
| 528 | PUT--EBSA+EBSB | 00001 | | | | OUT-STAT BUFF |
| 530 | SET--ELEM BUFF | 00010 | | | | SET-ELEM BUFF |

FIG. 13(A)

| 531 BIT STRING A: | 532 IMPULSE (P)-0 ; (L/B)-12 | 533 IMPULSE (P)-1 ; (L/B)-10 | 534 IMPULSE (P)-0 ; (L/B)-7 | 535 IMPULSE (P)-1 ; (L/B)-20 | 536 IMPULSE (P)-1 ; (L/B)-15 | 537 EBSA |
|---|---|---|---|---|---|---|
| 538 BIT STRING B: | 539 IMPULSE (P)-0 ; (L/B)-20 | 541 IMPULSE (P)-1 ; (L/B)-2 | 543 IMPULSE (P)-1 ; (L/B)-10 | 544 IMPULSE (P)-0 ; (L/B)-17 | 545 IMPULSE (P)-1 ; (L/B)-15 | 547 IMPULSE (P)-0 ; (L/B)-4 | 549 EBSB |

FIG. 13(B)

| RESULTANT BIT STRING: | (544, 578) FIG. 14 IMPULSE (P)-0 ; (L/B)-20 | (546, 578) FIG. 14 IMPULSE (P)-1 ; (L/B)-2 | (548, 578) FIG. 14 IMPULSE (P)-0 ; (L/B)-7 | (550, 578) FIG. 14 IMPULSE (P)-1 ; (L/B)-3 | (552, 578) FIG. 14 IMPULSE (P)-0 ; (L/B)-18 | (552, 578) FIG. 14 IMPULSE (P)-1 ; (L/B)-14 | "END OF BIT STRING" |

FIG. 14A

| COLUMN NO. ROW NUMBER | 560 INPUT LENGTH A' | 562 INPUT LENGTH B' | 564 RESULTANT (INTERMED.) LENGTH | 566 POLARITY A' | 568 POLARITY B' | 570 RESULT: (INTERMED.) RUN/INPUT |
|---|---|---|---|---|---|---|
| 540 | 12 | 20 | 12 | 0 | 0 | RUN |
| 542 | 10 | 8 | 8 | 1 | 0 | IMPULSE |
| 544 | 2 | 2 | 2 | 1 | 1 | IMPULSE |
| 546 | 7 | 10 | 7 | 0 | 1 | IMPULSE |
| 548 | 20 | 3 | 3 | 1 | 1 | IMPULSE |
| 550 | 17 | 17 | 17 | 1 | 0 | RUN |
| 552 | 15 | 15 | 15 | 1 | 1 | IMPULSE |
| 554 | EBSA | 4 | EBSA | EBSA | 1 | EBSA + EBSB |

FIG. 14B

| COLUMN NO. | 572 RESULT (INTERMEDIATE) LENGTH POLARITY | 574 ELEMENT BUFFER CONTENTS | 576 INPUT BUFFER CONTENTS | 578 SECOND INDEX TABLE RESULT | 580 REDUCTION: L(A') | 582 REDUCTION: L(B') | 584 EBSA AND/OR EBSB |
|---|---|---|---|---|---|---|---|
| ROW NO. | | | | | | | |
| 540 | 0 | MTY | RUN OF 0'S | RUN OF 0'S | 0 | | NO |
| 542 | 0 | RUN OF 0'S | IMPULSE OF 0'S | IMPULSE OF 0'S | 2 | 8 | NO |
| 544 | 1 | IMPULSE OF 0'S | IMPULSE OF 1'S | OUTPUT TO STATIC BUFFER IMPULSE - 0'S, SET ELEMENT BUFFER TO IMPULSE 0'S. | 0 | 0 | NO |
| 546 | 0 | IMPULSE OF 1'S | IMPULSE OF 0'S | OUTPUT TO STATIC BUFFER IMPULSE - 0'S, SET ELEMENT BUFFER TO IMPULSE 1'S. | 0 | 3 | NO |
| 548 | 1 | IMPULSE OF 0'S | IMPULSE OF 1'S | OUTPUT TO STATIC BUFFER IMPULSE 0, SET ELEMENT BUFFER TO IMPULSE 1'S. | 17 | 0 | NO |

FIG. 14B (CONT'D)

| COLUMN NO. | 572 RESULT (INTERMEDIATE) LENGTH POLARITY | 574 ELEMENT BUFFER CONTENTS | 576 INPUT BUFFER CONTENTS | 578 SECOND INDEX TABLE RESULT | 580 REDUCTION: L(A') | 582 REDUCTION: L(B') | 584 EBSA AND/OR EBSB |
|---|---|---|---|---|---|---|---|
| ROW NO. | | | | | | | |
| 550 | 0 | IMPULSE OF 1'S | RUN OF 0'S | OUTPUT TO STATIC BUFFER IMPULSE 1'S, SET ELEMENT BUFFER TO RUN 0'S. | 0 | 0 | NO |
| 552 | 1 | RUN OF 0'S | IMPULSE OF 1'S | TAKE 1 BIT FROM INPUT BUFFER AND APPEND TO ELEMENT BUFFER, OUTPUT TO STATIC BUFFER IMPULSE 0'S, SET ELEMENT BUFFER TO IMPULSE 1'S. | 0 | 0 | YES EBSA |
| 554 | EBSA + EBSB | IMPULSE OF 1'S | EBSA + EBSB | OUTPUT TO STATIC BUFFER IMPULSE - 0'S. | | | |

BIT STRING COMPRESSOR WITH BOOLEAN OPERATION PROCESSING CAPABILITY

REFERENCE TO RELATED APPLICATIONS

This application is a continuation-in-part application of the patent application which is the subject of Ser. No. 07/100,761, filed oh Sept. 24, 1987, now abandoned the priority of which is claimed and the entire disclosure of which is incorporated by reference. The subject matter of this application is related to copending application entitled A RELATIONAL DATABASE REPRESENTATION WITH RELATIONAL DATABASE OPERATION CAPABILITY to Glaser, et. al., Ser. No. 07/107,447, filed on Oct. 9, 1987 now abandoned in favor of continuation-in-part application Ser. No. 07/238,754, filed Aug. 29, 1988.

BACKGROUND OF THE INVENTION

1) Field of the Invention

This invention relates to a computer apparatus and/or method for converting an uncompressed one-dimensional array of binary bits (bit string) into a compressed bit string. This invention also relates to a computer apparatus and/or method for efficiently processing a Boolean operation on a first and a second compressed bit string.

2) Prior Art

Technological developments from the invention of the printing press through automatic acquisition of data from space exploration have foisted the information explosion on us. However, the ever growing numbers of warehouses of data, such as hard copy records, magnetic tapes, etc., attest to the need for somehow condensing the representation of data while preserving its information content. Furthermore, there is a need for quickly and economically performing Boolean operations on this data without decompressing the data to its original form.

There are two basic data compression techniques used in computers which are generally described in the prior art; first, data compression techniques which compress data stored in a database and second, bit string compression techniques which compress strings of bits representative of data.

A typical computer method of data compression monitors the statistics of data in a database and modifies data encoding in accordance therewith. For example, Huffman encoding uses a variable length code to achieve data compaction in a large database. Date, *An Introduction to Database Systems*, 4th Edition, 79-80 (1986). In accordance with the Huffman encoding scheme, characters or other basic items of information which are to be processed are encoded into bit strings of varying length, with the shortest strings being assigned to the most frequently occurring items of data. In this way, the bit strings representing these items have an average length which is much less than that of bit strings representing such items in a conventional fixed length code format.

Another computer method of data compression is a holotropic system as disclosed in U.S. Pat. No. 4,068,298 to Dechant et al. A holotropic system compresses data by automatically taking advantage of any redundancy in the data. For example, once a character, a word, a sentence, a paragraph etc. has been encountered, no subsequent occurrence of that same element need be stored in its original form. Instead, the holotropic system notes that a previously encountered element has occurred in a manner which permits reconstruction of any or every one of the multiple data elements in its original context. Another feature of a holotropic system is that after each data element is added to the database it can be automatically correlated with any other element already stored. This correlation can reveal a relationship between a particular data element and a number of already stored data elements which permits all of the related elements to be treated as a single entity and stored together. Thus, a number of elements which were stored separately, can be collapsed into one entry in the database.

Data compression methods, as discussed above, require a sizable amount of hardware and software for their implementation, such as probability distribution analyzers, prediction function generators, etc. Data compression may also result in actual expansion of the information because the information source statistics may not be measurable to the required precision. Additionally, the resulting bit strings representative of the compressed data are not easily operated on by Boolean operators. Usually, data must be converted back to its original fixed length formats before Boolean operations can be performed.

The second category of techniques disclosed by the prior art involves methods for bit string compression by using run-length encoding schemes to represent strings of identical bit values ("1's" or "0's"). One aspect of the present invention is an improvement related to these compression techniques. These methods are generally data independent unlike the data compression techniques mentioned above. A typical application for run length encoding is employed to reduce the number of bits in redundant binary data such as digitized images of engineering drawings or transmissions of data from outer space. In Bradley, "Optimizing a Scheme for Run Length Encoding", *Proceedings of the IEEE* (Jan. 1969) a scheme is presented for depicting an image which is represented by a two-dimensional array of black and white picture elements. Because the appearance of black and white pixels always alternates in an image, in the encoding process it is only necessary to encode the length of a run of white pixels and not the value of its picture elements. A variable length encoding scheme is introduced for encoding the image, specifically, two encoding formats are discussed. The first encoding format encodes a run of zeros followed by a terminating one to mark the end of the run. The second encoding format simply encodes a string of consecutive zeros. A run of any arbitrary length can be represented by several code entries of the second entry type followed by a single entry from the first type.

Although the run-length encoding schemes, as discussed in the prior art (e.g. Bradley), are efficient for compressing images and large transmissions of data where there are long runs of "0's", they are not amiable to traditional forms of computer processing, particularly in the setting where the run lengths are considerably shorter and the frequency variation of runs of "1's" and "0's" occurs more often. Additionally, the prior art run-length encoding schemes are not structured for efficiently performing operations (e.g. Boolean operations, etc.) on data. Fixed length compressed formats, on the other hand, are amiable to computer operations. Specifically, fixed length formats can be operated on in an efficient fashion, and they can be used for efficiently encoding uncompressed bit strings.

Lastly, to date there has been little development in the techniques for efficiently performing Boolean operations on compressed bit strings. Traditional techniques require that Boolean operations be performed on each bit of data. These techniques have been slightly enhanced via the use of faster hardware; however, each bit of data must still be evaluated. Therefore, performing Boolean operations on bit strings remains a relatively inefficient process.

SUMMARY OF THE INVENTION

The present invention introduces a computer apparatus and/or method for efficiently encoding bit strings into compressed fixed length formats and a computer apparatus and method for efficiently performing Boolean operations on compressed fixed length format, or compressed non-fixed length format bit strings.

Briefly, one aspect of the preferred embodiment of the present invention includes an apparatus and/or method, using a computer, for converting a one dimensional array of binary bits (bit string) into a compressed bit string. In the preferred embodiment, conversion of an uncompressed bit string into a compressed bit string occurs in two steps. First, the bit string is separated into a plurality of impulses. An impulse is a run, which is a string of one or more contiguous bits of a same polarity (e.g. either "1's" or "0's") and an ending bit at one end of the contiguous bits having a polarity opposite the same polarity of the associated impulse. The second step involves encoding one or more of the impulses into one or more compressed impulse formats. The compressed impulse formats contain a first and a second indicator. The first indicator is for indicating a polarity for each run associated with each impulse. The second indicator is for indicating a length for each of the impulses. The length is a quantity of the same polarity bits of the run with or without the ending bit. By following these steps, an uncompressed bit string can be efficiently converted into a compressed bit string.

Typically, the second step, discussed above, involves additional steps for encoding a plurality of impulses into a common compressed impulse format. For each of the impulses to be encoded in the common compressed impulse format, an individual first indicator and an individual second indicator are provided. The first indicator may be inferred from prior knowledge of whether the polarity of the compressed impulses stay the same or follow some predetermined sequence of polarities. Additionally, each compressed impulse format contains a format indicator which indicates the number of impulses encoded.

Significantly, by encoding the bit strings into a series of impulses which are each encoded into compressed impulse formats, a substantial savings in memory occurs.

In the preferred embodiment, impulses are compressed into one of four different compressed impulse formats. The first compressed format encodes an impulse having a length of preferably 2 to 31 bits. This encoding format has a pair of bits for indicating the first format and a first indicator which contains a polarity bit for indicating the polarity of the impulse. Additionally, the first format has a second indicator, containing preferably 5 bits for indicating the length of the impulse. A second compressed impulse format encodes an impulse having a length of preferably 32 to $2^{32}-1$ bits. This format contains a pair of bits for indicating the second format and a first indicator containing a polarity bit for indicating the polarity associated with the impulse. Additionally, the second format contains four eight-bit words for indicating the length of the impulse and an additional pair of bits for indicating whether one, two, three, or four words are necessary for encoding the impulse length.

A third compressed impulse format is used for encoding a first and a second impulse where each of the impulses has a length of preferably 2 to 5 bits. This format also contains a pair of bits for indicating the particular format and two polarity bits for indicating the polarity of the first and second impulses. The third format also contains a second indicator which contains a first and second pair of bits. The first pair of bits is for indicating the length of the first impulse and the second pair of bits is for indicating the length of the second impulse.

The last encoding format is for encoding a first, a second and a third impulse where each impulse has a length of preferably 2 or 3 bits. This format also contains a pair of bits for indicating the particular format and a first indicator which has three polarity bits for indicating the polarity of the first, second and third impulses. Additionally, this format contains a second indicator which contains a first, a second and a third bit for indicating the length of the first, the second, and the third impulses.

A unique feature of the first, third and fourth compressed formats discussed is that they can migrate or be converted into the other formats very easily. This capability enables the system to quickly encode long bit strings by efficiently reorienting the encoding formats during the encoding process. For example, the third format can be converted into the first format or vice versa; however, the impulse can only be of length 2 to 5 bits. Additionally, the fourth format can also be converted into the first format or vice versa; however, the impulse can only be of length 2 or 3 bits.

The present invention also has the capability of efficiently performing an operation on a first and a second bit string which are both in a compressed form. For the first time, compressed bit strings need not be decompressed in order to perform data manipulation operations. Computer time is saved by not having to decompress the data and processing is made more efficient because less data needs to be considered while performing the Boolean operations. This aspect of the present invention is a method and/or apparatus using a computer for efficiently processing binary bit strings. Each binary bit string is represented by a series of compressed impulse formats. The compressed impulse formats comprise a polarity representation and a corresponding length representation pair. The polarity representation represents the binary value of one or more contiguous binary bits of the same binary value and a binary bit of the opposite binary value in the corresponding bit string. The length representation, in the pair, represents the quantity of binary bits of the same binary value. Generally, processing binary bit strings occurs in two steps. First, a first series of the compressed impulse formats representing a first bit string are processed, according to a selected operation, with a second series of the compressed impulse formats representing a second bit string. An intermediate format results which represents a portion of a resultant bit string. The intermediate format, typically contains a plurality of run representations and impulses. Second, the runs and impulses in the intermediate format are combined into a series of contiguous compressed format impulses representing the resultant bit string.

The present invention contains two embodiments for processing Boolean operations. In the first embodiment, processing a Boolean operation on the first and the second compressed bit string occurs in six steps. In the first step, the length of the first impulse is compared with the length of a second impulse to determine a minimum length. The minimum length is the length of an intermediate compressed bit string (intermediate bit string) which is calculated by processing two impulses, one from each bit string. Second, an operation is performed on the minimum length of the first and the second impulses to determine the polarity of the intermediate bit string and whether the intermediate bit string is a run or an impulse.

Third, the polarity, the length and the type (run or impulse) of the intermediate bit string are stored in a temporary memory area. Here, one or more of the intermediate bit strings are combined into an impulse of a resultant bit string. The fourth step involves reducing the length of the first and the second input impulses by the minimum length previously calculated. This step accounts for the bits of each impulse which have been processed for a particular Boolean operation.

The fifth step determines whether the length of the first and/or second impulses have been reduced to zero bits. This determination enables the system to evaluate if it needs to obtain a next impulse in either the first or second bit strings. Specifically, next impulses are obtained from both the first and second bit strings when the first and second impulses are reduced to zero length. Or, a next impulse of the first or second bit string is obtained when the corresponding impulses are reduced to a zero length. The last step involves performing all the prior recited steps until no more impulses reside in the first and/or second bit string(s).

In the preferred embodiment, the step for performing a Boolean operation also includes the step for referencing an index table to determine which specific operation to perform. The index table is made up of a series of subtables. Each subtable corresponds to a particular Boolean operation and each of the subtables contains a matrix of desired results for each operation. Each one of the subtables also comprises a first, a second and a third index. The first index of the subtable is for identifying the polarity of the first impulse. The second index of the subtable is for identifying the polarity of the second impulse. Lastly, the third index is for identifying whether the length of the first impulse length is less than, greater than or equal to the length of the second impulse. By referring to the first, second and third indexes, the predefined operations to be performed can be determined.

In the second preferred embodiment, the method for processing a Boolean operation occurs in seven steps. The second embodiment of the preferred embodiment is specifically for performing the Boolean operations AND, OR or EXCLUSIVE OR on a first and a second compressed bit string. In the first step, the length of a first impulse is compared with the length of a second impulse to determine whether the first and the second impulse lengths are equal or unequal in length. The second step involves determining an intermediate resultant bit string when the first and second impulses are equal or unequal in length.

When the impulses are unequal in length, three substeps are performed. First, the length of the first impulse is compared with the length of the second impulse to determine which impulse has a longer length and which impulse has a shorter length. The shorter length is the length of the intermediate bit string. Second, the polarity of the longer impulse is determined by referring to the polarity indicator associated with the impulse. Third, a determination of whether the intermediate bit string is an impulse or a run is made. Specifically, this substep involves evaluating three separate rules. Rule I, when the Boolean operation is an AND operation, the polarity of the longer impulse (as determined above) indicates whether the intermediate bit string is a run or an impulse. Rule II, when the Boolean operation is an OR operation, the complement of the polarity of the longer impulse indicates whether the intermediate bit string is a run or an impulse. Lastly, Rule III, when the Boolean operation is EXCLUSIVE OR, the intermediate bit string is always an impulse.

When the first and second bit strings are of equal length, the second step involves determining the intermediate bit string by following two substeps. First, the length of the intermediate bit string is set equal to the length of the first and the second impulses. Second, a determination of whether the intermediate bit string is a run or an impulse is made. This substep involves evaluating three rules. Rule I, when the Boolean operation is either an AND or an OR operation, and the polarity of the first and the second impulses is different, the intermediate bit string is always a run. Rule II, when the Boolean operation is either an AND or an OR and the polarity of the first and the second impulses is the same, the intermediate bit string is always an impulse. Rule III, when the Boolean operation is EXCLUSIVE OR, the intermediate bit string is always a run.

Regardless of whether the second step discussed above involves determining the intermediate bit string when the first and second bit strings are equal or unequal in length, the third step will perform a particular Boolean operation on the first indicator of the first impulse with the first indicator of the second impulse to determine the polarity of the intermediate bit string. The polarity, the length and the type (run or impulse) of the intermediate bit string are stored in a temporary memory area. Here, one or more intermediate bit strings are combined into an impulse of the resultant bit string. In the fifth step, the length of the first and second impulses are reduced by the length of the intermediate bit string. This step accounts for the bits which have been previously processed by the Boolean operation.

The sixth step involves determining whether the length of the first and/or second impulses has been reduced to zero. This determination enables the system to determine whether a next impulse from the first and second bit strings should be obtained. More particularly, next impulses of the first and second bit strings are obtained when the first and second impulses are both reduced to zero bit lengths, or a next impulse of the first or the second bit strings is obtained when the corresponding impulse is reduced to a zero length. The last step performs all the previous recited steps until no more impulses reside in either the first or second bit string. In this way, a method is provided for processing the Boolean operation AND, OR, or EXCLUSIVE OR on a first and a second bit string to construct a resultant compressed bit string.

The present invention also contains an embodiment for processing Boolean operations on first and second bit strings containing only compressed runs. In the preferred embodiment, each run of a bit string is converted to a compressed run format. The compressed run format contains a first and a second indicator. The first indicator is for indicating the polarity of the run, and the second indicator is for indicating the length of the run. Performing a Boolean operation on two bit strings containing runs occurs in the two steps. First, a run of a first bit string and a run of a second bit string are compared to determine if they are equal or unequal in length. If the run lengths are unequal, the bit length of the shorter run is equal to the bit length of the intermediate resultant run. If the runs are equal in length, the bit length of either run is equal to the bit lengths of the resultant run. The second step involves determining the polarity of the resultant run. The specified Boolean operation is performed on the polarity indicators of the first and second runs. The result of the Boolean operation is the polarity of the intermediate resultant run. These steps are performed until all of the runs of both bit strings are processed and a compressed resultant run is determined.

This aspect of the present invention significantly enhances a computer's capability for processing Boolean operations on compressed data. Specifically, data can be efficiently processed in a compressed form without having to first decompress the data into its original unencoded form. Additionally, by using an index table and/or the Boolean rules for determining type (run or impulse), Boolean operations can be efficiently performed on large amounts of compressed data. By taking advantage of the unique properties of impulses, the present invention more efficiently processes data.

BRIEF DESCRIPTION OF THE DIAGRAMS

FIG. 2A is a schematic representation of a one-pack compressed impulse format for representing an impulse having a length of 2 to 31 bits;

FIG. 2B is a two-pack compressed impulse format for representing a first and a second impulse having a length of 2 to 5 bits;

FIG. 2C is a three-pack compressed impulse format for representing three impulses having a length of 2 to 3 bits;

FIG. 2D is a four-pack compressed impulse format for representing an impulse having a length of 2 to $2^{32}-1$ bits;

FIGS. 3A and 3B are flow block diagrams of the ENCODE BIT STRING routine;

FIG. 3C is a flow block diagram of the GET NEXT IMPULSE routine which is called in the ENCODE BIT STRING routines (FIGS. 3A and 3B);

FIG. 4A depicts an uncompressed bit string;

FIG. 4B is the bit string of FIG. 4A represented in the compressed impulse format;

FIGS. 5A and 5B are tables depicting results of the ENCODE BIT STRING routine (FIG. 3A and 3B) and the GET NEXT IMPULSE routine (FIG. 3C) performed on the uncompressed bit string (FIG. 4A);

FIG. 7 is a schematic block diagram depicting a portion of the computer hardware embodiment for performing a Boolean operation on a first and a second bit string;

FIG. 8A is a table depicting the results of the F2 function of the Boolean hardware configuration (FIG. 7);

FIG. 8B is a table depicting the results of the F3 function of the Boolean hardware configuration (FIG. 7);

FIG. 9A is a truth table representation of the inputs and the results to the F1 function of the Boolean hardware configuration (FIG. 7);

FIG. 9B is a truth table representation of the inputs and results of the F2 function of the Boolean hardware configuration (FIG. 7);

FIG. 9C is a truth table representation of the inputs and results of the F4 function of the Boolean hardware configuration (FIG. 7);

FIG. 9D is a truth table representation of the inputs and results of the F3 function of the Boolean hardware configuration (FIG. 7);

FIG. 9E is a truth table representation of the inputs and results of the F6 function of the Boolean hardware configuration (FIG. 7);

FIG. 9F is a truth table representation of the inputs and results of the $F_2$ and $F_3$ functions of the Boolean hardware configuration (FIG. 7).

FIG. 10 depicts an index table used by the computer platform for performing a Boolean operation on a first and second bit string;

FIG. 11A is a flow block diagram of the GENERATE RESULTANT BIT STRING routine;

FIG. 12A depicts a second index table used by the computer platform for determining a state variable to be analyzed by the GENERATE RESULTANT BIT STRING routine (FIG. 11A);

FIG. 12B is a table depicting the operations performed by the GENERATE RESULTANT BIT STRING routine (FIG. 11A) as set forth by the state variables;

FIG. 13A depicts compressed bit strings A and B which are to be processed by a Boolean operation;

FIG. 13B depicts a resultant bit string generated by processing a Boolean operation on bit strings A and B of FIG. 13A; and FIGS. 14A and 14B are a table depicting results of performing the Boolean AND operation on bit strings A and B of FIG. 13A.

INDEX

Contents

Converting Uncompressed Bit Strings Into Compressed Bit Strings
   A. Example of Converting Uncompressed Bit Strings Into Compressed Bit String
II. Operations on Bit Strings
   A. Hardware Embodiment for Performing Boolean Operations on Compressed Impulses B. Embodiment for Performing Boolean Operations on Compressed Impulses
C. Performing Boolean Operations on Compressed Runs
D. Canonical Processing of Intermediate Bit Strings
  1) Generate Resultant Bit String Routine
  2) Second Index Table
  3) A Detailed Example of the Boolean AND Operation With Two Compressed Bit Strings

DETAILED DESCRIPTION OF THE DIAGRAMS

I. Converting Uncompressed Bit Strings Into Compressed Bit Strings

Figure 1:
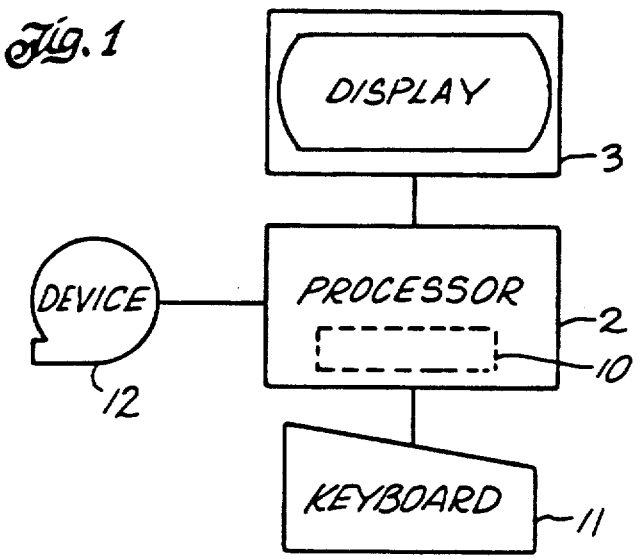
FIG. 1 depicts a computer system equipped with the computer platform for converting uncompressed bit strings into compressed bit strings and/or for processing Boolean operations in accordance with the present invention.

FIG. 1 depicts a computer system having a programmable computer and computer programs for converting an uncompressed string of bits into a compressed string of bits and/or for processing Boolean operations on a first and a second compressed bit string. The system includes a programmed microprocessor 2, display 3, keyboard entry 11 for the microprocessor and external device 12 for storage or buffering of the uncompressed bit strings. Conversion hardware/software and Boolean operation hardware/software are housed in a computer platform 10 (shown in phantom lines), which is built into the processor 2. The computer platform 10 coordinates the various activities related to converting uncompressed bit strings into compressed bit strings and to performing Boolean operations on bit strings. Conventionally, computer platform 10 is a preprogrammed computer on a printed circuit board which can be easily employed within most standard computers, including personal, minicomputers and mainframe computers. It is also envisioned that platform 10 may be a special purpose computer formed by an integrated circuit chip.

Figure 1A:
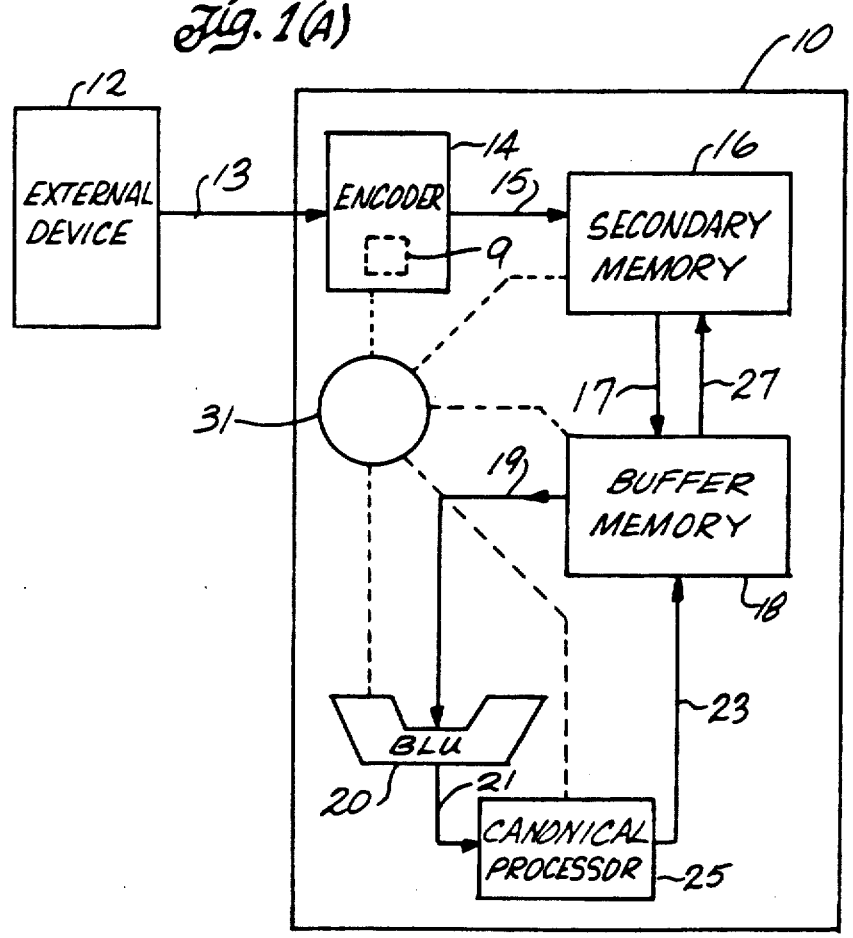
FIG. 1A depicts the computer platform hardware on which software programs and/or hardware are performed for conversion and Boolean operation performance.

More particularly, referring to FIG. 1A, computer platform 10 includes an encoder 14, an optional secondary memory 16, (i.e., secondary memory may have been located external to platform 10) an optional buffer memory 18, a Boolean Logic Unit (BLU) 20, canonical processing unit 25 and a system coordinator 31. When software programs for encoding the bit strings, for processing the Boolean operations and for coordinating data transfer between components are loaded into the computer platform 10, the computer platform 10 is formed and ready for processing.

A detailed discussion of the specific components of computer platform 10 is now presented. External device 12 is a permanent or buffer storage, typically a hard disk, for uncompressed bit strings. The bit strings are representative of data which may be organized in a relational database or unorganized data acquired by satellite communications from outer space, etc. The contents of the external device 12 is loaded by bus 13 to the computer platform 10 and into encoder 14. Encoder 14 evaluates the uncompressed bit strings and separates the bit strings into one or more "impulses". An impulse is a run, which is a string of one or more bits of a same binary value or polarity (e.g., "0's" or "1's"), and an ending bit which has a polarity opposite the polarity of the run. Flow diagrams 3A, 3B, and 3C (to be discussed) depict routines executed by encoder 14 for encoding the bit strings into one of four different compressed impulse formats (FIGS. 2A, 2B, 2C and 2D). Secondary memory 16 is optional; it stores the encoded bit strings for future Boolean operations. Secondary memory 16 may be a memory component included in the host computer or a memory component included within the computer platform 10. Buffer memory 18 is another memory area for holding the encoded bit strings temporarily before processing the bit strings at the BLU 20 or before storing the bit string into the secondary memory 16 after processing. BLU 20 performs Boolean operations on two bit strings by processing a unique BLU embodiment (FIG. 10) implemented on a microprocessor (i.e. Intel 80386), or by a unique BLU hardware embodiment (FIG. 7) implemented by customized programmable logic array chips (e.g. XILINX chips). Some or all of the Boolean operations are more efficiently implemented directly in hardware. However, even if the Boolean operations are implemented primarily by software, the BLU 20 can perform the Boolean operations more efficiently in terms of storage, speed, etc., than presently known techniques for performing Boolean operations on compressed bit strings. The BLU 20 can take full advantage of the unique properties of the latest components, such as thirty-two bit microprocessor CPU's, etc.

Once an intermediate-resultant compressed bit string (intermediate bit string), which is the result of performing a Boolean operation on two impulses, has been determined by the BLU 20, it is sent via bus 21 to the canonical processor 25. The canonical processor 25 is essentially a pair of buffers for temporarily holding the intermediate bit strings until they can be combined into an impulse. When an impulse (compressed form) is generated at the canonical processor unit 25, it is output via bus 23 to buffer memory 18.

System coordinator 31 controls the processing of data on the computer platform 10. More particularly, the operation of the bus system and the operation of the components on computer platform 10 are controlled by software programs in the system coordinator 31. The dotted lines of FIG. 1A leading out from system coordinator 31 show its control over the various components. System coordinator 31 need not be a part of the computer platform 10; instead, it could be loaded into the host computer.

"00001" and "11110" are impulses which are five bits in length and may reside in a typical bit string. Both have a property of having one or more same polarity bits (e.g., "0000" or "1111") followed by a bit having a polarity opposite the same polarity bits. The polarity of the first impulse is "0" and the polarity of the second impulse is "1". The preferred formats shown in FIGS. 2A, 2B, 2C and 2D represent four compressed impulse formats for encoding one or more impulses such as the five bit impulses referred to above.

Although, throughout the specification the preferred formats start with one or more bits having a same polarity (e.g., "000" or "111") followed by a bit having a polarity opposite the same polarities, the impulses could just have easily been set up in the reverse. For example, "10000" and "01111" are impulses, which are five bits in length and they may reside in a typical bit string. Both impulses have a single bit, having a particular polarity (e.g., "0" or "1"), followed by one or more bits having an opposite polarity. Regardless of the orientation of the impulses within the bit string (i.e., "1000" or "0001"), the preferred compressed impulse format shown in FIGS. 2A, 2B, 2C and 2D represent four compressed impulse formats for including either orientations of the impulses. In the remaining portions of the specification, however, for simplicity the impulses are assumed to follow the orientation of one or more bits having the same polarity followed by an ending bit having a polarity opposite the same polarity bits (e.g., "00001").

Each of the compressed impulse formats has at least a first and a second indicator. The first indicator represents the polarity of the same polarity bits preceding the ending bit and the second indicator is for indicating the length of the impulse. The length of the impulse is the quantity of the one or more same polarity bits and the ending bit. Other impulse encoding configurations are envisioned; however, in this embodiment, each encoding scheme must have at least an indicator for depicting polarity and an indicator for representing length.

FIG. 2A represents the simplest of the four compressed impulse formats and represents a single impulse from two to 31 bits in length. Because this compressed impulse format only represents one impulse, it is labeled a "one-pack" format. Pair of bits "01" at 22 is a format designator for the "one-pack" format. Each of the impulse formats has a pair of bits for designating the particular impulse format. Bit 24 is a polarity bit "P". The polarity bit indicates whether the impulse contains a run of "1's" or a run of "0's". An impulse having a run of "1's" is a bit string of "1's" terminating in a "0" and has a polarity bit of "1", and an impulse having a run of "0's" is a bit string of "0's" terminating with a "1" bit and has a polarity bit of "0". The five bits at 26 constitute a length field "$L_1L_1L_1L_1L_1$". The length field specifies the length of the single impulse and it is biased by two so that the minimum length (e.g., all zeros or "00000") of an impulse is two bits (e.g., either an impulse of "01" or an impulse of "10").

Likewise, a length field 26 of all "1's" corresponds to an impulse length of 31 bits. The compressed format biases the length because only impulses are represented and they must be at least two bits long (e.g., "01" or "10"), thus there is no need to represent either a "1" or a "0" bit string.

FIG. 2B depicts a compressed impulse format for representing two impulses, both impulses having a length of two to five bits, i.e. "two-pack" format. This impulse encoding format also has a pair of format designator bits 28 "10". Polarity bits "$P_1$" at 30 and "$P_2$" at 32 are for indicating the polarity of the first and second impulses, respectively. Length fields "$L_2,L_2$" at 34 and "$L_1,L_1$" at 36, represent the length of the second and first impulses, respectively. As in the case of the "one-pack" format previously discussed, the bit length fields "$L_2,L_2$" 34 and "$L_1,L_1$" 36 are biased by two so that a length field "00" indicates an impulse of two bits while a length field of "11" indicates an impulse length of five bits. As shown in FIGS. 2A and 2B, both the first and second formats are identical in length (eight bits long) and similar in configuration. In fact, length fields "$L_2,L_2$" 34 and "$L_1,L_1$" 36 have been strategically located in the format so that the two-pack format can be easily converted into a one-pack format and vice versa. For example, if the system is attempting to fill a two-pack format with a first impulse having five bits and it turns out that the next impulse evaluated by the system encoder 14 is an impulse length greater than five bits, then the encoder can convert the two-pack format into a one-pack format by changing the format designator 28 from "10" to "01" and placing a "0" in "$P_2$" 32 and "0's" in "$L_2,L_2$" 34. The result is a one-pack format encoded for a five bit impulse. The efficiency for this encoding scheme will become more apparent after the detailed discussion of flow diagrams FIGS. 3A, 3B and 3C.

FIG. 2C is a compressed impulse format called the "three pack" format for representing three impulses of two or three bits in length, and includes a pair of format designator bits "11" at 38. Polarity bits "$P_1$" at 40, "$P_2$" at 42, and "$P_3$" at 44 depict the polarity of the first, second and third impulses. Length fields "$L_1$" at 50, "$L_2$" at 46, and "$L_3$" at 48 represent the length for the first, second, and third impulses respectively. For migration purposes, the actual order of the length field is "$L_2$" at 46, "$L_3$" at 48 and "$L_1$" at 50. Once again, as in the case of the one- and two-pack formats, the length of bit indicator is biased by two. Thus, if the length bit is "0", the impulse length is two bits and if the length bit is "1", the impulse length is three bits. The three-pack also has a similar configuration the two- and one-pack formats. Specifically, the three-pack format is identical in length (eight bits) and similar in configuration. In fact, the three-pack format can easily migrate between the two- and one-pack configurations and vice versa. For example, when the encoder 14 (FIG. 1A) encounters an impulse of two or three bits in length, it will try to fill a three-pack first so that in the event there are other impulses having lengths two or three bits, they can be efficiently encoded into the three-pack format. In the event that the next impulse length to be encoded is greater than three bits, the three-pack format can be easily converted into a two-pack or a one-pack configuration depending upon the length of the next impulse. For example, suppose the first impulse encountered has a length of two bits, then the length field "$L_1$" at 50 will have a "0" placed in it, representing a biased length of two bits. Now assume that the next impulse encountered is three bits in length, length field "$L_2$" at 46 will have "1" placed in it, indicating the next impulse having a three-bit length. However, if the length of the third impulse encountered is greater than three bits, the encoder 14 will convert the three-pack into a two-pack by changing the format designator 38 to "10" indicating the two-pack format. Thus, a three-pack format is easily converted into a two-pack format for depicting a first impulse having a two-bit length and a second impulse having a three-bit length. Likewise, the three-pack can be similarly converted into a one-pack. The configurations of the one-, two- and three-pack formats maximize the efficiency for encoding by accommodating impulses having lengths between two and 31 bits.

FIG. 2D is a compressed impulse format for encoding impulses with bit lengths between two bits and up to $2^{32}-1$ bits called the "extended element". Additionally, this compressed impulse format is used for indicating an end-of-bit-string condition or a continuation of a bit string to another bit string segment to another bit string segment at a different location within memory. Included are a pair of format designator bits "00" 52 for this impulse format, polarity bit "$P_1$" at 54, and bits "RRR" at 56 are bits for indicating the end-of-bit-string condition or the merging utility (to be further discussed). Length fields "$L_1L_1L_1L_1L_1L_1L_1L_1$" 60, "$L_2L_2L_2L_2L_2L_2L_2L_2$" 62, "$L_3L_3L_3L_3L_3L_3L_3L_3$" 64 and $L_4L_4L_4L_4L_4L_4L_4L_4$ 65 are eight bit words for encoding the length of a particular impulse. Whether all four, three, two or one length field is required for representing an impulse is designated by a pair of bits "NN" 58. The length field "$L_1L_1L_1L_1L_1L_1L_1L_1$" 60 encodes impulses having lengths from two to $2^8-1$ bits. If the length of an impulse is more than $2^8-1$ bits, but less than or equal to $2^{16}-1$ bits, then two length fields "$L_1L_1L_1L_1L_1L_1L_1L_1$" 60 and "$L_2L_2L_2L_2L_2L_2L_2L_2$"

62 are required for encoding. This extended element format can encode impulses of length 32 to $2^{16}-1$ bits. Three length fields 60, 62 and 64 are required if the extended element format is to encode an impulse of length 32 to $2^{24}-1$ bits and all four length fields 60, 62, 64 and 65 are required if the extended element format is to encode an impulse of length 32 to $2^{32}-1$ bits.

Bits "RRR" 56 contain "0's" when the extended element format is used to encode impulses. However, when bits 56 are set to "1", the first word of the extended element format acts as an end-of-bit-string indicator. An end-of-bit-string condition indicates that there are no more bits in the bit string. Assuming that the bits "RRR" 56 are set to "1", when the first word of the extended element has the following bit pattern, "00111111", an end-of-bit-string condition exists. Similarly, when the first word of the extended element is a bit string "00111110", the extended element represents that the bit string segment has reached the end of a memory container and the next bit string segment continues on a next logical memory container.

Figure 3A:
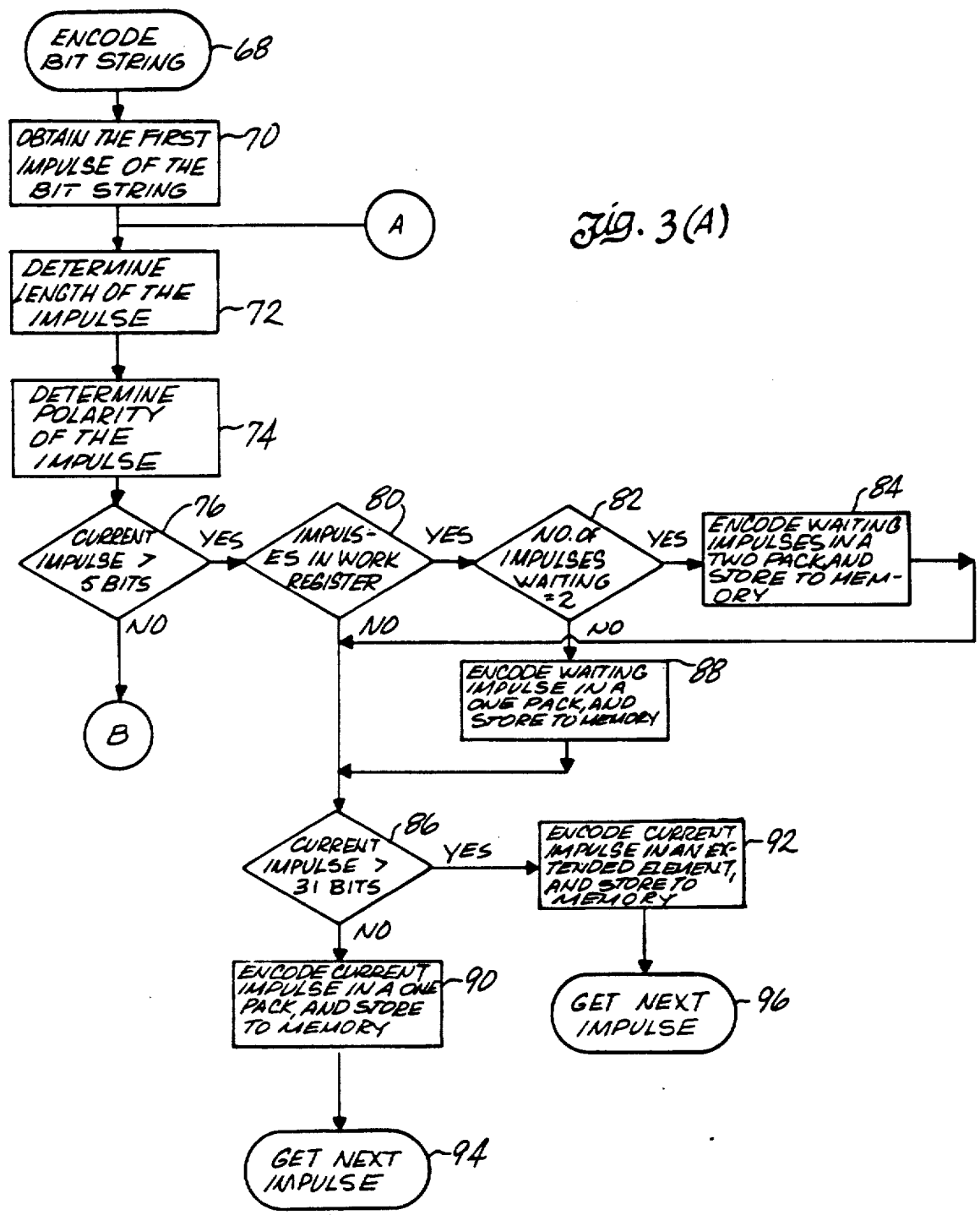

Referring to FIGS. 3A, 3B and 3C, a detailed description of the operations of the encoder 14 is now discussed. Encoder 14 (FIG. 1A) follows the steps set forth by the routine ENCODE BIT STRING at block 68 (FIG. 3A) to direct encoder 14 in how to convert an incoming uncompressed bit string into a compressed bit string. The encoder 14 encodes the bit string at the time it is loaded into the computer platform 10 (FIG. 1A) over bus 13. In block 70, the first impulse of the bit string is obtained, and in block 72, the length of the impulse is determined by counting the number of same polarity bits and the ending bit of the impulse. In block 74, the polarity of the impulse is determined by evaluating the polarity of its run, and in block 76, a determination of whether the impulse is greater than five bits in length is made.

Assuming that the impulse acquired is greater in length than five bits, block 80 is entered to determine if there are any impulses residing in a three- or a two-pack format in a work register 9, which resides in encoder 14 (FIG. 1A). The purpose of work register 9 is to temporarily store two- and three-pack formats which are partially filled with one or two impulses. Assuming that there are impulses residing in the work register 9 then in decision block 82, a determination is made as to how many impulses are present in work register 9. If the number of impulses waiting is two, then the format configuration must be a three-pack format. In other words, two impulses are waiting for a third impulse to fill the three-pack format. Because the current impulse is greater in length than five bits, it will not fit into the three-pack configuration, and thus, the three-pack format is changed into a two-pack format (as discussed above) at block 84. The two waiting impulses now reside in a two-pack format and the contents of the work register 9 is stored in memory 16. Processing continues at block 86.

Returning back to block 80, if it is determined that no impulses occupy the work register 9, then the current impulse will be evaluated. In either case, the current impulse will then be evaluated at block 86 to determine if the current impulse length is greater than 31 bits. Assuming that the length of the current impulse length is not greater than 31 bits, then in block 90, the current impulse is represented in a one-pack configuration and in block 94, subroutine GET NEXT IMPULSE (FIG. 3C) is called for retrieving the next impulse of the uncompressed bit string. If in block 86 the encoder determines that the current impulse length is greater than 31 bits, then in block 92 the encoder converts the current impulse into the extended element format and in block 96 the GET NEXT IMPULSE routine (FIG. 3C) is called for retrieving the next impulse of the uncompressed bit string.

Returning to decision block 82, if only one impulse resides in the work register, the impulse must be between two and five bits and currently encoded in either a two-or three-pack configuration. In either case, assuming that the waiting impulse length is greater than five bits, in block 88, the two- or three-pack formats will be converted into a one-pack format and the contents of work register 9 is stored in memory 16. The current impulse is then checked, at decision block 86, to determine whether it is greater in length than 31 bits. If the current impulse length is not greater than 31 bits, block 90 is entered and the current impulse is converted into a one-pack format and the current encoded impulse is stored in memory 16. In block 94 the GET NEXT IMPULSE routine (FIG. 3C) is called to get the next impulse of the uncompressed bit string. However, if the current impulse length is greater than 31 bits, in block 92, the current impulse is converted into an extended element format and the current encoded impulse is stored in memory 16. In block 96 the GET NEXT IMPULSE routine (FIG. 3C) is called to get the next element of the uncompressed bit string.

Referring back to block 76, when the current impulse length is not greater than five bits, decision block 78 (FIG. 3B) is entered to determine whether there are any impulses waiting to be processed in work register 9 (FIG. 1A). Assuming that there are no impulses waiting to be processed in the work register, decision block 81 is entered to determine whether the current impulse length is greater than three bits. Assuming that the current impulse length is not greater than three bits, block 83 is entered to put the current impulse into a three-pack format. In block 85, the three-pack is stored into work register 9 (FIG. 1A) so that the three-pack can be filled with two other impulses having two or three bits, or until the three-pack is converted into a two-pack or a one-pack. Routine GET NEXT IMPULSE (FIG. 3C) is called in block 87 to get the next impulse in the uncompressed bit string.

Referring back to block 81, if encoder 14 determines that the impulse length is greater than three bits, block 89 is entered to encode the current impulse into a two-pack format. At this stage, the encoder has determined that the current impulse length is not greater than five bits (at block 76) and that the impulse length is greater than three bits (at block 80). Thus, the impulse must fit into the two-pack format because it is either four or five bits long. In block 85, the two-pack is stored into the work register, and in block 87, routine GET NEXT IMPULSE (FIG. 3C) is called to obtain the next impulse in the uncompressed bit string.

Returning to decision block 78, if there are impulses waiting to be processed in work register 9 (FIG. 1A), decision block 91 is entered to determine how many impulses are waiting in the work register. If there are two impulses waiting to be processed, decision block 93 is entered to determine whether the current impulse length is greater than three bits. If the current impulse length is not greater than three bits, block 97 is entered to encode the current impulse, along with the waiting impulses, into a three-pack and store the three-pack into memory 16. In block 98, the GET NEXT IMPULSE routine (FIG. 3C) is called to obtain the next impulse in the uncompressed bit string.

Returning to block 93, if the current impulse is greater than three bits, block 95 is entered to encode the previous impulses into a two-pack and store the encoded two-pack into memory 16. Processing continues at block 81. During block 81, if encoder 14 determines that the current impulse is greater than three bits, block 89 is entered to encode the current impulse into a two-pack format. At this stage, the encoder has determined that the current impulse is not greater than five bits (at block 76) and that the impulse is greater than three bits (at block 80). Thus, the impulse must fit into the two-pack format because it is either four or five bits long. In block 85, the two-pack format is stored into the work register, and in block 87, routine GET NEXT IMPULSE (FIG. 3C) is called to obtain the next impulse in the uncompressed bit string.

Returning to decision block 78, if there are impulses waiting in the work register, and in decision block 91 the encoder determines that there is only one impulse waiting (e.g., in a two-pack) in work register 9, block 100 is entered to determine if the current impulse length is greater than three bits. If the current impulse length is greater than three bits, block 102 is entered to encode the current impulse and the waiting impulse into the two-pack format and to store the encoded impulses into memory 16. In block 104, the GET NEXT IMPULSE routine (FIG. 3C) is called to obtain the next impulse in the uncompressed bit string.

Returning to decision block 100, if the current impulse length is less than or equal to three bits, then decision block 106 is entered to determine if the length of the waiting impulse in work register 9 is also less than or equal to three bits. If the waiting impulse length is greater than three bits, block 102 is entered to place the current impulse and the waiting impulse into a two-pack and to store the encoded impulses into memory 16. In block 104, the GET NEXT IMPULSE routine is called to obtain the next impulse in the uncompressed bit string. If in decision block 106 it is determined that the waiting impulse length is less than or equal to three bits, then in block 108 the current impulse and the waiting impulse are placed into the three-pack format already existing in work register 9. In block 110, the three-pack format containing the current impulse and the waiting impulse are stored into work register 9 (FIG. 1), and in block 112, the GET NEXT IMPULSE routine is called to get the next impulse in the uncompressed bit string.

FIG. 3C is a detailed flow diagram depicting the GET NEXT IMPULSE routine. Encoder 14 calls this routine at block 113 (FIG. 3C), and in block 114 the next group of bits from the uncompressed bit string is acquired. Decision block 115 is entered to determine whether there are bits remaining in the bit string by having encoder 14 evaluate whether there is an end-of-bit-string condition. If an end-of-bit-string condition is not reached, then processing returns to the ENCODE BIT STRING routine (FIG. 3A) in block 72. However, if an end-of-bit-string condition is reached, block 119 is entered to determine if remaining bits in the uncompressed bit string are a run of "0" s or no bits or a run of "1" s. Assuming that there are no bits remaining in the bit string or the bits are "0", block 116 is entered to flush out the remaining impulse in work register 9 to memory and block 125 is entered to encode an element to signify an end-of-bit-string condition. In block 118 an EXIT routine is called which returns processing to the original calling routine of the ENCODE BIT STRING routine (FIG. 3A).

Assuming that in decision block 119 it is determined that there is a run of "0's" remaining in the bit string, block 116 is entered to flush out the work register and block 125 is entered to encode the extended element to signify an end-of-bit-string condition. Block 118 is called to have the encoder exit to the calling routine. This procedure, performed by the encoder in block 125, effectively truncates the run of "0's" from the bit string by not encoding the bits into one of the compressed impulse formats.

On the other hand, if the remaining bit(s) are a run of "1's", block 121 is entered to append a "0" to the run of "1's". A "1" bit signifies that data exists at that particular bit location, and thus, it must be preserved. Essentially, in block 121, the encoder converts the run of "1's" into an impulse having polarity "1" so that it can be conventionally converted into the one-pack or extended element format. Adding a "0" to the run of "1's" adds no additional information to the run of "1's" for the reasons stated above and it will not require any additional bits for encoding. Processing returns to FIG. 3(A) to encode the new impulse into a one-pack or an extended element format depending on the size of the impulse (i.e., impulses of from two to 31 bits in length are encoded into a one-pack and impulses of from 32 and $2^{32} - 1$ bits are encoded into an extended element).

As the entire bit string is compressed into the encoded format it is stored in memory 16 where it will reside until future processing.

A. Example Of Converting Uncompressed Bit Strings Into Compressed Bit Strings Referring to FIGS. 2A, 2B, 2C, 2D; 3A, 3B, 3C; 4A, 4B; 5A and 5B, a detailed example for converting an uncompressed bit string into a compressed bit string is discussed. Referring to FIG. 4A, a hypothetical uncompressed bit string 120 is shown. After the compression operation is performed by encoder 14, a compressed bit string is generated as shown at 122 of FIG. 4B. This example has been designed to emphasize all of the compressed impulse formats as shown in FIGS. 2A, 2B, 2C and 2D and the encoding processes as shown in FIGS. 3A, 3B and 3C. In this example, the compression of the uncompressed bit string 120 (FIG. 4A) into the compressed bit string 122 (FIG. 4B) results in a 25% reduction of bits. Specifically, the uncompressed bit string has 107 bits and the resulting compressed bit string has 80 bits. Typically, in many database setting, the run lengths in a bit string are of much greater lengths and, thus, the efficiency for compressing an uncompressed bit string is significantly enhanced.

The uncompressed bit string 120 (FIG. 4A) is taken from the external device 12 (FIG. 1A) and is sent to the encoder 14 (FIG. 1A); where it is converted into a compressed bit string 122. The activities associated with processing the encoder 14 are depicted in the results table of FIGS. 5A and 5B. The results table of FIGS. 5A and 5B is divided into four columns, one for the impulse polarity, a second for the impulse length, a third for the contents of work register 9 (FIG. 1A), and a fourth for the resulting compressed impulse format. Each row depicts a change in status in one or more of the column headings.

Referring to FIG. 3A, in block 70, the first impulse of the uncompressed bit string 120 (FIG. 4A) is obtained.

The first impulse is "01" at 124. In block 72 (FIG. 3A), the length of impulse 124 (FIG. 4A) is determined to be two bits and in block 74 the polarity of impulse 124 is determined to be "0" (126, FIG. 5A).

In decision block 76, the current impulse length is determined to be not greater than five bits and decision block 78 is entered to determine if there are any impulses waiting to be processed in work register 9 (FIG. 1A). Currently the contents of the work register is empty (126, FIG. 5A) and, thus, decision block 81 is entered to determine if the current impulse length is greater than three bits. The current impulse length is only two bits, and thus, block 83 is entered to encode the current impulse into a three-pack format (FIG. 2C). In block 85, the three-pack with the encoded two-bit impulse 124 (FIG. 4A) is stored into the work register (128, FIG. 5). The encoded three-pack (128, FIG. 5) has an "0" placed in the "$L_1$" (50, FIG. 2C) and "$P_1$" (40, FIG. 2C) positions. The three-pack length is biased by two and, thus, a "0" in the "$L_1$" field represents an impulse having a length of two bits. In block 87, the GET NEXT IMPULSE routine (FIG. 3C) is called to obtain the next impulse in the uncompressed bit string 120 (FIG. 4A).

Referring to FIG. 3C, block 114 is entered to retrieve the next impulse from the uncompressed bit string (120, FIG. 4A). Block 115 is entered to evaluate whether an end-of-bit-string has been reached. An end-of-bit-string condition has not been reached. At this stage, there are still 105 bits left in the bit string, and thus, processing returns to the ENCODE BIT STRING routine (FIG. 3A) in block 72.

In block 72, the length of the next impulse 130 (FIG. 4A) is determined and in block 74 the polarity of the next impulse is also determined. The length of the impulse is three bits and the polarity of the impulse is "1" (132, FIG. 5A). In decision block 76 (FIG. 3A), it is determined that the length of the current impulse of three bits is not greater than five bits, and thus, decision block 78 (FIG. 3B) is entered to determine whether there are any impulses waiting to be processed in work register 9 (FIG. 1A). An impulse is presently waiting to be processed in the work register, specifically, the two-bit, "0"-polarity impulse which was just stored (128, FIG. 5A). In decision block 91, the encoder determines that there is only one impulse waiting to be processed and, in decision block 100 the encoder determines that the current impulse length is not greater than three bits; the current impulse is three bits long (132, FIG. 5A). In decision block 106, the waiting impulse in the work register is evaluated and the encoder determines that the waiting impulse length is not greater than three bits; the waiting impulse is two bits (126, FIG. 5A). In block 108, the current impulse 130 (FIG. 4A) is encoded with the waiting impulse 124 (FIG. 4A) into the three-pack presently residing in the work register. The three-pack will remain in the work register until it is completed by a third impulse or converted into a two-pack. Thus, in block 110, the three-pack is stored into the work register (134, FIG. 5).

In block 112, the routine GET NEXT IMPULSE (FIG. 3C) is called to obtain the next impulse (136, FIG. 4A) in the uncompressed bit string 120 (FIG. 4A). In decision block 115, the encoder determines that an end-of-bit-string condition has not been reached and processing returns to the ENCODE BIT STRING routine (FIG. 3A) in block 72. In block 72, the length of impulse 136 (FIG. 4A) is determined to be five bits in length and in block 74 the polarity of the impulse is determined to be "0" (138, FIG. 5A). In decision block 76, the current impulse length is not determined to be greater than five bits and in decision block 78 (FIG. 3B) the encoder determines that there are impulses currently waiting to be processed in work register 9 (FIG. 1A), specifically, an impulse having a length of two bits with a polarity of "0" and an impulse having a length of three bits with a polarity of "1" (134, FIG. 5A). In decision block 91, two impulses are determined to be residing in a three-pack waiting to be processed, and in decision block 93 the current impulse length is determined to be greater than three bits. Block 95 is entered to convert the three-pack format in the work register into a two-pack arrangement by changing the format designator of the three-pack from a "11" to a "10" in 38 (FIG. 2C) and in 28 (FIG. 2B). Additionally, a "0" is placed in the "$P_3$" and "$L_3$" fields of the three-pack format to adjust the length and polarity indicators to the two-pack format (right side of 140, FIG. 5A). The resulting two-pack is the first resulting compressed format which is stored to memory 16, and it is shown at 142 of compressed bit string 122 in FIG. 4B.

Processing continues in block 81, where the encoder determines that the length of the current impulse 136 (FIG. 4A) is greater than three bits. The current impulse 136 (FIG. 4A) is five bits, and thus, in block 89, impulse 136 (FIG. 4A) is represented in a two-pack format. In block 85, the two-pack, containing impulse 136 (FIG. 4A) is stored into the work register ( left side of 140, FIG. 5A), and in block 87 the GET NEXT IMPULSE routine (FIG. 3C) is called to obtain the next impulse in the uncompressed bit string 120 (FIG. 4A). Block 114 is entered to obtain the next impulse 144 from the uncompressed bit string 120 (FIG. 4A), and in block 115, impulse 144 is determined not to be at an end-of-bit-string condition. Processing returns to the ENCODE BIT STRING routine (FIG. 3A) in block 72.

In block 72, the length of impulse 144 (FIG. 4A) is determined to be twelve bits and in block 74 it is determined to have a polarity of "0" (146, FIG. 5). In decision block 76, the current impulse length is determined to be greater than five bits, and in decision block 80 the encoder determines that there are impulses presently residing in the work register. Specifically, an impulse having five bits with a "0"-polarity is presently stored in a two-pack in the work register (left side of 140, FIG. 5A). In block 82, the encoder determines that there is only one impulse presently waiting to be processed in the work register, and in block 88 the residing two-pack is converted into a one-pack and stored into memory 16. The two-pack format is converted into a one-pack format by changing the format designator "10" (28, FIG. 2B) to a one-pack designator "01" (22, FIG. 2A) and placing "0's" into the "$P_2$" and "$L_2$" fields (32, 34, FIG. 2B). The resulting one-pack format is shown at line 148 in FIG. 5A, and FIG. 4B at 150 shows the one-pack in the compressed bit string 122. In decision block 86, the encoder then determines that the length of the current impulse 144 (FIG. 4A) is not greater than 31 bits, and in block 90, impulse 144 is entered into a one-pack format and stored into memory 16. The resulting compressed impulse is shown at line 152 of FIG. 5 and at 154 of FIG. 4B. Block 96 is entered to call the GET NEXT IMPULSE routine (FIG. 3C), to obtain the next impulse from the uncompressed bit string (FIG. 4A). In block 114 (FIG. 3C) impulse 156 is obtained from the uncompressed bit string 120 (FIG. 4A), and in decision block 115 (FIG. 3C) an end-of-bit-string condition is determined to not have been reached. Processing continues in the ENCODE BIT STRING routine (FIG. 3A) in block 72.

In block 72, the length of impulse 156 (FIG. 4A) is determined to be two bits long, and in block 74 impulse 156 (FIG. 4A) is determined to have a polarity of "1" (158, FIG. 5A). In decision block 76 the current impulse is determined to be less than or equal to five bits, and in decision block 78 (FIG. 3B) the encoder determines that there are presently no impulses waiting to be processed in the work register. In block 81 the current impulse length is determined to be less than or equal to three bits and in block 83 the current impulse 156 (FIG. 4A) is encoded into a three-pack format. The three-pack containing impulse 156 (FIG. 4A) is stored into the work register (160, FIG. 5A) in block 85 and the GET NEXT IMPULSE routine (FIG. 3C) is called in block 87.

In block 114 of the GET NEXT IMPULSE routine impulse 162 (FIG. 4A) is obtained from the compressed bit string 120 (FIG. 4A), and in decision block 115 the encoder determines that processing has not reached an end-of-bit-string condition, and thus, processing returns to the ENCODE BIT STRING routine (FIG. 3A) in block 72.

In block 72 that the length of impulse 162 is determined to be four bits and in block 74 the polarity of impulse 162 is determined to be "0" (164, FIG. 5A). Decision block 76 is entered and the encoder 14 (FIG. 1A) determines that the length of impulse 162 (FIG. 4A) is not greater than five bits, and in decision block 78 (FIG. 3B) the encoder determines that there is presently an impulse residing in the work register. Specifically, a two-bit impulse having a polarity of "1" was stored in a three-pack format in the work register (160, FIG. 5A). In decision block 91 the number of impulses waiting to be processed is determined to be only one, and thus, decision block 100 is entered to determine if the length of impulse 162 (FIG. 4A) is greater than three bits. Impulse 162 is four bits in length, and thus, block 102 is entered to encode current impulse 162 and the waiting impulse into a two-pack and to store the two-pack into memory 16. The three-pack format waiting in the work register is converted into a two-pack by changing the format designator "11" (38, FIG. 2C) of the three-pack to a "10" (28, FIG. 2B) of the two-pack format. Also, a "0" is placed in the bit position (48, FIG. 2C) and "P₃" is modified to become a part of "L₂L₂" (which becomes "10") in 34 (FIG. 2B). The resulting compressed impulse is shown at 166, FIG. 5A and at 168 in the compressed bit string 122 of FIG. 4B. In block 104 the GET NEXT IMPULSE routine (FIG. 3C) is called, and in block 114 impulse 170 (FIG. 4A) is obtained from the bit string 120 (FIG. 4A). In block 115 impulse 70 is determined to be not at an end-of-bit-string condition, and thus, processing returns to the ENCODE BIT STRING routine (FIG. 3A) at block 72.

In block 72 impulse 170 (FIG. 4A) is determined to have a bit length of 40 and in block 74 impulse 170 is determined to have a "1"-polarity (172, FIG. 5). Block 76 is entered and the encoder 14 (FIG. 1A) determines that the length of impulse 170 is greater than five bits, and in decision block 80 the work register is checked and it is determined that there are presently no impulses waiting to be processed (166, FIG. 5). In block 86 impulse 170 is determined to have a length greater than 31 bits, and in block 92 impulse 170 is encoded into an extended element (FIG. 2D).

Two words of the extended element are required to encode an impulse having a length of 40 bits. The extended element format has a pair of bits, field "NN" (58, FIG. 2D), for designating the number of words to be encoded. The "NN" field is loaded with "00" to designate one extended word. Additionally, the polarity of the impulse is "1" so the polarity field "P₁" (54, FIG. 2D) is set to "1". Length field "L¹L¹L¹L¹L¹L¹L¹L¹" 60 (FIG. 2D) is loaded with the binary coded decimal number representation of the decimal number 40 (174, FIG. 5A).

Impulse 170 is shown in its extended element format at line 174 of FIG. 5A and in the resulting compressed bit string 122 of FIG. 4B at 176. In block 96 the GET NEXT IMPULSE routine is called to obtain the next impulse in the uncompressed bit string 120 (FIG. 4A). In block 114 (FIG. 3C) the next impulse 178 (FIG. 4A) is obtained from the uncompressed bit string 120 (FIG. 4A). In decision block 115 an end-of-bit-string condition is determined not to have been reached and processing continues in the ENCODE BIT STRING routine (FIG. 3A) in block 72.

In block 72 the length of impulse 178 (FIG. 4A) is determined to be two bits long, and in block 74 the polarity of the impulse is determined to be "0" (180, FIG. 5A). In decision block 76 the impulse length is determined not to be greater than five bits, and in block 78 (FIG. 3B) the encoder determines that there are currently no impulses in the work register. In decision block 81 the impulse length is determined to be less than or equal to three bits; it is two bits (180, FIG. 5A). Block 83 is entered to encode the two-bit impulse into a three-pack, and in block 85 the three-pack is stored into the work register (182, FIG. 5A). In block 87 the GET NEXT IMPULSE routine (FIG. 3C) is called to obtain the next impulse in the uncompressed bit string 120 (FIG. 4A). In block 114 the next impulse 184 (FIG. 4A) is obtained from the bit string 120 (FIG. 4A), and in decision block 115 an end-of-bit-string condition has not been reached in the uncompressed bit string 120. Processing returns to the ENCODE BIT STRING routine (FIG. 3A) in block 72.

In block 72 the length of the impulse 184 (FIG. 4A) is determined to be three bits long and in decision block 74 the polarity of the impulse is determined to be "0" (186, FIG. 5A). Decision block 76 is entered and encoder 14 determines that the length of impulse 184 is less than or equal to five bits, and in decision block 78 (FIG. 3B) the encoder 14 determines that there is a two-bit impulse in a three-pack format waiting to be processed in the work register (182, FIG. 5A). In decision block 91 the number of waiting impulses (178, FIG. 4A) is determined to be one and in decision block 100 the length of the current impulse 184 (FIG. 4A) is determined not to be greater than three bits. In decision block 106 the length of waiting impulse 178 (FIG. 4A), currently in the work register, is determined to be less than or equal to three bits, and in block 108 the waiting impulse 178 (FIG. 4A) and the current impulse 184 (FIG. 4A) are encoded into a three-pack format. The new three-pack format with both impulses 184 and 178 is stored into the work register at block 110 (188, FIG. 5A). In block 112 the GET NEXT IMPULSE routine (FIG. 3C) is called to obtain the next impulse 190 in the compressed bit string 120 (FIG. 4A). In block 114 the next impulse 190 (FIG. 4A) is acquired from the uncompressed bit string 120 (FIG.

4A) and in block 115 an end-of-bit-string condition is determined not to have been reached. Processing continues in the ENCODE BIT STRING routine (FIG. 3A) in block 72.

In block 72 the encoder determines that the length of impulse 190 (FIG. 4A) is two bits and in block 74 the encoder determines that the polarity of the impulse is "1" in 192 (FIG. 5A). In decision block 76 the encoder determines that the length of impulse 190 (FIG. 4A) is not greater than five bits and in decision block 78 (FIG. 3B) the encoder determines that there are impulses waiting to be processed in the work register. Specifically, there is a three-bit and a two-bit impulse waiting in a three-pack format in the work register (188, FIG. 5A). In decision block 91 two impulses are determined to be waiting in the work register, and in decision block 93, the length of impulse 190 (FIG. 4A) is determined not to be greater than three bits. In block 97 all three impulses 190, 184 and 178 (FIG. 4A) are encoded into the three-pack (194, FIG. 5A) and stored into memory 16. FIG. 4B shows the three-pack in the resulting compressed bit string 122 at 196. In block 98 the GET NEXT IMPULSE routine (FIG. 3C is called to obtain the next impulse in the uncompressed bit string 120 (FIG. 4A). In block 114 the next impulse 198 is obtained from the uncompressed bit string 120 and in decision block 115 an end-of-bit-string condition is determined to have not been reached and processing continues to the ENCODE BIT STRING routine (FIG. 3A) in block 72.

In block 72 the length of the impulse 198 (FIG. 4A) is determined to be two bits, and in block 74 the polarity of the impulse is determined to be "0" (200, FIG. 5B). In decision block 76 the encoder 14 (FIG. 1A) determines that the length impulse 198 is less than or equal to five bits; it is two bits long. Processing continues in decision block 78 (FIG. 3B), which determines that there are no impulses waiting to be processed in the work register. In decision block 81, the length of impulse 198 (FIG. 4A) is determined to be less than or equal to three bits—it is two bits long —and in block 83 impulse 198 (FIG. 4A) is encoded into a three-pack. In block 85 the three-pack is stored into the work register (202, FIG. 5B) and in block 87 the GET NEXT IMPULSE routine (FIG. 3C) is called to obtain the next impulse in the uncompressed bit string 120 (FIG. 4A). In block 114 the encoder obtains impulse 204 (FIG. 4A) from the uncompressed bit string 120 and in decision block 115 the encoder determines that an end-of-bit-string condition has not been reached. Processing returns to the ENCODE BIT STRING routine (FIG. 3A) in block 72.

In block 72 the length of impulse 204 (FIG. 4A) is determined to be twenty-four bits, and in block 74 the polarity of the impulse is determined to be "1" (205, FIG. 5B). Decision block 76 is entered and encoder 14 determines that the current impulse length is greater than five bits; impulse 204 is 24 bits in length. In decision block 80 an impulse is determined to be residing in the work register, specifically, a two-bit impulse having a polarity of "0" in a three-pack (202, FIG. 5B). In decision block 82 the encoder determines that there is only one impulse in the work register and in block 88 the three-pack format is converted into a one-pack format to accommodate the two-bit impulse (207, FIG. 5B) and stored into memory 16.

In decision block 86, the length of impulse 204 is determined not to be greater than 31 bits, it is 24 bits long, and thus, it is encoded in block 90 into a one-pack as well. The resulting compressed impulse is shown at line 208 of FIG. 5B and in the resulting compressed bit string 122 (FIG. 4B) at 210. In block 94 the GET NEXT IMPULSE routine is called to obtain the next impulse in the uncompressed bit string 120 (FIG. 4A). Specifically, in block 114 the encoder tries to obtain the next impulse in the bit string 120 and finds that there are no more impulses to be processed in the bit string.

In decision block 115 an end-cf-bit-string condition has been reached, and in block 119 the encoder determines whether there are any remaining bits in the bit string which can be encoded. There are three remaining bits 216 (FIG. 4A) in bit string 120 to be processed. Block 119 further determines if the remaining bits 216 (FIG. 4A) are a run of "1's" or a run of "0's". The remaining bits 216 (FIG. 4A) are a run of "0's", and thus, the bits need not be encoded because they do not contain information. Block 116 is entered to flush out the contents of the work register 9. Currently, the work register is empty because the contents were stored to memory earlier. (205, 207 FIG. 5B) Block 125 is entered to encode an extended element (FIG. 2D) and the encoder places it at the end of the resulting compressed bit string to signify the end of the bit string. The extended element is shown at line 12 of FIG. 5B and in FIG. 4B at 214 of the resulting compressed bit string 122.

II. Operations on Bit Strings

Referring to FIGS. 1A, 4A and 4B, as the encoder 14 converts the uncompressed bit string 120 (FIG. 4A) into the compressed bit string 122 (FIG. 4B), the compressed bit string 122 is stored in the secondary memory 16 of computer platform 10 (FIG. 1A). The bit string stored in secondary memory 16 may be representative of compressed data of many types. This information can be manipulated by performing Boolean operations directly on the bit strings representative of the data stored in secondary memory 16. The remaining portion of this disclosure centers on the unique process of performing Boolean operations at BLU 20 on the compressed bit strings stored in secondary memory 16. By being able to perform Boolean operations on the compressed bit strings, substantial savings in time and memory space are achieved. Time saving occurs because the encoded bit strings need not be decompressed to their original form when performing the Boolean operations. Additionally, through the use of unique hardware and/or software, the Boolean operations on the bit strings are more efficiently processed. Memory savings occur because the bit strings which result from the Boolean operations are maintained in a compressed form.

Only the primary Boolean operations AND, OR and EXCLUSIVE OR shall be discussed in detail. Even though the discussion is limited to the primary operators, it is envisioned that all 16 Boolean operations can be implemented by the BLU 20 within the scope of the appended claims. The coordination of the BLU 20 (FIG. 1A) with other components of the computer platform 10 is performed by a routine PROCESS BOOLEAN OPERATION (FIG. 6) executed by system coordinator (31, FIG. 1A). The system coordinator 31 (FIG. 1A) oversees processing of the Boolean operations on two bit strings and oversees canonical processing of the intermediate results generated by the BLU 20. There are two embodiments of the BLU 20, the first is a special purpose Boolean hardware configuration (FIG. 7), and the second is a Boolean software configuration, a portion of which can be implemented by an index table (FIG. 10).

Referring to FIG. 1A, when a request for processing a Boolean operation on two particular bit strings is made, the bit strings are retrieved from secondary memory 16 and sent via bus 17 to buffer memory 18. The bit strings remain in their encoded compressed form and are loaded to the BLU via bus 19 upon request by the BLU 20. BLU 20 performs the particular Boolean operation specified and intermediate results are tabulated and buffered (stored) at canonical processor 25 (FIG. 1A). When the processing of the bit strings is completed, the resulting compressed bit string is sent via bus 23 to buffer memory 18, where it resides until it can be output to secondary memory 16. This process of moving data via the buses to the various components of the computer platform 10 (FIG. 1A) is controlled by the system coordinator (31, FIG. 1A).

Figure 6:
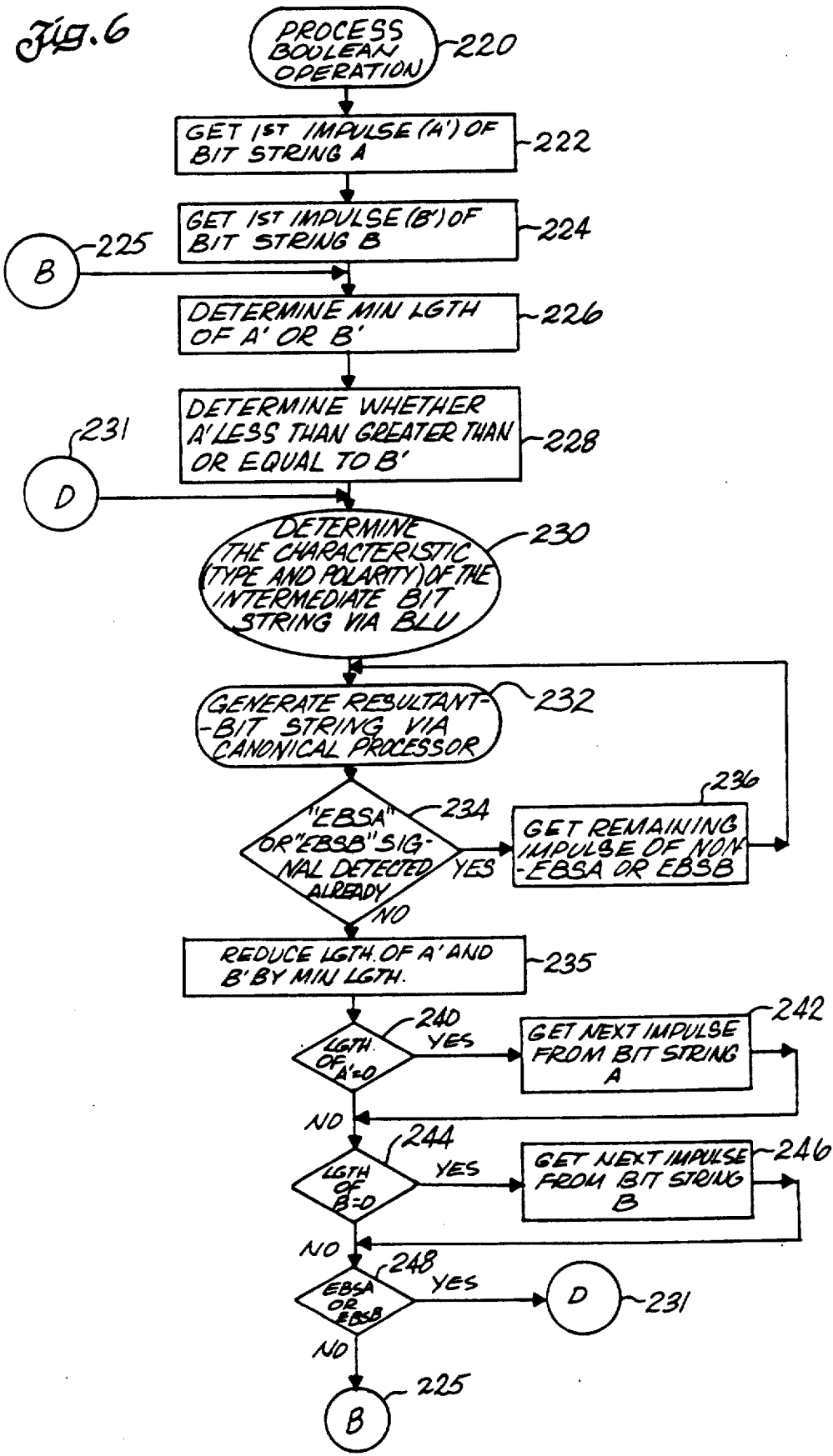
FIG. 6 is a flow block diagram of the PROCESS BOOLEAN OPERATION routine.

FIG. 6 is a detailed flow diagram of the PROCESS BOOLEAN OPERATION routine which is executed by the system coordinator 31 (FIG. 1A). This routine initiates the Boolean hardware or software embodiments of BLU 20 (FIG. 1A) as shown in FIGS. 7 and 10 and the routine initiates the canonical processor 25 (FIG. 1A). A more detailed discussion on the canonical processor (25, FIG. 1A) is presented in Section D. In block 222 (FIG. 6) a first impulse A' is obtained from a first bit string A residing in the buffer memory 18 (FIG. 1A). In block 224 the first impulse B' of the second bit string B is also obtained from buffer memory 18 (FIG. 1A). The minimum length of either impulse A' or B' is determined in block 226. The minimum length is the length of an intermediate bit string determined by processing impulse A' with impulse B'. In block 228 encoder 14 determines whether the length of impulse A' is less than, greater than, or equal to, impulse B' and in block 230 the Boolean special purpose hardware (FIG. 7) or the Boolean index table (FIG. 10) determines the characteristics of the intermediate bit string; whether the intermediate bit string is an impulse or run with polarity "0" or "1". Due to the unique structure of the compressed impulse formats, (FIGS. 2A, 2B, 2C and 2D) the Boolean operations can be performed very efficiently. This feature of the present invention will be discussed in more detail.

Figure 11B:
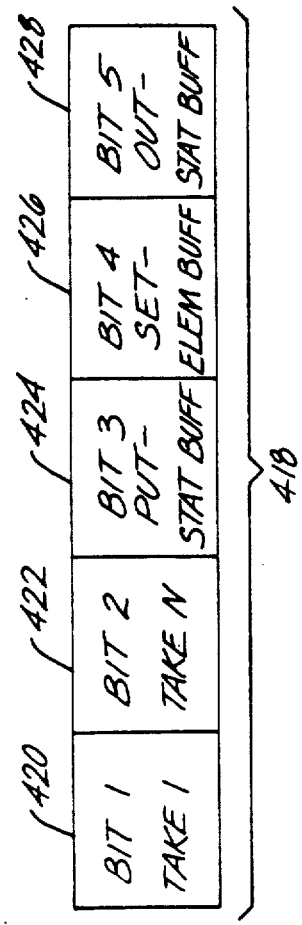
FIG. 11B is a schematic diagram of a state variable.

The intermediate bit string determination by the BLU in block 230 is then input to the canonical processor 25 (FIG. 1A) via subroutine GENERATE RESULTANT BIT STRING at block 232 (FIG. 11A). This subroutine generates one of 8 different state variables (FIG. 11B), which are indexed in a second index table (FIG. 12A) and enumerated in FIG. 12B, to convert the intermediate bit string results into one or more impulses. A detailed discussion on these subroutines will also be presented.

In decision block 234, a determination of whether an end-of-bit-string condition has occurred in either bit string A and/or the bit string B is made. An end-of-bit-string condition indicates that there are no more impulses in the bit string to be processed by the BLU. If an end-of-bit-string condition has occurred in one of the bit strings, then during block 236 the next impulse from the bit string which does not have an end-of-bit-string condition is obtained. Processing returns to the GENERATE RESULTANT BIT STRING routine (FIG. 11A) in block 232 which processes the next impulse obtained by block 236. Blocks 236, 232 and 234 are entered until no more impulses reside in the bit string.

Assuming that neither one of the bit strings has an end-of-bit-string condition, block 235 is entered to reduce the length of impulse A' and the length of impulse of B' by the minimum length determined in block 226. This step accounts for the bits which have been processed by the BLU in block 230.

In decision block 240 a determination is made whether the length of impulse A' has been reduced to zero. If the length of impulse A' has been reduced to zero, then in block 242 the next impulse A' is obtained from the bit string A. Assuming that the length of A' has not been reduced to zero, or when block 242 has finished processing, decision block 244 will be called to determine whether impulse B' has been reduced to zero. If impulse B' has been reduced to zero, block 246 is entered to get the next impulse B' from the bit string B. If impulse B' has not been reduced to zero, or when block 246 is finished processing, block 248 will be entered to determine if an end-of-bit-string condition has been reached in bit string A and/or bit string B. This step is performed to analyze the condition of the bit strings after the reduction of the minimum length from the two impulses A' and B' in block 235. Assuming that neither bit string has reached an end-of-bit-string condition, processing will return to block 226 of FIG. 6 to continue processing the newly obtained impulse(s) in either block 242 or in block 246 with the remainder of the other impulse, if necessary.

Returning to decision block 248, if an end-of-bit-string condition is reached in bit string A or bit string B or both, then block 230 is entered to determine how to most efficiently perform the current Boolean operation on the bit string having the remaining impulses. More particularly, block 230 outputs a signal which directs the GENERATE RESULTANT BIT STRING routine (FIG. 11A) how to most efficiently generate the resultant bit string without actually performing the Boolean operation. Essentially, if the end-of-bit-string condition has been reached in both bit strings, processing ends in the GENERATE RESULTANT BIT STRING routine (FIG. 11A) because there are no more impulses on which to perform the Boolean operation. However, if there are remaining impulses in either bit string, depending on the Boolean operation, either blocks 232, 234 and 236 are performed to generate a resultant bit string, or processing automatically exits in the GENERATE RESULTANT BIT STRING routine (FIG. 11A). (A more detailed discussion will be provided with FIGS. 7 and 10.)

Returning to blocks 226, 228 and 230 of FIG. 6, a more detailed description of the apparatus and method for determining an intermediate resultant bit string is now discussed. As stated above, block 226 determines the minimum length of two impulses obtained from the bit strings in buffer memory 18 (FIG. 1A). The minimum length will always be the length of the intermediate bit string because only the bits of the minimum length impulse will be processed against the corresponding bits of the longer impulse in the determination of the intermediate bit string. Thus, the longer impulse will always have remaining unprocessed bits. Additionally, the bits which are processed in the longer impulse will always be either a run of "1's" or a run of "0's". If the two impulses A' and B' are of equal length, the intermediate bit string length will be the length of either impulse A' or impulse B'. Block 228 determines whether the length of impulse A' is less than, equal to, or greater than the length of impulse B'. This information determined in block 228 will be used by the hardware or software implementations in FIGS. 7 and 10 during block 230. With the length of the intermediate bit string calculated in block 226, only the characteristics of the intermediate bit string need to be determined, i.e., whether the intermediate bit string is a run of "1's" or "0's" or an impulse having a polarity of "1" or "0". Block 230 (hardware or software embodiments) efficiently calculates these characteristics of the intermediate bit string.

A. Hardware Embodiment for Performing Boolean Operations on Compressed Impulses The preferred embodiment of Boolean hardware for calculating the characteristics of an intermediate bit string is shown in the schematic block diagram in FIG. 7. FIG. 7 depicts the flow of information. The actual inputs and outputs for each function are depicted in FIGS. 9A, 9B, 9C, 9D, 9E and 9F. A detailed discussion of its implementation is now presented. Blocks 256, 258, 260, 262, and 264 embody special purpose customizable logic array chips (e.g. XILINX chips) and each performs a particular step in performing the Boolean operation. More particularly, the purpose of hardware function F4 264 is to determine the polarity of the intermediate bit string. Hardware function F1 256, and F2 258 are for determining the type of the intermediate bit string (e.g., whether the intermediate bit string is a run or an impulse) when impulses A' and B' are of unequal lengths. Hardware function F3 262 determines the type of the intermediate bit string when impulses A' and B' are equal in length. Lastly, hardware function F6 265 determines whether an end-of-bit-string condition exists in either bit string A and/or B.

As stated, function F1 256 is performed when the lengths of impulses A' and B' are unequal. The purpose of function F1 256 is to determine the polarity of the longer impulse. The inputs to F1 256 are the polarity of impulse A' called "A'(P)", the polarity of impulse B' called "B'(P)", and the condition "LT" indicating whether the length of A' is less than the length of B' as determined in block 226 (FIG. 6). Function F1 outputs the polarity of the longer impulse, either a "0" for "0"-polarity or "1"-polarity. A truth table representing the various inputs and results of hardware function $F_1$ is shown in FIG. 9A. The top line of the truth table shows the LT input; whether the length of impulse A' is less than or greater than the length of impulse B'. When LT is "0", the length of impulse A' is greater than impulse B' and when LT is "1", the length of impulse A' is less than impulse B'. More particularly, if the length of impulse A' is less than B', then the column of results under "1" represents the output of F1. Likewise, if the length of impulse A' is greater than B', then the column of results under "0" represents the output of function F1. The left-hand side of the truth table depicts the polarity inputs of impulses A' and B'. For example, when the length of impulse A' is less than impulse B' and the polarity of A' and B' is "0" respectively, the polarity of the longer impulse is "0", and thus the result of F1 is "0".

When impulses A' and B', to be processed by the Boolean operation, are unequal in length, a run (i.e., a portion of the longer impulse) is always processed against a shorter impulse. For this reason, the results of processing a run having polarity "0" or "1" against an impulse having polarity ("0" or "1") can be modeled by a hardware function and depicted in a table representation in FIG. 8A. More particularly, FIG. 8A depicts the function F2 and it shows that by knowing the polarity of the run, or the output of F1, and the particular Boolean operation to be performed, the characteristics of the intermediate bit string can be determined without calculating the polarity of the impulse.

More particularly, the table of FIG. 8A is separated into three different columns. The first column 251, on the left-hand side, names the Boolean operation to be performed by the BLU 20. The second column 253 names the inputs and output to F2 258 (FIG. 7), and the third column 255 depicts the polarity of the input impulse, the polarity of the input run and the polarity of the intermediate bit string result. The table is also separated into three sections, 266, 267, and 268, each corresponding to a different Boolean operation.

Referring to section 266, the results of performing the AND operation are shown. It is a property of the AND operation, when an impulse having polarity "0" or "1" processed against a run of "0's", the intermediate bit string obtained from this operation is always a run of "0's", regardless of the polarity of "1" or "0" it always results in a run of "0's". Likewise, a run of "1's" ANDed against an impulse having a polarity of "0" or "1" will always result in an impulse. Thus, by knowing the polarity of the longer bit string (F1) and by knowing the operation to be performed by the BLU, the characteristics of the intermediate bit string can be determined without calculating the length of the run (i.e., a portion of the longer impulse) or shorter impulse and without calculating the polarity of the impulse (i.e., shorter impulse). When the type (run or impulse) determined by F2 is a run, the F2 function outputs a "0", and when the type determined by F2 is an impulse, the F2 function outputs a "1". Thus, a truth table representation of function F2 can be created as in FIG. 9B. When the Boolean operation is an AND operation and the longer bit string is a run having a polarity of "0" (e.g., output F1), the output of F2 is a "0", or a run. The truth table of FIG. 9B, depicting the results of the F2 function 258 (FIG. 7), demonstrates an interesting property for determining the characteristics of the intermediate bit string. When the AND operation is performed, the output of the F2 function is the output of the F1 function. Additionally, when the Boolean operation is an OR operation, the output of the F2 function is simply the complement of the output of the F1 function. Lastly, when the operation is EXCLUSIVE OR, the F2 function automatically outputs a "0" without interpreting the input function F1. Thus, the hardware embodiment need only perform the following functions when the impulses are unequal in length:

F2=F1 (operation—AND);
F2=NOT F1 (operation—OR);
F2="0" (operation—EXCLUSIVE OR); where
F1 is the polarity of the longer impulse.

From these observations, three formal rules are now developed for determining an intermediate bit string when impulse A' is unequal in length to impulse B'. Rule I, when the Boolean operation is an AND operation, the polarity of the longer impulse indicates whether the intermediate bit string is a run or an impulse. More particularly, if the polarity of the longer impulse is "1" and the Boolean operation is AND, the intermediate bit string is always an impulse. Likewise, if the polarity of the longer bit string is "0" and the Boolean operation is an AND operation, the intermediate bit string is always a run. Rule II, when the Boolean operation is an OR operation, the complement of the polarity of the longer bit string indicates whether the intermediate bit string is a run or an impulse. More particularly, if the polarity of the longer bit string is "1" and the Boolean operation is an OR, the intermediate bit string is always a run. Likewise, if the polarity of the longer bit string is "0" and the Boolean operation is OR, the intermediate bit string is always an impulse. Lastly, Rule III, when the Boolean operation is an EXCLUSIVE OR operation, the intermediate bit string is always an impulse, regardless of the polarity of the longer and shorter bit strings.

Once the characteristic of the intermediate bit string is determined, the polarity of the intermediate bit string is simultaneously determined by function F4 264 (FIG. 7). F4 simply performs the particular Boolean operation on the polarity of impulse A' with the polarity of impulse B'. Regardless of whether impulse A' is longer or shorter than impulse B', the polarity of the resultant intermediate bit string will always be the result of ANDing the polarities of the two impulses. The same principle holds true for OR and EXCLUSIVE OR on impulses of equal or unequal lengths.

Referring to FIG. 9C, a truth table depiction of the results for F4 is shown. The inputs to F4 are the Boolean operations (i.e., AND, OR and EXCLUSIVE OR) and the polarity ("0" or "1") of the impulses A' and B' (See also FIG. 7.) When the polarities of A'(P) and B'(P) are "0" and the Boolean operation is AND, the results of ANDing "0" with "0" is "0" as shown in the map FIG. 9C. The hardware implementation logically follows the truth table FIG. 9C.

To this point, the discussion regarding the Boolean hardware involved impulses A' and B' when they are unequal in length. Now, a detailed discussion is presented for processing impulses A' and B' when they are equal in length. Specifically, function F3 262 of FIG. 7 determines the intermediate result when impulses A' and B' are equal. FIG. 8B is a table depicting the intermediate bit string results of function F3. Like FIG. 8A, FIG. 8B is separated into three columns. The first column 271, in the left-hand side of the table, labels the Boolean operations to be performed by the F3 function (262, FIG. 7). The next column 273, labels the impulses A' and B' and the intermediate bit string results of the F3 function. Column 275 depicts the polarities of the input impulses and the polarities of the resulting bit strings. FIG. 8B demonstrates that when the impulses are equal in length, the characteristics of the intermediate bit string can be calculated with only knowing the polarities of impulses A' and B'. For example, if the input Boolean operation is AND and the impulses A' and B' have polarity "0", then the resulting bit string is an impulse with a polarity "0", as depicted in the table FIG. 8B. These results logically follow because the AND operation of impulses which are equal in length and have "1" bits in the same location, produces the same bit string. Likewise, when the impulse A' has a polarity of "0" and operation is AND, the intermediate bit string is a run of "0's".

The results depicted in FIG. 8B suggests the following formal set of rules: Rule I, when the Boolean operation is either an AND or an OR operation, and when the polarity of the impulses A' and B' are different, the intermediate bit string is a run. This property is shown in box 276 of FIG. 8B. Rule II, when the Boolean operation is either an AND or an OR operation, and when the polarity of impulse A' and impulse B' are the same, the intermediate bit string is an impulse as shown in box 278 of FIG. 8B. Lastly, when the Boolean operation is EXCLUSIVE OR, it doesn't matter what the polarity of impulses A' and B' are, the result will always be a run as shown in box 280 (FIG. 8B).

The results of function F3 can be represented in a truth table as shown in FIG. 9D. When the result of F3 is "0", the Boolean operation result is a run and when the result is "1", the Boolean operation result is an impulse. The top row of the truth table represents the polarities of both A' and B', and the left-hand column represents the particular Boolean operation to be performed.

Whenever BLU 20 performs an operation on two impulses, the operations in F1, F2, F3 and F4 are performed simultaneously. This occurs because the hardware can most efficiently calculate results concurrently. Thus, depending on whether the bit strings are equal or unequal, a determination is made as to whether the outputs of F2 or F3 will constitute the characteristic determination of the intermediate bit string. For this reason, function F5 evaluates whether the impulses are equal or unequal in length and, in accordance with this determination, chooses which outputs, F2 or F3, depict the characteristics of the intermediate bit string. An output of "0" means that the intermediate bit string is a run, and an output of "1" means that the output is an impulse. (See FIG. 9(F)). However, regardless of the function chosen by F5, the F4 function always determines the polarity of the intermediate bit string.

Functions F1 through F5 process the Boolean operations on bit strings A and B, to determine intermediate bit strings, as long as impulses remain in both bit strings. When one or both of the bit strings have all of their impulses processed, an end-of-bit-string condition occurs. When this situation occurs, the Boolean operation need not be performed. Instead, function F6 outputs a particular signal to the canonical processor 25 (FIG. 1A) to output to the resultant bit string any remaining bits in the longer bit string or to exit the routine when both bit strings have an end-of-bit-string condition (e.g., no more impulses).

Referring to FIG. 9E, a truth table of the particular results for the various Boolean operations is shown. Particularly, in the left-hand column, the operations AND, OR and EXCLUSIVE OR are shown and in the top row, the conditions of the bit strings are shown, i.e., end-of-bit-string condition in bit string A, "EBSA", end-of-bit-string condition in bit string B, "EBSB", and end-of-bit-string condition in bit strings A and B, "EBSA+EBSB".

Referring to the results portion of the map, there are three kinds of signals which are output from F6. First an "EBSA+EBSB" signal, which informs canonical processor 25 (FIG 1A) (via the GENERATE RESULTANT BIT routine (FIG. 11A)) that no more impulses reside in either bit strings A or B. Second, an "EBSA" signal, informs canonical processor 25 (via the GENERATE RESULTANT BIT STRING routine (FIG. 11A) that there are no more impulses in bit string A and that there are one or more impulses remaining in bit string B. Lastly, an "EBSB" signal, informs the canonical processor 25 (via the GENERATE RESULTANT BIT STRING routine (FIG. 11C) that there are no more impulses in bit string B and that there are one or more impulses remaining in bit string A.

When an "EBSA" condition arises in bit string A and the Boolean operation is AND, the remaining bits of bit string B are ANDed against an implied run of "0's" which follows the end of the bit string in A. In the preferred embodiment, all bit strings are assumed to have an infinite run of "0's" following the ending bit in the bit string. Thus, if the remaining bits of the longer bit string are ANDed against the infinite run of "0's", the result will always be "0" (e.g., "1" AND "0" ="0"; "0" AND "0" ="0"). A result of "0" means that there is no information in the resulting intermediate bit string, and thus, this step need not be performed. As a result, function F6 always outputs an "EBSA+EBSB" signal when the operation is AND. In effect, this signal means that the longer bit string is truncated to be equal in length to the shorter bit string, and the remaining bits which were truncated are not processed. Therefore, regardless of whether the bit strings are equal or unequal in length, when an end-of-bit-string condition is encountered in bit string A or bit string B, the AND operation on the bit string is considered to be completed.

When the Boolean operation is OR and EXCLUSIVE OR and an end-of-bit-string condition occurs in bit string A or B (e.g., they are unequal in length), the remaining bits in the longer bit string are output directly to the resultant bit string by the canonical processor 25 at block 232. More particularly, function F6 outputs an "EBSA" or "EBSB" signal and any remaining bits in the longer bit string are output to the resultant bit string. The remaining bits of the longer bit string are output to the resultant bit string without processing them against an infinite run of "0's" following the ending bit of the shorter bit string because the result of the EXCLUSIVE OR or OR operation on the remaining bits of the longer bit string with the infinite run of "0's" always results in the remaining bits of the longer bit string (i.e., "1" OR "0"="1"; "0" OR "0"="0" ; "1" XOR "0"="1"; and "0" XOR "0"="0"). Thus, the Boolean operation need not be performed and the remaining bits of the longer bit string can be directly output by the canonical processor 25. Likewise, when an end-of-bit-string condition exits in both bit strings A and B, processing exists because the Boolean operation has completed processing on both bit strings.

So far, we have discussed in detail a hardware embodiment (FIG. 7) for performing Boolean operations and processing end-of-bit-string conditions. Now a second embodiment which could be either hardware or software (FIG. 10) for doing the same is presented.

B. Second Embodiment For Performing Boolean Operations On Compressed Impulses As in the case of the Boolean hardware embodiment (FIG. 7) of the BLU 20 (FIG. 1A), the specific purpose of the Boolean embodiment (FIG. 10) of the BLU 20 (FIG. 1A) is for determining the characteristics of the intermediate bit string; specifically, whether the intermediate bit string is a run or an impulse, and the polarity of the run or impulse. Additionally, the purpose of the embodiment is for evaluating end-of-bit-string conditions to determine how to most effectively complete each Boolean operation.

Referring to FIG. 10, a portion of the second embodiment is implemented by a first-index table. The first-index table is made up of a series of subtables 310, 312 and 314, where each of the subtables corresponds to a particular Boolean operation. More particularly, subtable 310 corresponds to the AND operation, subtable 312 corresponds to the OR operation, and subtable 314 corresponds to the EXCLUSIVE OR operation. Each of the subtables is a matrix of one or more functions for outputting appropriate signals (i.e., "00", "EBSA", "EBSB" and "EBSA+EBSB" signals) to the canonical processor 25 (FIG. 1A).

Each subtable has three indexes. Referring to subtable 310, a first and second index for depicting the polarity of impulse A' and B' are shown at 327, 328, 317 polarity "0". Likewise, "B'10" at 321 means that impulse B' has polarity "1". The third index "A':B'" at 320 and 322 is for identifying whether the length of the first impulse A' is less than (<), greater than (>), or equal (=) to the length of the second impulse B'. The resulting signals at 324 and 326 (i.e., "10", "00", "01", or "11") depict the characteristics (i.e., polarity and type (run or impulse)) of the intermediate bit string resulting from a Boolean operation. In shorthand, the "00" signal stands for a run having polarity "0". Likewise, output signal "01" stands for an impulse having a polarity "0". When the Boolean operation is an AND, subtable 310 is referenced and, depending upon the characteristics of the input impulse A' and input impulse B' (i.e., polarity and length), the function referenced by the three indexes outputs a signal as depicted in matrixes 324 and 326. The output signals of the functions defined by the index table (FIG. 10) at 324 and 326, correspond directly to the outputs of functions F2, F3, F4 and F5 of the Boolean hardware embodiment (FIG. 7) discussed above.

For example, assume that an input impulse A' having a polarity "0" is ANDed with an input impulse B' having a polarity "0". In addition, consider the length of input impulse A' to be less than the length of input impulse B'. Referring to subtable 310, corresponding to the AND operation, indexes for "A'01" at 321, "B'01" at 317 and "A':B'" (<) at 322 reference the output signal "00" at 324.

Subtables 312 and 314, corresponding to Boolean operations OR and EXCLUSIVE OR, respectively, are set up as subtable 310. The subtables have three indexes and outputs of predefined functions are shown at 350, 354, 70 and 374. Likewise, the outputs depict the characteristics of the intermediate bit string generated by the EXCLUSIVE OR and OR operations.

Each of the subtables is also equipped with matrixes of results corresponding to end-of-bit-string conditions. Specifically, referring to subtable 310 for the AND operation, end-of-bit-string conditions are indexed at 332, 330 for the A and B bit strings, respectively. As shown in areas 327, 329 and 331, if an end-of-bit-string is encountered in the A bit string and/or the B bit string, the appropriate signal (i.e., "EBSA", "EBSB" and "EBSA+EBSB"), is output (FIG. 9E). The end-of-bit-string conditions for the AND operation are evaluated by the canonical processor 25 in exactly the same fashion as for output signals of function F6 of the Boolean hardware embodiment (FIG. 7) discussed above.

Likewise, the end-of-bit-string conditions for OR and the EXCLUSIVE OR are processed identically to function F6 (FIG. 7). Specifically, consider what happens during an OR operation when an end-of-bit-string condition occurs in only bit string A ("EBSA"). As discussed above, the remaining bits of bit string B will be OR'd with the infinite implied run of "0's" occurring after the end bit condition of bit string A. The OR and EXCLUSIVE OR operation always result in the remaining bits of the longer bit string as stated earlier. For this reason, the OR and EXCLUSIVE OR operation need not be performed and, instead, the remaining bits of the longer bit string are directly output to the resultant bit string by the canonical processor 25. More particularly, an "EBSA" signal resulting from the subtable 312 at 352 means to the canonical processor 25, that the remaining bits in the longer bit string B are directly output to the resultant bit string. When the end-of-bit-string condition arises for both the A and B bit strings at 348 and 340, the result is an "EBSA+EBSB" signal which signifies to the canonical processor 25 that no more bits from the bit strings need be added to the resultant bit string and the routine exits as detailed in FIG. 11A.

C. Performing Boolean Operations On Compressed Runs

To this point, the Boolean hardware embodiment (FIG. 7) and the Boolean embodiment (FIG. 10) of the BLU 20 (FIG. 1A) have been described for performing Boolean operations on compressed impulses. The Boolean operations can also be performed on compressed runs.

A compressed run format includes a first and a second indicator. The first indicator is for indicating the polarity (e.g., "0" or "1") of the one or more same polarity bits of the run. The second indicator is for indicating the length in the run. Unlike the process of determining a resultant bit string by performing Boolean operations on two impulses, the process of performing Boolean operations on two compressed runs is simplified. First, the determination of type, i.e, run or impulse, need not be determined because the immediate results are always runs. Stated differently, complex tables (i.e., FIG. 10) need not be referred to nor complex operations performed by hardware (FIG. 7) because only the polarity bits of the respective runs need be processed by the specified Boolean operation and the length of the resulting run is the shorter run.

Specifically, when a request for processing a Boolean operation on two particular bit strings is made, and the bit strings have been separated into series of runs, the bit strings are retrieved from secondary memory 16 and brought by bus 17 to buffer memory 18. When the bit strings are loaded into the BLU via bus 19, the BLU 20 performs the particular Boolean operation specified on the polarities of the runs and intermediate results are tabulated. The first step in performing Boolean operations on bit strings containing compressed runs is to obtain the first run in the first and second bit strings. The BLU 20 then determines whether the first and second bit string runs are equal or unequal in length by comparing the length indicators of the compressed run formats. If the runs of the first and second bit strings are unequal in length, then the BLU 20 determines the length of the shorter run. The shorter length is the length of the bits of the intermediate resultant bit string. In other words, only the bits of the shorter run are processed against the same number of bits of the longer run to determine an intermediate resultant run. All of the runs of both bit strings are processed in this fashion until there are no more runs left to process. The intermediate resultant bit strings are then tabulated together to form a resultant bit string. Once the length of the intermediate resultant bit string is determined, the polarity of the intermediate resultant bit string is efficiently determined by performing the specified Boolean operation only the polarity indicator of the first run with the polarity indicator of the second run. The result of this operation is the polarity of the intermediate resultant bit string.

If the comparison of the first and second bit string runs results in a determination that the runs are equal in length, then the length of the intermediate resultant bit string is set equal to the length of either the first or the second runs. The length of the intermediate resultant bit string is equal to the length of either run because both runs will be fully processed against each other to generate the intermediate resultant bit string. Once the length of the intermediate resultant run is determined, the polarity of the intermediate resultant run is determined by processing the specified Boolean operation on the polarity indicator of the first run with the polarity indicator of the second run.

As in the case of processing compressed impulses, only the bit lengths and polarity indicators of the runs are processed. This configuration creates a process efficiency because not all of the bits of the run need to be processed one at a time. The intermediate resultant bit strings also reside in compressed run formats and they are combined to generate the resultant compressed bit string.

D. Canonical Processing of Intermediate Bit Strings

Figure 11C:
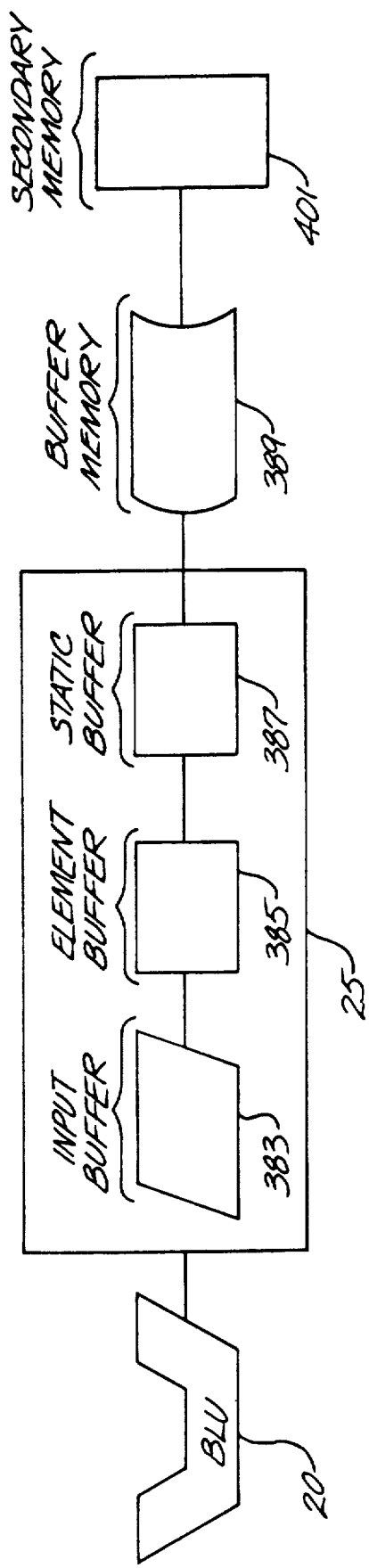
FIG. 11C is a schematic block diagram which depicts the hardware components of the canonical processor 25 (FIG. 1)

Referring to FIGS. 11A, 11B, 11C, 12A and 12B, a detailed description of the canonical processor (25, FIG. 1A and FIG. 11C) is now discussed. Specifically referring to FIG. 11A, a detailed flow diagram of the canonical processor 25, called GENERATING RESULTANT BIT STRING routine, for controlling the component of the canonical processor 25, is shown. The hardware components of the canonical processor 25 are shown at FIG. 11C. The overall purpose of the canonical processor 25 is for properly combining an intermediate bit string (i.e., run or impulse) with another intermediate bit string (i.e., run or impulse) to form an impulse of the resultant bit string. Additionally, the canonical processor processes end-of-bit-string conditions as discussed earlier. Essentially, via the GENERATING RESULTANT BIT STRING routine the canonical processor 25 interprets a state variable (FIG. 11B), which references a second index table (FIG. 12A) to determine how to process the outputs of the Boolean hardware embodiment (FIG. 7) or the Boolean embodiment (FIG. 10). The state variables are combinations of set bit-flags which are depicted in FIG. 12B.

FIG. 11C represents the hardware components of the canonical processor 25 (FIG. 1A) for buffering intermediate bit strings and generating a resultant bit string. The hardware components for connecting the intermediate bit strings together are input buffer 383, element buffer 385, and static buffer 387. The intermediate bit string results are output from the Boolean hardware or software embodiments at block 230 of FIG. 6. The intermediate bit string is then sent to the input buffer 383 of FIG. 11C for temporary holding. The canonical processor 25 then determines how to combine or not to combine the contents of the input buffer 383 with the contents of the element buffer 385 to form an impulse of the resultant bit string. The impulse of the resultant bit string is output to the static buffer 387. The purpose of static buffer 387 is to hold all of the generated encoded impulses in proper order until bit string is complete. After both bit strings are fully processed, (e.g., end-of-bit-string conditions occur) the contents of the static buffer 358 is the final compressed resultant bit string and it is output to buffer memory 389. The resultant bit string resides in buffer memory 389 temporarily until it can be placed into secondary memory 401 (16, FIG. 1A) or provided to the BLU 20 for additional Boolean processing.

1) Generate Resultant Bit String Routine

The GENERATE RESULTANT BIT STRING routine (FIG. 11A) coordinates the components of the canonical processor FIG. 11C, as discussed above. In particular, in block 384 the intermediate bit string generated from BLU 20 hardware (FIG. 7) or BLU 20 second embodiment (FIG. 10) is placed into the input buffer 386 (FIG. 11C). In block 386 a state variable (418, FIG. 11B), for processing the contents of the input buffer 383 and element buffer 385 is determined by reviewing the second index table (FIG. 12A). The state variable is made up of five bits, each bit representing a different flag; TAKE 1 at 420, TAKE N at 422, PUT-STAT BUFF at 424, SET-ELEM BUFF at 426, OUT-STAT BUFF at 428. The first flag, TAKE 1, indicates that there is a run in the element buffer 385 having a particular polarity and it needs to be combined with a run or an impulse in the input buffer 383 having an opposite polarity; (e.g. a run having a polarity of "0" combined with a run or impulse having a polarity of "1"). The second flag, TAKE N, indicates that there is a run having a particular polarity which resides in the element buffer 385, and it needs to be combined with a run or impulse of the same polarity currently in the input buffer 383 (e.g., a run having polarity "0" combined with a run or impulse having polarity "0"). The third flag PUT-STAT BUFF indicates that a newly formed impulse exists in the element buffer 385 and it needs to be placed into the static buffer 387. The fourth flag SET-ELEM BUFF indicates that the contents of the input buffer 383 need to be placed into the element buffer 385. The fifth flag, OUT-STAT BUFF, indicates that the static buffer 387 contains a completed resultant bit string which needs to be output to buffer memory 389 for temporary storage.

Returning to block 386 of FIG. 11A, once the state variable 314 (FIG. 11B) is retrieved from the second index table (FIG. 12A) (a detailed discussion on the retrieval process will follow shortly), the remaining blocks 388, 396, 402, 406 and 410 (FIG. 11A) are entered to have the canonical processor determine which flags are set in the state variable 418 (FIG. 11B). Specifically, in decision block 388 the canonical processor determines whether the TAKE 1 flag 420 of the state variable 418 is set. If flag 420 is set, then in block 390, a bit from the contents of the input buffer 383 (FIG. 11C) is appended to the contents of the element buffer 385 (FIG. 11C). In block 392 the length indicator for the impulse, now residing in the element buffer 385, is incremented. Additionally, in block 394 the length indicator, for the contents of the input buffer 383, is reduced by one.

If the TAKE 1 flag 420 of the state variable 418 is not set, or if processing in blocks 390, 392 and 394 is completed, then in decision block 396 the canonical processor will determine whether the TAKE N flag 422 of the state variable 418 is set. Assuming that the TAKE N flag 422 is set, block 398 is entered to take N bits from the contents of the input buffer 383 and to append the N bits to the contents of the element buffer 385. Block 400 is entered to add N to the length of the impulse now residing in the element buffer 385. If the TAKE N flag 422 of the state variable 418 (FIG. 11B) is not set, or if processing in blocks 398 and 400 is completed, processing will continue in decision block 402 to determine whether the PUT-STAT BUFF flag 424 is set. Assuming that the PUT-STAT BUFF flag 424 is set, block 404 is entered to output the contents of the element buffer 385 to the static buffer 387. If the PUT-STAT BUFF flag 424 is not set, or if processing in block 404 is completed, then processing will continue in block 406 to determine if the SET-ELEM BUFF flag bit 426 is set. If the flag bit 426 is set, then in block 408 the contents of the element buffer 385 (FIG. 11C) is replaced with the contents of the input buffer 383 (FIG. 11C). If the flag bit 426 is not set, or if processing in block 408 is completed, then processing will continue in block 410 to determine if the OUT-STAT BUFF flag bit 428 is set. If this bit is set, then block 412 is entered to output the contents of the static buffer 387 to buffer memory 389 and block 414 is entered to exit the GENERATE RESULTANT BIT STRING routine. If the OUT-STAT BUFF flag bit 428 of state variable 418 is not set, then processing returns to the PROCESS BOOLEAN OPERATION routine (FIG. 6) in block 234.

2) Second Index Table

Referring to FIG. 12A, a detailed description of the second index table which is a portion of the canonical processor 25 (FIG. 11C) will now be discussed. The second index table is essentially an indexing configuration for determining which set of flags of the state variable (FIG. 11B) are set. As stated earlier, the state variable directs the canonical processor how to process the intermediate bit strings residing in the input and element buffer (383 and 385 of FIG. 11C). The left-hand column 432 of the second index table represents the contents of the element buffer 385 (FIG. 11C). For example, the contents of the element buffer 385 could be an impulse having polarity of "0" 444, an impulse having polarity of "1" 446, a run having polarity "0" 448, a run having polarity of "1" 450 or be empty "MTY" 452. The top portion of the second index table (FIG. 12A) depicts the contents of the input buffer 383 (FIG. 11C). The contents of the input buffer 383 (FIG. 11C) can be an impulse having polarity of "0" 434, an impulse having polarity of "1" 436, a run having polarity "0" 438, a run having polarity "1" 440 or an end-of-bit-string condition in both bit string A and bit string B, "EBSA+EBSB" 442. By knowing the contents of the element buffer 385 and the contents of the input buffer 383, a particular state variable (FIG. 11B) for directing the canonical processor 25 (FIG. 11C) will be referenced. For example, if the contents of the element buffer is a run having polarity "0" 448 and the contents of the input buffer is a run having polarity "0", then the state variable "01000" at 478 is referenced. The second bit of the state variable is set, corresponding to the TAKE N flag.

For convenience, each result to be referenced in the second index table (FIG. 12A) has been given a name which is broken up into two parts; for example, "00-01". The first part, before the dash, corresponds to the contents of the element buffer 385 (FIG. 11C), and the second part corresponds to the contents of the input buffer 383 (FIG. 11C). For example, "00-01" means that the contents of the element buffer 385 (FIG. 11C) is a run with a polarity of "0" 448 and the contents of the input buffer is an impulse with a polarity of "1" 436. "01-XX" means that the contents of the element buffer 385 (FIG. 11C) is an impulse having polarity "1" and the contents of the input buffer 383 (FIG. 11C) is a run or an impulse of either polarity ("0" or "1"). "11-EBSA+EBSB" at 500 indicates that the contents of the element buffer 385 (FIG. 11C) is a run having polarity "1" 450, and the contents of the input buffer 383 (FIG. 11C) is a signal indicating an end-of-bit-string condition in both bit strings A and B 442.

FIG. 12B depicts each result of the second index table. Specifically, each row of FIG. 12B corresponds to a different result. The second index table can be broken up into six parts; column 532 for result names, column 534 for the state variables associated with each result, column 536a for the TAKE N and TAKE 1 flags, column 538 for the PUT-STAT BUFF flag and column 542 for both the SET-ELEM BUFF flag and the OUT-STAT BUFF flag.

Referring to FIGS. 12A and 12B, a detailed description of each result that may be referenced by the second index table is presented. When an impulse of any length having a polarity "0" is in the element buffer (444, FIG. 12A) and the contents of the input buffer is an impulse having polarity "0" (434, FIG. 12A), or an impulse having polarity "1" (436, FIG. 12A), or a run having polarity "0" (438, FIG. 12A), or a run having polarity "1" (440, FIG. 12A), the "01-XX" result at 454, 464, 474 and 484 is referenced. The "01-XX" result has a state variable (FIG. 11B) of "00110" which means that in all cases enumerated both the PUT-STAT BUFF flag and SET-ELEM BUFF flag are set (504, FIG. 12B). In accordance with the flags set in the state variable, the GENERATE RESULTANT BIT STRING routine (FIG. 11A) instructs the canonical processor 25 to take the impulse having polarity "0" in the element buffer 385 and places it into the static buffer 387. Also, the contents of the input buffer 383 are placed into the element buffer 385. The impulse having polarity "0" in the static buffer (row 504, column 538, FIG. 12B) becomes an impulse of the resultant bit string.

Referring back to FIG. 12A, when the contents of the element buffer 385 (FIG. 11C) is an impulse having polarity "1" (446, FIG. 12A) and the contents of the input buffer is an impulse having polarity "0" 434, an impulse having polarity "1" 436, a run having polarity "0" 438, or a run having polarity "1" 440, the result is "10-XX" 456, 466, 476 and 486 (506, FIG. 12B). Result "10-XX" has a state variable "00110" which is identical to the state variable for "01-XX" (504, FIG. 12B), and thus the same flags PUT-STAT BUFF and STAT-ELEM BUFF are set. The only difference in the two results occurs in the resultant bit string; static buffer 387 (FIG. 11C) has an impulse having a polarity "1" added to it (506, 538, FIG. 12B) instead of an impulse having polarity "0".

When the contents of the element buffer is an impulse having polarity "0" 444 (FIG. 12A) and the contents of the input buffer is an "EBSA+EBSB" 442 (FIG. 12A) signal, the "01-EBSA+EBSB" result is referenced at 494 (FIG. 12A). This result has state variable "00101" (508, 534, FIG. 12B) and the flags PUT-STAT BUFF and OUT-STAT BUFF are called. The purpose of this result is to instruct the canonical processor to first take the contents of the element buffer 385 (FIG. 11C) and place it into the static buffer 387 (FIG. 11C), and second, to take the contents of the static buffer 387 (FIG. 11C)—the resultant bit string—and output it to the buffer memory 389 (FIG. 11C). The end-of-bit-string condition signifies that the impulse residing in the element buffer 385 is the last impulse processed and it can be directly output to the static buffer 387 (FIG. 11C). Once the last impulse is placed into the static buffer, the resultant bit string is complete, and it can be output from the static buffer 387 (FIG. 11C) to buffer memory 389 (FIG. 11C).

If the contents of the element buffer 385 (FIG. 11C) is an impulse having polarity "1" 446 and the contents of the input buffer 383 (FIG. 11C) is an "EBSA+EBSB" signal (442, FIG. 12A), then the "10-EBSA+EBSB" result (496, FIG. 12A) is referenced. This result has the same state variable "00101" as result "01-EBSA+EBSB" discussed above. However, an impulse with a polarity "1" instead of polarity "0" is output to the static buffer 387 (510, 538, FIG. 12(B)).

If the contents of the element buffer 385 (FIG. 11C) is a run having polarity "0" 448 and the contents of the input buffer 383 (FIG. 11C) is a run having polarity "0" 438, then the result "00-00" 478 (512, FIG. 12B) is referenced. The "00-00" result has a state variable "01000" which signifies that the flag TAKE-N is set. When the TAKE-N bit is set, the GENERATE RESULTANT BIT STRING routine (FIG. 11A) instructs the canonical processor 25 (FIG. 11C) to take all of the bits in the input buffer 383 (FIG. 11C) and append them to the contents of the element buffer 385. The result is a run having a polarity "0" (512, 538, FIG. 12B). The run having polarity "0" resides in the element buffer 385 (FIG. 11C) until one or more bits can be later added to it to form an impulse.

If the contents of the element buffer 385 (FIG. 11C) is a run having polarity "0" 448 and the contents of the input buffer 383 (FIG. 11C) is an impulse having polarity "0" 434, then the result is "00-01" 458 (514, FIG. 12B). The state variable for result "00-01" is "01000" (514, 534, FIG. 12(B)). This state variable is the same as state variable for result "00-00", except an impulse in the input buffer 383 (FIG. 11C) is combined with a run in the element buffer 385 (FIG. 11C) to form another impulse having polarity "0" (514, 538, FIG. 12B).

When the contents of the element buffer 385 (FIG. 11C) is a run having polarity "0" 448 and the contents of the input buffer 383 (FIG. 11C) is an impulse having polarity "1" 436, or a run having polarity "1" 440, the "00-1X" result 468, 488 (516, FIG. 12B) is referenced. Result "00-1X" has state variable "10110" (516, 534, FIG. 12B), which means the TAKE-1 bit, PUT-STAT BUFF bit and the SET-ELEM BUFF flags are set. The GENERATE RESULTANT BIT STRING routine (FIG. 11A) instructs the canonical processor 25 (FIG. 11C) to take a bit from the input buffer 383 (FIG. 11C) and append it to the contents of the element buffer 385 (FIG. 11C) to form an impulse out of the run having a polarity "0" (516, 538, FIG. 12B). The contents of the element buffer 385 (FIG. 11C) will be output to the static buffer 387 (FIG. 11C). Lastly, the contents of the input buffer 383 (FIG. 11C), having one less bit, will be placed into the element buffer 385 (FIG. 11C).

When the contents of the element buffer 385 (FIG. 11C) is a run having polarity "1" 450 and the contents of the input buffer 383 (FIG. 11C) is a impulse 434 or a run 438 having a polarity "0", the "11-0X" result at 460 and 480 (518, FIG. 12B) is referenced. The result "11-0X" has state variable "10110" (516, 534, FIG. 12B), which is the same as the state variable for result "00-1X". Thus, the same processing occurs; however, the static buffer 387 (FIG. 11C) contains an impulse having a polarity "1" instead of polarity "0" (518, 538, FIG. 12B).

If the contents of the element buffer 385 (FIG. 11C) is a run having a polarity "1" 450 and the contents of the input buffer 383 (FIG. 11C) is an impulse having polarity "1" 436, result "11-10" 470 (520, FIG. 12B) is referenced. Result "11-10" has a state variable "01000" (520, 534, FIG. 12B) which means that the TAKE-N flag is set. The GENERATE RESULTANT BIT STRING routine (FIG. 11A) instructs the canonical processor 25 (FIG. 11C) to take all "N" bits from the input buffer 383 (FIG. 11C) and append these bits to the end of the contents of the element buffer 385 (FIG. 11C). Effectively, an impulse having a polarity "1" (520, 538, FIG. 12B) is created.

If the contents of the element buffer 385 (FIG. 11C) is a run having polarity "1" 450 and the contents of the input buffer 383 (FIG. 11C) is a run having polarity "1" 440, result "11-11" 490 (524, FIG. 12B) is referenced by the second index table (FIG. 12A). The result "11-11" has a state variable "01000", which is the same state variable as for the result "11-10" (520, FIG. 12B). In other words, the same operation occurs; however, because there is a run having polarity "1" in the input buffer 383 (FIG. 11C) instead of an impulse having polarity "1", the result is a run having a polarity "1" (524, 538, FIG. 12B) instead of an impulse having polarity "1" (520, 538, FIG. 12B).

If the contents of the element buffer 385 (FIG. 11C) is a run having polarity "1" 450 and the contents of the input buffer is an "EBSA+EBSB" signal 442, then result "11-EBSA+EBSB" 500 (526, FIG. 12B) is referenced in the second index table (FIG. 12A). Result "11-EBSA+EBSB" has a state variable "10101" (526, 534, FIG. 12B) which means that the TAKE-1 flag is set, the PUT-STAT BUFF flag is set and the OUT-STAT BUFF flag is set. The GENERATE RESULTANT BIT STRING routine (FIG. 11A) instructs the canonical processor 25 to take a bit from the contents of the input buffer 383 (FIG. 11C) and append it to the contents of the element buffer 385 (FIG. 11C) to form an impulse having a polarity "1" (row 526, column 538, FIG. 12B). The impulse having polarity "1" is then placed into the static buffer 387, and the final resultant bit string in the static buffer 387 (FIG. 11C) is output to buffer memory 389.

When the contents of the element buffer 385 (FIG. 11C) is a run having polarity "0" 448, or when the element buffer 385 (FIG. 11C) is empty 452, and the contents of the input buffer 383 (FIG. 11C) is an "EBSA +EBSB" signal 442, result "PUT-EBSA+EBSB" at 498 and 502 (528, FIG. 12B) is referenced by the second index table (FIG. 12A). Result "PUT-EBSA+EBSB" has a state variable "00001" (528, 534, FIG. 12B) which means that the OUT-STAT BUFF flag is set. The canonical processor 25 will detect the set flag and output the contents of the static buffer 387 to buffer memory 389 (FIG. 11C). In other words, the canonical processor 25 (FIG. 11C) sees the element buffer 385 (FIG. 11C) as if it is an empty element buffer 385 (FIG. 11C), regardless of whether it contains a run of "0's". If the element buffer 385 (FIG. 11C) has a run of "0's", or if it is empty, and the contents of the input buffer 383 (FIG. 11C) is an "EBSA+EBSB" signal the static buffer 387 (FIG. 11C) contents can be output directly to buffer memory 389 (FIG. 11C).

If the contents of the element buffer 385 (FIG. 11C) is empty 452 and the contents of the input buffer 383 (FIG. 11C) is an impulse or a run at 434, 436, 438 and 440 respectively, the result SET-ELEM BUFF at 462, 472, 482 and 492 (530, FIG. 12B) is referenced by the second index table (FIG. 12A). The subroutine SET-ELEM BUFF has a state variable "00010" which means that the SET-ELEM BUFF flag is set. The canonical processor 25 (FIG. 11C) will detect the set flag and move the contents of the input buffer 383 (FIG. 11C) into the element buffer 385 (FIG. 11C). In other words, the contents of the element buffer 385 (FIG. 11C) is empty, so the contents of the input buffer 383 (FIG. 11C) can be directly input into the element buffer. This result typically occurs at the very beginning of a Boolean operation when the contents of the element buffer 385 (FIG. 11C) is still empty.

3) A Detailed Example of the Boolean AND Operation With Two Compressed Bit Strings Referring to FIGS. 1, 1A, 6, 7, 8A, 8B, 9A, 9B, 9C, 9D, 9E, 10, 11A, 11B, 11C, 12A, 12B, 13A, 13B, 14A and 14B, a detailed example is presented for processing a Boolean AND operation on two compressed bit strings. More particularly, assume that two bit strings, A and B, have been downloaded from external device 12 via bus 13 to computer platform 10. Here, the bit strings are encoded into the compressed impulse formats of FIGS. 2A, 2B, 2C, and 2D by encoder 14 as discussed earlier (FIGS. 3A, 3B, and 3C). The resulting compressed bit strings are stored in secondary memory 16 and stay there until a request for performing the AND operation is made. When requested, the two compressed bit strings (A and B) are loaded into buffer memory 18 where they wait to be processed by the BLU 20. The compressed bit strings (A and B) are shown in FIG. 13 at 531 and 538. For ease of understanding, the impulses have been separately described rather than depicted in their actual encoded formats. However, the impulses are assumed to be in their compressed formats (FIGS. 2A, 2B, 2C, and 2D). For example, impulse 332 has a polarity (P) of "0" and a length (L/B) of 12 and would normally be represented in a one-pack (FIG. 2A).

When the BLU 20 is ready for processing, the system coordinator (31, FIG. 1A) brings the compressed bit strings A 531 and B 538 via bus 19 to the BLU 20. Here the AND Boolean operation is performed on bit strings A and B and intermediate resultant bit strings are generated and sent to the canonical processor 25 via bus 21. When the Boolean operation has finished processing the impulses in either bit string, canonical processor 25 outputs a resultant bit string to buffer memory 18 via bus 23. Here the compressed resultant bit string resides until it is sent via bus 27 to secondary memory 16 or until it is sent via bus 19 to BLU 20 for further processing.

FIGS. 14A and 14B are detailed results tables of results of the various steps performed by system coordinator 31 (FIG. 1A) via the PROCESS BOOLEAN OPERATION Routine (FIG. 6) on the bit strings 531 and 538. Each row of FIGS. 14A and 14B is equivalent to processing an element (impulse or run) of bit string A with an element (impulse or run) of bit string B. Each row of FIGS. 14A and 14B is separated into 13 subparts which correspond to the 13 different columns of the results table. Specifically, the length of impulse A' 560, the length of impulse B' 562, the length of the intermediate resultant bit string 564, the polarity of impulse A' 566, the polarity of impulse B' 568, whether the intermediate bit string is a run or impulse 570, the polarity of the intermediate bit string 572, the contents of the element buffer 574, the contents of the input buffer 576, the result of the second index table 578, reduction of impulse A' 580, reduction of impulse B' 582, and whether an EBSA or EBSB condition exists; are all depicted as column headers in the results tables (FIGS. 14A and 14B).

Once the compressed bit strings A 531 (FIG. 13A) and B 538 (FIG. 13A) are loaded into the BLU 20 (FIG. 1A), the system coordinator 31 (FIG. 1A) commences processing in the PROCESS BOOLEAN OPERATION routine (FIG. 6) in block 222. In block 222 the first impulse A' 532 is obtained from bit string A (531, FIG. 13A) and in block 224 the first impulse B' 539 is obtained form bit string B (538, FIG. 13A). The length of impulse A' is 12 bits (row 540, column 560, FIG. 14A) and the length of impulse B' is 20 bits (540, 562, FIG. 14A). In block 226 the minimum bit length of impulse A' and B' is determined to be 12 bits (540, 564, FIG. 14). The 12 bit length is the length of the intermediate resultant bit string. In block 228, the length of impulse A' is determined to be less than impulse B' and in block 230 the Boolean hardware (FIG. 7) or the Boolean second embodiment (FIG. 10) embodiments are initiated to determine the type (run or impulse) and polarity of the intermediate bit string.

Referring to the hardware embodiment (FIG. 7) of the BLU 20 (FIG. 7) functions F1 256 and F2 258, are performed because impulses A' and B' are unequal in length (e.g., A' is 12 bits and B' is 20 bits). In actuality, function F3 262, is processed simultaneously, however, function F5 263, only chooses outputs from function F2 258 when the bit length of A' 532 (FIG. 13A) and B' 539 (FIG. 13A) are unequal. Function F1 determines that impulse B' 539 (FIG. 13A) is the longer impulse and thus, the polarity of impulse B' ("0") is chosen by function F1 (FIG. 9A). When the impulses A' 532 (FIG. 13A) and B' 539 (FIG. 13A) have a polarity "0" and the length of impulse A' 532 (FIG. 13A) is less than the length of impulse B' 539 (FIG. 13A), the output of F1 is "0" or the polarity of the longer impulse B' 539 (FIG. 13A). Function F2 then determines the type (run or impulse) of the intermediate bit string. Referring to FIG. 9B, when the Boolean operation is an AND and the result of F1 is "0", the output of F2 is "0", which means that the intermediate resultant bit string is a run. When F1 and F2 are processing, F4 simultaneously determines the polarity of the intermediate bit string by performing the Boolean operation AND on the polarities of impulse A' 532 (FIG. 13A) and impulse B' 539 (FIG. 13A). Referring to FIG. 9C, the ANDing of a polarity of "0" and a polarity of "0" results in a polarity of "0". Thus, the intermediate bit string, as output by function F5, is a run (540, 570, FIG. 14A) having a polarity of "0" (540, 572, FIG. 14B).

The same intermediate bit string determination occurs when the Boolean embodiment (FIG. 10) performs the AND operation. Specifically, the first subtable 310 for the AND operation is referenced. Impulse A' 532 (FIG. 13A) is an impulse having polarity "0" or "A'01" at 327, and impulse B' 539 (FIG. 13A) is an impulse having polarity "0" or "B'01" at 317. The length of A'01 is less than B'01, corresponding to the less than symbol (<) at 322. The output referenced by the subtable 310 shows the results of "00" signal, meaning that the intermediate bit string is a run having a polarity "0", which is the same result determined by the Boolean hardware embodiment (FIG. 7) discussed above.

When processing is completed by the BLU 20, the canonical processor 25 (FIG. 11C) is called by the system coordinator in block 232 of FIG. 6. Specifically in block 384 of the GENERATE RESULTANT BIT STRING routine (FIG. 11A) the intermediate bit string calculated by the BLU 20 (FIG. 1A) is placed into the input buffer 383 (FIG. 11C) of the canonical processor 25 (FIGS. 1A and 11C). The input buffer 383 (FIG. 11C) inputs a run of "0's" (540, 576, FIG. 14B), and the element buffer 385 (FIG. 11C) is empty (540, 574, FIG. 14B). Block 386 (FIG. 11A) is entered to have the canonical processor 25 (FIG. 11C) obtain the navigation vector, as referenced by the second index table (FIG. 12A), which is associated with a run of "0's" in the input buffer (438, FIG. 12A) and an empty element buffer (452, FIG. 12A). The referenced result is SET-ELEM BUFF (482, FIG. 12A) having state variable "00010" (530, 534, FIG. 12B). In decision block 388 (FIG. 11A), the flag bit, TAKE 1, in the state variable, is determined not to be set and in decision block 396 (FIG. 11A) the TAKE N bit is determined also not to be set. Processing continues at decision block 402 (FIG. 11A) which also determines that the PUT-STAT BUFF flag is not set. In block 406 (FIG. 11A) the SET-ELEM BUFF bit is determined to be set. Thus, block 408 (FIG. 11A) is entered to replace the element buffer 385 (FIG. 11C) contents with the contents of the input buffer 383 (FIG. 11C). In decision block 410 (FIG. 11A) the OUT-STET BUFF flag is determined not to be set, so processing returns in block 416 (FIG. 11A) to decision block 234 of the PROCESS BOOLEAN OPERATION routine (FIG. 6).

In block 234 (FIG. 11A) an end-of-bit-string condition is determined not to exist for either bit string A or bit string B, and processing continues in block 235, which reduces the length of impulse A' and the length of impulse B' by the minimum length in bits calculated at block 226 (FIG. 6). In decision block 240 the length for impulse A' has been reduced to zero bits and, in block 242 the next impulse, impulse 533 of FIG. 13A is obtained from bit string A. In block 224 the length for impulse B' 539 (FIG. 13A) is determined not to be reduced to zero bits; it was reduced to 8 bits (540, 582, FIG. 14B) specifically. Impulse B'539 (FIG. 13A) was 20 bits long and it was reduced by 12 bits, leaving only eight bits. Decision block 248 is entered and an end-of-bit-string condition does not exist in either bit string A or bit string B after the reduction of the minimum length from both A' and B' (540, 584, FIG. 14B). Processing returns to block 226 wherein the minimum length of either the new impulse A' 533 (FIG. 13A) or impulse B' 539 (FIG. 13A) is determined. Impulse A' 533 (FIG. 13A) is ten bits long (542, 560, FIG. 14A) and impulse B' 539 (FIG. 13A), which was reduced by the minimum length, 12 bits, is eight bits long (542, 562, FIG. 14A). The minimum length is eight, which is also the length of the next intermediate bit string (542, 564, FIG. 14A). Block 228 of FIG. 6 is then entered and determines that the length of impulse A' 533 is greater than impulse B' 539 and in block 230 the characteristics (e.g., type and polarity) of the intermediate bit string is determined by performing either the BLU 20 (FIG. A) hardware embodiment or the software embodiment.

Referring to FIG. 7, the hardware embodiment of the BLU 20 (FIG. 1A) of bit strings A and B are unequal in length so functions F1 256 and F2 258 are performed concurrently with function F4 264, to determine the type (run or impulse) and polarity of the intermediate bit string. Because the polarity of A' 533 (FIG. 13A) is "1" (542, 566, FIG. 14A) and the polarity of B' 539 (FIG. 13A) is "0" (542, 568, FIG. 14A), and because the length of A' is greater than the length of B', according to FIG. 9A, the result of F1 is "1". As determined by F1, the polarity of the longer impulse, A' 533 (FIG. 13A), is "1". The F1 result is input into F2 which outputs a "1" corresponding to the AND (FIG. 9B), which means that the intermediate bit string is an impulse (542, 570, FIG. 14A). The polarity, as determined by function F4 264, is the result of the Boolean AND operation with A's polarity, "1", and B's polarity, "0", resulting in a polarity of "0" (FIG. 9C and 542, 572, FIG. 14B). Referring to FIG. 10, the equivalent of the Boolean operation is referenced at sub-table 310, corresponding to the AND operation. Impulse A' 533 (FIG. 13A) has a polarity of "1" or "A'10" at 328, and Impulse B' has a polarity "0" or "B'01" at 317. A'10 is greater in length than B'01 corresponding to the greater than symbol (>) at 322. The result indexed by the subtable 310 is a "01" at 324, which corresponds to an impulse having polarity "0", the same result determined by the hardware.

The intermediate bit string as determined by the BLU hardware and software embodiments, is input into the canonical processor via the GENERATE RESULTANT BIT STRING routine (FIG. 11A) in block 232 of FIG. 6. In block 384 the GENERATE RESULTANT BIT STRING routine (FIG. 11A) places the intermediate bit string result of the AND operation into the input buffer 383 (FIG. 11C), which is currently empty. In block 386 the second index table (FIG. 12A) is referenced to determine the result for canonically processing the contents of the element buffer 385 (FIG. 11C) and the contents input buffer 385 (FIG 11C). The element buffer 385 (FIG. 11C) currently contains a run having polarity "0" (542, 574, FIG. 14B), and the contents of the input buffer 383 (FIG. 11C) is an impulse having polarity "0" (542, 576, FIG. 14B). The result, "00-01", (458, FIG. 12A), referenced by the second index table (FIG. 12A) has a state variable "01000" (514, 532, FIG. 12B). The state variable has a bit set which corresponds to the TAKE N flag. Thus, in decision block 388 the Take 1 bit is determined not to be set and in decision block 396 the Take N bit is determined to be set. Processing continues in block 398, wherein the canonical processor takes the eight bits in the input buffer 383 (FIG. 11C) and appends these bits to the 12-bit contents of the element buffer 385 (FIG. 11C). Essentially, this process produces an impulse having a polarity of "0". In block 400 the length corresponding to the contents of the input buffer 383 (FIG. 11C) is added to the length corresponding to the contents of the element buffer 385 (FIG. 11C). Decision blocks 402, 406 and 410 are entered wherein the canonical processor 25 (FIG. 11C) determines that flags PUT-STAT BUFF, SET-ELEM BUFF and OUT-STAT BUFF are not set and processing returns to the PROCESS BOOLEAN OPERATION routine (FIG. 6) in decision block 234.

In block 234 an end-of-bit-string condition is determined not to exist in either bit string A or bit string B and thus, processing continues at block 235 to reduce the length of impulse A' 533 (FIG. 13A) and B' 539 (FIG. 13B) by the minimum length (8) as earlier determined in block 226. In block 240 the canonical processor 25 (FIG. 11C) reduces impulse A', having a length of ten bits, by the minimum length, eight bits, results in a two bit impulse. In block 244 the canonical processor 25 (FIG. 11C) determines that impulse B', which is eight bits in length, is reduced to zero and in block 246, the next impulse 541 (FIG. 13A) of bit string B 538 (FIG. 13A) is obtained. In decision block 248, an end-of-bit-string condition is determined not to exist in either bit string A or bit string B (542, 584, FIG. 14B). Processing continues in block 226 to determine the new length of the next intermediate bit string.

In block 226, the minimum length of impulses A' 533 (FIG. 13A) and impulse B' 541 (FIG. 13A) are determined. Impulse A' 533 (FIG. 13A) was reduced to an impulse having a length two bits (544, 560, FIG. 14A) and the next impulse B' 541 (FIG. 13A) is also two bits in length (544, 562, FIG. 14A). Thus, the minimum length and the length of the intermediate bit string is two bits (544, 564, FIG. 14A). In block 228, impulse A' is determined to be equal to impulse B' and block 230 is called to perform the AND operation by the Boolean hardware embodiment or the BLU second embodiment.

Referring to the BLU hardware embodiment in FIG. 7, F3 262 performs the Boolean operation because impulses A' 533 (FIG. 13A) and B' 541 (FIG. 13A) impulses are equal in length. The polarity of impulse A' is "1" (544, 566, FIG. 14A) and the polarity of impulse B' is also "1" (544, 568, FIG. 14A), and thus, according to the truth table (FIG. 9D), the result of F3 262 is a "1" which corresponds to an impulse (544, 570, FIG. 14A). Thus, the intermediate bit string is an impulse and the polarity is determined in parallel by function F4 264 (FIG. 7). Function F4 performs the AND operation on the polarities of A' and B' and results in a "1", which corresponds to a polarity "1". Therefore, the intermediate bit string calculated by the BLU hardware embodiment (FIG. 7) is an impulse having polarity "1". Likewise, the BLU second embodiment calculates the same results. Specifically, A' 533 (FIG. 13A) is an impulse having polarity "1" or "A'10" at 328, and impulse B' 541 is an impulse having polarity "1" or "B'10" (FIG. 13A) is an impulse having polarity "1" or "B'10" 321. A'10 and B'10 are equal in length, and thus, the result calculated at 326 is an impulse having a polarity of "1", or as shown in the table "10" (310, FIG. 10).

The characteristics (type and polarity) of the intermediate bit string, calculated by the BLU 20 (FIG. IA) in block 230 of FIG. 6, are input to the GENERATE RESULTANT BIT STRING routine (FIG. 11A) at block 232 of FIG. 6. In block 384 of FIG. 11A, the intermediate bit string, an impulse having polarity "1" (544, 576, FIG. 14) is placed into the input buffer 383 (FIG. 11C). In block 386, the second index table (FIG. 12A), is referenced to determine the state variable which shows how to canonically process the contents of the input buffer 383 (FIG. 11C) and element buffer 385 (FIG. 11C). Presently, the contents of the element buffer is an impulse having a polarity "0" (444, FIG. 12A) and as stated, the contents of the input buffer is an impulse having a polarity of "1" (436, FIG. 12A). The result referenced is "01-XX" having state variable "00110" (464, FIG. 12A). Processing continues in block 388, in which the canonical processor determines that the TAKE 1 flag is not set and in block 396 the TAKE N flag is determined also not to be set. In block 402 the PUT-STAT BUFF flag is determined to be set, and thus, block 404 is entered to output the impulse having polarity "0" in the element buffer 385 (FIG. 11C) to the static buffer 387 FIG. 11C). Additionally, decision block 406 is entered and the canonical processor 25 (FIG. 11C) determines that the SET-ELEM BUFF flag is set and in block 408 canonical processor 25 replaces the contents of the element buffer 385 (FIG. 11C) with the contents of the input buffer (383, FIG. 11C)—which is an impulse of "1"s. In block 410 the OUT-STAT BUFF flag is determined not to be set, and in block 416, processing returns to block 234 of the PROCESS BOOLEAN OPERATION routine (FIG. 6).

In block 234 of FIG. 6, the end-of-bit-string conditions are checked and neither bit string A nor bit string B has reached an end-of-bit-string condition. In block 235 the length of impulse A' 533 (FIG. 13A) and impulse B' 541 (FIG. 13A) are reduced by the minimum length (e.g., two bits). In block 240, the length for A' is determined to be zero and in block 242, the next impulse 534 (FIG. 13A) is obtained from bit string A, 531 (FIG. 13A). In block 244, the length of impulse B' 541 (FIG. 13A) is determined to be reduced to zero and block 246 obtains the next impulse 543 (FIG. 13A) from bit string B (538, FIG. 13A). In block 248, an end-of-bit-string condition is found not to exist in either bit string A or bit string B and processing continues in block 226, in which the minimum length of impulses A' 534 (FIG. 13A) and B' 543 (FIG. 13A) are determined. Impulse A' 534 (FIG. 13A) has a length of 7 bits (546, 560, FIG. 14A) and impulse B' 543 (FIG. 13A) has a length of 10 bits (546, 562, FIG. 14A). The minimum length of the intermediate bit string length is 7 bits (546, 564, FIG. 14A). In block 228, the length of impulse A' 534 (FIG. 13A) is less than impulse B' 543 (FIG. 13A) and block 230 is called to process the hardware or software BLU embodiments (FIG. 7 and FIG. 10).

Referring to the hardware embodiment of the BLU in FIG. 7, because the impulses A' 534 (FIG. 13A) and B' 543 (FIG. 13A) are unequal in length, the functions F1 256 and F2 258, are performed to determine the type (run or impulse) of the intermediate resultant bit string. In parallel, function F4 264 determines the polarity of the intermediate bit string. Referring to FIG. 9A, the function F1 results in a "1" because the polarity of impulse A' is "0" and the polarity of impulse B' is "1". Essentially, the F1 result stands for the polarity of the longer impulse, B'. The result of F1 is then loaded into function F2 258, which determines that the intermediate result is an impulse. Referring to FIG. 9B, when the result of function F1 is a "1" and the Boolean is AND, the result of F2 is a "1", which corresponds to an impulse. Referring to FIG. 9C, the result of function F4 264, is calculated by performing the Boolean AND operation on the polarities of impulses A' 534 (FIG. 13A) and B' 543 (FIG. 13A), which are "0" and "1", respectively. The result is "0", which corresponds to a polarity of "0" (546, 572, FIG. 14B). The embodiment of the BLU 20 (FIG. 11C) also determines the same intermediate bit string; an impulse having a polarity "0". More particularly, impulse A' 534 (FIG. 13A) is "A'01" at 327 and B' 543 (FIG. 13A) is "B'10" at 321. The length of impulse A' 534 (FIG. 13A) is less than the length of impulse B' 541 (FIG. 13A), and thus, the less than sign (<) at 323 is referenced and the result at 326 is "01" corresponding to an impulse having a polarity of "0".

The intermediate bit string determined by BLU 20 (FIG. 13A) in block 230 (FIG. 6) is then input into the canonical processor 25 (FIG. 11C) via the GENERATE RESULTANT BIT STRING routine (FIG. 11A) at block 232 of FIG. 6. In block 384 (FIG. 11A), the intermediate bit string (e.g. an impulse having polarity "0") is placed into the input buffer 383 (FIG. 11C). Block 386 is entered to reference the result of the second index table, to obtain the state variable (FIG. 12A). Specifically, the element buffer index is an impulse having a polarity of "1", "10" at 446, and the index for the input buffer 383 (FIG. 11C) is an impulse having polarity "0", "01" at 434. The result referenced by the second index table is "10-XX" which has state variable "00110" at 456 (FIG. 12A). The purpose of the "10-XX" routine is to have the canonical processor 25 (FIG. 11C) move the intermediate bit string from the element buffer 385 (FIG. 11C) to the static buffer 387 (FIG. 11C) and to move the intermediate bit string residing in the input buffer 385 (FIG. 11C) into the element buffer 385 (FIG. 11C). In decision block 388 (FIG. 11A), the TAKE 1 flag is determined not to be set and in block 396, the TAKE N flag is also determined not to be set. In decision block 402, the PUT-STAT BUFF flag is determined to be set and in block 440, the contents of the element buffer (e.g., an impulse having polarity "1") is output to the static buffer (387, FIG. 11C). Additionally, in decision block 406, the SET-ELEM BUFF flag is determined to be set and block 408 replaces the content of the element buffer 385, (FIG. 11C) with the contents of the input buffer 383 (FIG. 11C) (e.g., an impulse having a polarity of "0"). In block 410, the OUT-STAT BUFF is determined not to be set and processing returns to the PROCESS BOOLEAN OPERATION routine (FIG. 6) in block 234.

Processing returns to decision block 234 of FIG. 6 in which an end-of-bit-string condition is found not to exist in bit string A and B, and in block 235, the length of A' 534 (FIG. 13A) and B' 543 (FIG. 13A) are reduced by the minimum length calculated in block 226. In decision block 240, the length of A' is determined to be equal to zero, and thus, in block 242, the next impulse A' 535 (FIG. 13A) is obtained from bit string A 531 (FIG. 13A). In block 244, the length of impulse B' 543 is determined not to be reduced to zero; it has been reduced to three bits, and in decision block 248 an end-of-bit-string condition is determined not to exist in either bit string A or bit string B.

Block 226 is entered and calculates the minimum length A' 535 (FIG. 13A) and B' 543 (FIG. three bits. The minimum length is also the length of the intermediate resultant bit string (548, 564, FIG. 4A). In block 228, the length of impulse B' 543 (FIG. 13A) is less than impulse A' 535 (FIG. 13A) and block 230 is entered to process the BLU hardware or software embodiments.

The BLU hardware embodiment of FIG. 7, performs functions F1 256, and F2 258, to determine the type (run or impulse) of the intermediate bit string. Function F4 264 is processed in parallel to determine the polarity of the intermediate bit string. Referring to FIG. 9A, function F1 determines that the polarity of the longer impulse A' to be "1". Referring to FIG. 9B, the Boolean operation is AND and the result of F1 is a "1", thus, the output F2 is "1", which corresponds to an impulse. The intermediate bit string is an impulse (548, 570, FIG. 14A) having a polarity "1" (548, 572, FIG. 14B). Likewise, the second BLU embodiment performed by the first index table of FIG. 10 calculates the same results. Specifically, A' 535 (FIG. 13A) is an impulse having polarity "1" or "A'10" at 328, and impulse B' 543 (FIG. 13A) is an impulse having polarity "1" or "B'10" at 321. "A'10" is greater than "B'10" in length, and thus, the result calculated at 326 is an impulse having a polarity of "1" or, as shown in the table, "10" (310, FIG. 10).

Returning to FIG. 6, the intermediate bit string result of block 230 is sent to the canonical processor 25 (FIG.

11C) via GENERATE RESULTANT BIT STRING routine (FIG. 11A) in block 232 of FIG. 6. In block 384 (FIG. 11A), the intermediate bit string result is placed into the input buffer 383 (FIG. 11C) (e.g. an impulse having a polarity of "1" (548, 576, FIG. 14B)). The contents of the element buffer 585 (FIG. 11C) is an impulse having polarity of "0" (548, 574, FIG. 14B). In block 386, the second index table (FIG. 12A) is referenced to determine the state variable to be analyzed by the canonical processor 25 (FIG. 11C) GENERATE RESULTANT BIT STRING routine (FIG. 11A). The element buffer 385 (FIG. 11C) contains an impulse having polarity "0" 444 (FIG. 12A) and the input buffer 383 (FIG. 11C) contains an impulse having polarity "1" 436 (FIG. 12A). Thus, the result "01-XX", having state variable of "00110", at 464 (FIG. 12A) is referenced. In decision blocks 388, 396, 402, 406 and 410 (FIG. 11A) the canonical processor evaluates the state variable and determines that the PUT-STAT BUFF flag is set and that the SET-ELEM BUFF flag is also set. In block 404 the contents of the element buffer (385, FIG. 11C) are output to the static buffer 387 (FIG. 11C) and in block 408, the contents of the element buffer (385, FIG. 11C) is replaced with the contents of the input buffer (383, FIG. 11C) (e.g. an impulse having a polarity "1" (548, 578, FIG. 14B)). Processing continues to the PROCESS BOOLEAN OPERATION routine (FIG. 6) in block 234.

Block 234 determines that an end-of-bit-string condition does not exist in bit string A or bit string B, and block 235 reduces impulse A' 535 (FIG. 13A) and calculated in block 226. In decision block 240, the length of bits of impulse A' 535 (FIG. 13A) is determined not to equal zero; length of bits for A' 535 (FIG. 13A) is 17 (584, 580, FIG. 14B). Block 244 determines that the length of bits of impulse B' 543 (FIG. 13A) is equal to zero (548, 582, FIG. 14B), and thus, in block 246, the next impulse B' 544 (FIG. 13A) is obtained from bit string B (538, FIG. 13A). In block 248, an end-of-bit-string condition is found not to exist in either bit string A or B (548, 584, FIG. 14B) and block 226 is entered to determine the minimum length of bits of impulse A' 535 (FIG. 13A) or impulse B' 544 (FIG. 13A). Both impulse A' 535 (FIG. 13A) and B' 544 (FIG. 13A) have lengths of 17 bits (550, 560, FIG. 14A and 550, 562, FIG. 14A), and thus, the minimum length of both A' 535 (FIG. 13A) and B' 544 (FIG. 13A) is 17 bits. The length of the intermediate bit string is also 17 bits (550, 564, FIG. 14A). In block 228 impulse A' 535 (FIG. 13A) is determined to be equal in length to impulse B' 544 (FIG. 13A) and block 230 is entered to process the BLU hardware or the BLU software embodiments.

The BLU hardware embodiment (FIG. 7) processes the impulses A' 535 (FIG. 13A) and B' 544 (FIG. 13A) via function F3 262, and function F4, 264, to determine the type (run or impulse) and the polarity of the intermediate bit string. Function F3 262, referring to FIG. 9D, outputs "1" because the polarity of A' is "1" (550, 566, FIG. 14A) and the polarity of B' is "0" (550, 568, FIG. 14A), and the Boolean operation is AND. The "1" output of function F3 262, means that the type of the intermediate bit string is a run. Function F4 264 determines that the polarity of the intermediate bit string is "0". Specifically, when polarities of impulses A' ("1") and B' ("0") are ANDed, the result is "0", as shown in FIG. 9C.

The BLU embodiment (FIG. 10) for performing the Boolean AND operation also results in a run having polarity "0". Specifically, referring to sub-table 310 for the AND operation, impulse A' 535 (FIG. 13A) is an "A'10" 328 and impulse B' 544 (FIG. 13A) is a "B'01"317. Impulses A' 535 (FIG. 13A) and B' 544 (FIG. 13A) are of equal length which corresponds to the equal sign (=) at 322, and thus, the result of sub-table 310 is a run having polarity "0" at 324. Returning to FIG. 6, the result of the BLU hardware embodiment (FIG. 7) or the BLU software embodiment (FIG. 10) is output in block 230 to the canonical processor 25 (FIG. 11C) via the GENERATE RESULTANT BIT STRING routine (FIG. 11A) in block 232 FIG. 6).

Referring to FIG. 11A, in block 384, the intermediate bit string result (e.g. a run having a polarity of "0") is placed into the input buffer 383 (FIG. 11C) and in block 386, the second index table is referenced to determine the state variable for processing the contents of the input and element buffers (383, 385 FIG. 11C).

The element buffer 385 (FIG. 13A) contains an impulse having polarity "1" at 446 and the input buffer 383 (FIG. 13A) contains a run having polarity "0" at 438. The result referenced by the second index table is "10-XX", having state variable "00110" at 476. In blocks 388, 396, 402, 406 and 410, the canonical processor 25 (FIG. 11C) determines that the PUT-STAT BUFF flag is set and the SET-ELEM BUFF flag is also set. In block 404, the contents of the element buffer 385 (FIG. 11C) is output to the static buffer 387 (FIG. 11C) and in block 408 the contents of the element buffer 385 (FIG. 11C) is replaced with the contents of the input buffer 383 (FIG. 11C). Processing returns to the PROCESS BOOLEAN OPERATION routine (FIG. 6) in block 234.

In block 234, bit strings A and B are determined not to have end-of-bit-string conditions, and in block 235, the length of impulses A' and B' is reduced by the minimum length calculated in block 226. In decision block 240, the length of bits for A' 535 (FIG. 13A) is determined to be reduced to zero bits (550, 580, FIG. 14B), and thus, in block 242, the next impulse 536 (FIG. 13A) from bit string A 531 (FIG. 13A) is obtained. In decision block 244, the length of bits for impulse B' 544 (FIG. 13A) is determined to be reduced to zero and in block 246 the next impulse 545 (FIG. 13A) of bit string B 538 (FIG. 13A) is obtained. In block 248, an end-of-bit-string condition is determined not to exist in either bit strings A or B (550, 584, FIG. 14) and processing continues in block 226 (FIG. 6).

In block 226, the minimum length of impulse A' 536 (FIG. 13A) or B' 545 (FIG. 13A) is found to be 15 bits. The minimum length is also the length of the intermediate bit string, and thus, the length of the intermediate bit string is 15 bits (552, 564, FIG. 14A). In block 228, the length of bits for impulse A' 536 (FIG. 13A) is determined to be equal to the length of bits for impulse B' 545 (FIG. 13A); they both have 15 bits. In block 230 the BLU hardware or the BLU software embodiments determine the type (run or impulse) and polarity of the intermediate bit string.

Referring to the BLU hardware embodiment of FIG. 7, function F3 262 determines type and F4 function 264 determines polarity of the intermediate bit string. Referring to FIG. 9D, when the polarity of A' 536 (FIG. 13A) is "1" (552, 566, FIG. 14A) and the polarity of impulse B' 545 (FIG. 13A) is "1" (552, 568, FIG. 14A) and the operation is AND, the output is a "0". Output "0" corresponds to an impulse. Function F4 determines that the polarity of the intermediate bit string is a "1";

ANDing A's polarity "1" with B's polarity "1" results in a polarity of "1" as shown in FIG. 9C. Referring to FIG. 10, the BLU software embodiment also determines that the resultant intermediate bit string is an impulse having polarity "1". Specifically, subtable 310, corresponding to the AND operation, references an "A'10" at 328 and "B'10" at 321, where A'10 and B'10 are of equal length. Thus, the output of subtable 310 is a "10" or an impulse having polarity "1" 326. Referring back to block 230 of FIG. 6, the intermediate bit string determined by the BLU hardware or the BLU software embodiments is output from block 230 to block 232, where the canonical processor 25 (FIG. 11C) processes the intermediate bit strings.

In block 384 of FIG. 11A, the intermediate bit string determined by block 230 is placed into the input buffer 383 (FIG. 11C). The new contents of the input buffer 383 (FIG. 11C) is an impulse having polarity "1" (552, 576, FIG. 14B), and the contents of the element buffer 385 (FIG. 11C) is a run having polarity "0" (552, 574, FIG. 14B). In block 386, the state variable for processing the contents of the input and element buffers (383 and 385 of FIG. 11C) is determined by referencing the second index table (FIG. 12A). The element buffer 385, (FIG 11C) contains a run having polarity "0" 448 and the input buffer 383 (FIG. 11C) contains an impulse having polarity "1" 436. Result "00-1X" having state variable "10110" at 468 is referenced. In decision blocks 388, 396, 402, 406 and 410 of FIG. 11A, the canonical processor 25 (FIG. 11C) determines that the TAKE 1 flag, the PUT-STAT BUFF flag and the SET-ELEM BUFF flag are set. Specifically, in decision block 388, the TAKE 1 bit is found to be set, and thus, in block 390, one bit from the impulse having polarity "1" is taken from the input buffer 383 (FIG. 11C) and appended to the contents of the element buffer 385 (FIG. 11C) (552, 578, FIG. 14B). This step basically transforms a run of polarity "0", in the element buffer 385 (FIG. 11C), into an impulse having polarity "0". In block 92, the length indicator of the contents in the element buffer 385 (FIG. 11C) is incremented by one and in block 94 the length indicator for the contents of the input buffer is reduced by one. In block 396, the TAKE N flag is determined not to be set, and in block 402 the PUT-STAT BUFF flag is determined to be set. Block 404 is entered to output the contents of the element buffer to the static buffer (552, 578, FIG. 14B). The impulse of "0"s now of length 18 bits. In block 406, the SET-ELEM BUFF flag is determined to be set and in block 408 the contents of the element buffer 385 (FIG. 11C) is replaced with the contents of the input buffer 383 (FIG. 11C). The impulse of "1's now of length 14 bits. In block 410 the OUT-STAT BUFF flag is determined not to be set and block 416 is entered to return processing to the PROCESS BOOLEAN OPERATION routine (FIG. 6).

During block 234 of the PROCESS BOOLEAN OPERATION (FIG. 6), an end-of-bit-string condition is found not to exist in the A bit string or the B bit string, and in block 235, A' impulse and B' impulse are reduced by the minimum length of bits determined in block 226. During decision block 240, the length for the A' impulse is reduced to zero (552, 580, FIG. 14B), and during block 242 the next impulse 537 (FIG. 13A) from the bit string A 531 (FIG. 13A) is obtained. During decision block 244, the length for impulse B' is determined to be reduced to zero (552, 582, FIG. 14B), and block 246 obtains the next impulse 547 (FIG. 13A) from bit string B 538 (FIG. 13A).

In decision block 248 of FIG. 6, an end-of-bit-string condition is determined to exist in bit string A. The last group of bits 537 (FIG. 13A) acquired from bit string A 531 (FIG. 13A) is an extended element format for depicting an end-of-bit-string condition in bit string A (FIG. 2D). Thus, block 231 returns processing to block 230 to perform the hardware or software BLU embodiments to determine the type and polarity of the intermediate bit string.

Referring to FIG. 7, the BLU hardware embodiment performs the F6 function 265 for determining how to process an end-of-bit-string condition. Specifically, referring to FIG. 9E, when an end-of-bit-string condition exists in bit string A and the Boolean operation is AND, the hardware configuration outputs a "EBSA+EBSB" signal to signify that an end-of-bit-string condition exists in both bit string A and bit string B independent of the information remaining in B. The BLU embodiment (FIG. 10) also outputs an "EBSA+EBSB" signal to signify an end-of-bit-string condition in both bit string A and bit string B. Specifically, the end-of-bit-string condition for bit string A is indexed at 332 of the first index table (FIG. 10). Bit string B contains an impulse having polarity "0" or "B'01" at 317 (FIG. 10). The result determined is an "EBSA+EBSB" signal at 327. Returning to FIG. 6, the "EBSA+EBSB" signal is output from block 230 to the canonical processor 25 (FIG. 11C) via the GENERATE RESULTANT BIT STRING routine (FIG. 11A) at block 232. In block 384 of FIG. 11A, the "EBSA+EBSB" signal is placed into the input buffer 383 (FIG. 11C). In block 386, the canonical processor 25 (FIG. 11C) references the second index table (FIG. 12A) to determine the state variable which instructs the remaining portion of the canonical processor 25 (FIG. 11C) how to process the end-of-bit-string condition. The element buffer 385 (FIG. 11C) contains an impulse having polarity "1" at 446 (FIG. 12A). The input buffer 383 (FIG. 11C) is an "EBSA+EBSB" signal at 442. Thus, the result referenced by the second index table is "10-EBSA+EBSB" at 496 (FIG. 12A). "10-EBSA+EBSB" has state variable "00101". In decision blocks 388, 396, 402, 406, 410 of FIG. 11A the canonical processor evaluates the state variable obtained from the second index table (FIG. 12A) and determines that the PUT-STAT BUFF flag and the OUT-STAT BUFF flag are set 510 (FIG. 12B). More particularly, in decision block 388 the TAKE 1 flag is determined not to be set and in block 396 the TAKE N flag is also determined not to be set. In block 402 the PUT-STAT BUFF flag is determined to be set and in block 404, the contents of the element buffer (385, FIG. 11C) (e.g., an impulse having polarity "1") outputs to the static buffer (387, FIG. 11C). In decision block 406, the SET-ELEM BUFF flag is determined not to be set and in block 410, the OUT-STAT BUFF flag is determined to be set. In block 412, the contents of the static buffer 385 (FIG. 11C), a resultant compressed bit string, are output to buffer memory 389 (FIG. 11C) and in block 414 the canonical processor 25 (FIG. 11C) stops processing and exits program PROCESS BOOLEAN OPERATION (FIG. 6). The compressed resultant bit string generated by the GENERATE RESULTANT BIT STRING routine (FIG. 11C) is shown in FIG. 13(B). Each impulse output from the element buffer 385 (FIG. 11C) to the static buffer 387 (FIG. 11C) is separately depicted in FIG. 13B.

The invention has been described in an exemplary and preferred embodiment, but it is not limited thereto. Those skilled in the art will recognize a number of additional modifications and improvements which can be made to the invention without departure from its essential spirit and scope. For example, a number of different software and hardware embodiments and any number of different software languages and hardware configurations would be suitable for implementing the disclosed invention.

What is claimed is:

1. A method using a computer for converting a string of binary bits of indefinite length into compressed impulse format, said method comprising the steps of:

grouping the successive bits of said string into a corresponding sequence of one or more uncompressed impulses which together constitute substantially the entire bit string, each said one or more impulses comprising a run of one or more contiguous bits of said string having the same polarity followed by the next bit of said string having a polarity opposite from said same polarity of the associated impulse; and encoding each said one or more uncompressed impulses in sequence into a corresponding sequence of compressed impulse formats, one compressed format for each and every uncompressed impulse, said compressed impulse format comprising first and second binary bit coded indicators, said first indicator indicating the polarity of said one or more same polarity bits of the corresponding uncompressed impulse and said second indicator indicating the quantity of said same polarity bits grouped in the corresponding uncompressed impulse.

2. The method of claim 1 wherein the step of encoding comprises forming in said second indicator one or more binary words for representing extended length impulses.

3. The method of claim 1 wherein the step of encoding comprises forming said second indicator to indicate the quantity of the said same polarity bits with said next bit of opposite polarity.

4. The method of claim 1 wherein the step of encoding comprises the step of encoding one or more of said uncompressed impulses into a common compressed impulse format and comprising the step of forming in such common compressed impulse format an individual one of said first indicator for each of said one or more uncompressed impulses to be represented in such common compressed impulse format.

5. The method of claim 4 wherein the step of encoding comprises the step of forming in such common compressed impulse format an individual one of said second indicators for each of said one or more uncompressed impulses to be represented in such common compressed impulse format.

6. The method of claim 5 comprising the step of forming an indication in the common compressed impulse format of the number of said one or more impulses represented therein.

7. The method of claim 1 further comprising:

the step of determining the quantity of bits in the uncompressed impulses for one or more of said impulses; and the step of encoding including the steps of forming common format words having said compressed impulse format, and forming, in each of said common format words, a representation of said first and said second indicators for each of a variable number of said one or more uncompressed impulses, where such variable number varies depending on the quantity of bits determined.

8. The method of claim 7 wherein said common format words are of the same length for a plurality of different numbers of said uncompressed impulses represented therein.

9. The method of claim 7 comprising the step of forming in each said common word a format indicator which is an indication of the number of said one or more uncompressed impulses.

10. The method of claim 7 comprising the step of forming said common format words of the same length for different numbers of said one or more uncompressed impulses represented in the same common format word.

11. The method of claim 9 comprising the steps of setting an initial value in the format indicator for a first number of uncompressed impulses with a first impulse, and selectively modifying the initial format indicator at least one dependent on the quantity of bits determined for at least one further uncompressed impulse.

12. The method of claim 9 comprising the step of setting the format indicator in the common format word for a first number of uncompressed impulses in the common format word and then modifying the format indicator to represent a different number of impulses depending on the number of impulses represented in the common format word.

13. The method of claim 1 wherein the step of encoding comprises the step of encoding one or more of said uncompressed impulses into a common compressed impulse format and comprising the step of forming a polarity bit for each said one or more uncompressed impulses, each said polarity bit having a binary value corresponding to said one or more same polarity bits for each said one or more uncompressed impulses.

14. The method of claim 1 wherein said step for encoding said one or more impulses into said compressed impulse format further comprises the step of:

encoding said one or more uncompressed impulses into a first compressed impulse format when encoding an impulse having a length of bits of 2 to 31 bits, a second compressed impulse format when encoding an impulse having a length of bits of 32 to $2^{32}-1$ bits, a third compressed impulse format when encoding two impulses, each having a length of bits of 2 to 5 bits, or a fourth compressed impulse format when encoding three impulses, each having a length of bits of 2 or 3 bits.

15. The method of claim 14 wherein the step for encoding said first compressed impulse format further comprises the steps of:

forming a pair of bits for indicating said first format;

forming in said first indicator of said first format a polarity bit for indicating a binary value of said impulse; and forming in said second indicator of said first format five bits for indicating said length of bits of said impulse.

16. The method of claim 14 wherein the step for encoding said second format further comprises the steps of:

forming a pair of bits for indicating said second format;

forming in said first indicator of said second format a polarity bit for indicating a binary value of said impulse;
forming in said second indicator of said second format, one, two, three or four eight-bit words for indicating the length of said impulse; and
forming in said second indicator two bits for indicating whether one, two, three or four of said words are necessary for encoding said impulse.

17. The method of claim 14 wherein the step for encoding said third format further comprises the steps of:
forming a pair of bits for indicating said third format;
forming in said first indicator of said third format two polarity bits, said polarity bits indicating a binary value for each said impulse; and
forming in said second indicator of said third format a first and a second pair of bits indicating a corresponding length for each said uncompressed impulse.

18. The method of claim 17 further comprising the step of converting said third format into said first format, said first format for encoding an impulse, and said impulse having a length 2 to 5 bits, said step for converting said third format comprising the steps:
converting said pair of bits for indicating said third format, to indicate said first format;
whereby converting said third format into said first format.

19. The method of claim 18 further comprising the steps of:
placing a pair of zero's into said second pair of bits of said second indicator of said third format; and
placing a zero in said second polarity bit of said first indicator of said third format.

20. The method of claim 14 wherein the step for encoding said fourth format further comprises the steps of:
forming in said fourth format a pair of bits for indicating said fourth format;
forming in said first indicator of said fourth format three polarity bits said for indicating a polarity for each said impulse; and
forming in said second indicator of said fourth format a first, a second, and a third bit, said first, said second and said third bits for indicating a corresponding length for each said impulse.

21. The method of claim 20 further comprising the step for converting said fourth format into said third format, said third format for encoding a first and a second impulse, and said first and said second impulses having a length of 2 or 3 bits, said step for converting said fourth format comprising the steps:
converting said pair of bits, for indicating said fourth format, to indicate said third format;
whereby converting said fourth format into said third format.

22. The method of claim 21 further comprising the steps of:
placing a zero in said third bit of said second indicator of said fourth format; and
placing a zero in said third polarity bit of said first indicator of said fourth format.

23. The method of claim 20 further comprising the step of converting said fourth format into said first format, said first format for encoding an impulse, and said impulse having a length of 2 or 3 bits, said step for converting said fourth format comprising the steps:
converting said pair of bits for indicating said format, to indicate said first format;
whereby converting said fourth format into said first format.

24. The method of claim 23 further comprising the steps of:
placing a zero into said third and said second polarity bits of said first indicator of said fourth format; and
placing a zero into said third and said second bits of said second indicator of said fourth format.

25. An apparatus for using a computer for converting a string of consecutive binary bits into a compressed impulse format comprising:
means for separating said bit string into one or more uncompressed impulses, which together constitute substantially the entire bit string, each said one or more uncompressed impulses comprising a run of one or more contiguous bits of the same polarity in said bit string followed by a next bit having a polarity opposite from said same polarity of the associated impulse; and
means for encoding each and everyone of said one or more uncompressed impulses into a corresponding sequence of compressed impulse formats, there being one compressed impulse format for each uncompressed impulse, each said compressed impulse format comprising first and second binary coded indicators, said first indicator indicating the polarity of said one or more same polarity bits of the corresponding uncompressed impulse and said second indicator indicating the quantity of said same polarity bits of the corresponding uncompressed impulse.

26. The apparatus of claim 25 wherein the means for encoding comprises forming in said second indicator one or more binary words for representing extended length impulses.

27. The apparatus of claim 25 wherein the means for encoding comprises means for forming said second indicator to indicate the quantity of said same polarity bits with said next bit of opposite polarity.

28. The apparatus of claim 25 wherein the means for encoding comprises means for encoding one or more of said uncompressed impulses into a common compressed impulse format and comprising means for forming in such common compressed impulse format an individual one of said first indicator for each of said one or more uncompressed impulses to be represented in such common compressed impulse format.

29. The apparatus of claim 28 wherein the means for encoding into a common compressed impulse format comprises means for forming in such common compressed impulse format an individual one of said second indicators for each of said one or more uncompressed impulses to be represented in such common compressed impulse format.

30. The apparatus of claim 29 further comprising means for forming an indication in the common compressed impulse format of the number of said one or more impulses represented therein.

31. The apparatus of claim 25 further comprising:
means for determining the quantity of bits in the impulses for one or more of said impulses;
the means for encoding, including the means for forming common format words, having said compressed impulse format, and means for forming, in each of said common format words, a representation of said first and said second indicators for each of a variable number of said one or more impulses, where such variable number varies depending on the quantity of bits determined.

32. The apparatus of claim 31 wherein said common format words are of the same length for a plurality of different numbers of said uncompressed impulses represented therein.

33. The apparatus of claim 31 further comprising means for forming in each said common word a format indicator which is an indication of the number of said uncompressed impulses.

34. The apparatus of claim 31 comprising means for forming said common format words of the same length for different numbers of said uncompressed impulses represented in the same common format word.

35. The apparatus of claim 33 comprising means for setting an initial value in the format indicator for a first number of uncompressed impulses with a first impulse, and means for selectively modifying the initial format indicator at least one dependent on the quantity of bits determined for at least one further uncompressed impulse.

36. The apparatus of claim 33 comprising means for setting the format indicator in the common format word for a first number of uncompressed impulses in the common format word and means for modifying the format indicator to represent a different number of impulses depending on the number of impulses represented in the common format word.

37. The apparatus of claim 25 wherein the means for encoding comprises means for encoding one or more of said uncompressed impulses into a common compressed impulse format and comprising means for forming a bit for each said one or more uncompressed impulses, said polarity bit having a polarity corresponding to said one or more same polarity bits for each said one or more uncompressed impulses.

38. The apparatus of claim 25 wherein said means for encoding said one or more impulses into said compressed impulse format further comprises means for encoding said uncompressed impulse into a first compressed impulse format when encoding an impulse having a length of bits of 2 to 31 bits, a second compressed impulse format when encoding an impulse having a length of bits of 2 to $2^{32}-1$ bits, a third compressed impulse format when encoding two impulses each having a length of bits of 2 to 5 bits, or a fourth compressed impulse format for encoding three impulses, each having a length of bits of 2 or 3 bits.

39. The apparatus of claim 38 wherein the means for encoding said first compressed impulse format further comprises:
means for forming a pair of bits for indicating said first format;
means for forming in said first indicator of said first format a polarity bit for indicating a binary value of said impulse; and
means for forming in said second indicator of said first format five bits for indicating the length of bits of said impulse.

40. The apparatus of claim 38 wherein the means for encoding said second format further comprises:
means for forming a pair of bits for indicating said second format;
means for forming in said first indicator of said second format a polarity bit for indicating said binary value of said impulse; and means for forming in said second indicator of said second format, one, two, three or four eight-bit words for indicating the length of said impulse; and
means for forming in said second indicator two bits for indicating whether one, two, three or four of said words are necessary for ending said impulse.

41. The apparatus of claim 38 wherein the means for encoding said third format further comprises:
means for forming a pair of bits for indicting said third format;
means for forming in said first indicator of said third format two polarity bits indicating a binary value for each said impulse;
means for forming in said second indication of said third format a first and a second pair of bits indicating a corresponding length for each said second uncompressed impulse.

42. The apparatus of claim 41 further comprising means for converting said third format into said first format, said first format for encoding an impulse, and said impulse having a length of 2 to 5 bits, said means for converting said fourth format comprises:
means for converting said pair of bits for indicating said third format, to indicate said first format;
whereby providing means for converting said third format into said first format.

43. The apparatus of claim 42 further comprises:
means for placing a pair of zero's into said second pair of bits of said second indicator of said third format; and
means for placing a zero in said second polarity bit of said first indicator of said third format.

44. The apparatus of claim 38 wherein the means for encoding said fourth format further comprises:
means for forming in said fourth format a pair of bits for indicating said fourth format;
means for forming in said first indicator of said fourth format three polarity bits for indicating a polarity for each said impulse; and
means for forming in said second indicator of said fourth format a first, a second, and a third bit, said first, said second and said third bits for indicating a corresponding length for each said impulse.

45. The apparatus of claim 44 further comprising means for converting said fourth format into said third format, said third format for encoding a first and a second impulse, and said first and said second impulses having a length of 2 or 3 bits, said means for converting said fourth format comprises:
means for converting said pair of bits, for indicating said fourth format, to indicate said third format;
whereby providing means for converting said fourth format into said third format.

46. The apparatus of claim 45 further comprises:
means for placing a zero in said third bit of said second indicator of said fourth format; and
means for placing a zero in said third polarity bit of said first indicator of said fourth format.

47. The apparatus of claim 44 further comprising the means for converting said fourth format into said first format, said first format for encoding an impulse, and said impulse having a length of 2 or 3 bits, said means for converting said fourth format comprises:
means for converting said pair of bits for indicating said format, to indicate said first format; and
whereby providing means for converting said fourth format into said first format.

48. The apparatus of claim 47 further comprises:

means for placing a zero into said third and said second polarity bits of said first indicator of said fourth format; and means for placing a zero into said third and said second bits of said second indicator of said fourth format.

49. A method using a computer for efficiently performing Boolean-type operations on a pair of binary bit strings in which each binary bit string is represented by a series of compressed impulse formats, each compressed impulse format comprising a binary polarity representation and a corresponding length representation, the polarity representation representing the binary value of one or more contiguous binary bits of the same binary value followed by a binary bit of the opposite binary value in a corresponding bit string and the length representation representing the quantity of such contiguous binary bits of the same value, the method comprising the steps of:

processing, according to a selected operation, a first series of compressed impulse formats representing a first one of the bit strings with a second series of the compressed impulse formats representing a second one of the bit strings, and forming in response to said selected operation an intermediate format result that represents a resultant bit string, the intermediate format result comprising a series of compressed impulse formats with intermixed run representations where each such run representation represents a series of binary bits of the same binary value in the resultant bit string.

50. The method of claim 49 further comprising the step of combining the series of compressed impulse formats and the run representations in the intermediate format result into a series of contiguous compressed impulse formats representing said resultant bit string.

51. The method of claim 50 wherein the step of processing comprises the step of forming the intermediate format result with said series of compressed impulse formats and run representations, with at least one of the run representations adjacent to at least one of the compressed impulse formats in the series.

52. The method of claim 50 wherein the step of combining comprises the step of combining at least one of said run representations with one of said compressed impulse formats to form, in place thereof, a further compressed impulse format.

53. The method of claim 52 wherein the step of forming a further compressed impulse format comprises the steps of:

if the at least one run representation and the compressed impulse format which are being combined are for bits of the same binary value, forming in such further compressed impulse format a polarity representation for such same binary value bits and a length representation for the total quantity of the bits of the same binary value in said at least one run and the compressed impulse format which are being combined.

54. The method of claim 50 wherein the step of combining comprises the step of combining at least one of said run representations with a compressed impulse format to form, in place thereof, a first and a second compressed impulse format.

55. The method of claim 54 wherein the step of forming said first and said second compressed impulse formats comprises the steps of:

if the at least one run representation and the compressed impulse format, which are being combined, are for bits of different binary values, forming in such first compressed impulse format a polarity representation for said binary value of said run and a length representation for the total quantity of the bits of the same binary value and for forming in such second compressed impulse format a polarity representation corresponding to said polarity of said compressed impulse format and a length representation for the total quantity of the bits of the compressed impulse format less one bit.

56. An apparatus using a computer for efficiently performing Boolean-type operation on a pair of binary bit strings in which each binary bit string is represented by a series of compressed impulse formats, each compressed impulse format comprising a polarity representation and a corresponding length representation, the polarity representation representing the binary value of one or more contiguous binary bits of the same binary value and a binary bit of the opposite binary value in a corresponding bit string and the length representation, in the same pair, representing the quantity of such contiguous binary bits of the same value, the method comprising:

means for processing, according to a selected operation, a first series of the compressed impulse formats representing a first one of the bit strings with a second one of the bit strings, and means responsive to said processing means for forming an intermediate format result that represents a resultant bit string according to said selected operation, the intermediate format result comprising a series of the compressed impulse formats and intermixed plural run representations where each such run representation represents a series of binary bits of the same binary value in the resultant bit string.

57. The apparatus of claim 56 further comprising means for combining the series of compressed impulse formats and run representations in the intermediate format result into a series of contiguous compressed impulse formats representing said resultant bit string.

58. The apparatus of claim 56 or 57 wherein the means for processing further comprises means for forming the intermediate format result with said series of compressed impulse formats and run representations, with at least one of the run representations adjacent to at least one of the compressed impulse formats in the series.

59. The apparatus of claim 57 wherein the means for combining comprises the means of combining at least one of said run representations with one of said compressed impulse formats to form, in place thereof, a further compressed impulse format.

60. The apparatus of claim 59 wherein the means for forming a further compressed impulse format comprises:

means responsive to the combining of run representations with a compressed impulse format having bits of the same binary value for forming in such further compressed impulse format a polarity representation for such same binary value bits and a length representation for the total quantity of the bits of the same binary value in said at least one run and the compressed impulse format which are being combined.

61. The apparatus of claim 57 wherein the means for combining further comprises means for combining at least one of said run representations with a compressed impulse format to form, in place thereof, a first and a second compressed impulse formats.

62. The apparatus of claim 56 wherein the means for forming said first and said second compressed impulse formats comprises:

means responsive to run representations and a compressed impulse format, which are being combined, that are for bits of different binary values for forming in such first compressed impulse format a polarity representation for said binary value of said run and a length representation for the total quality of the bits of the same binary value and means for forming in such second compressed impulse format a polarity representation corresponding to said polarity of said compressed impulse format and a length representation for the total quantity of the bits of the compressed impulse format less one bit.

63. A method using a computer for creating and processing a compressed representation of a set of data, said method comprising the steps of:

separating a bit string into one or more impulses, each said one or more impulses comprising a run of one or more contiguous bits of the same polarity and an ending bit at one end of the contiguous bits having a polarity opposite from said same polarity of the associated impulse;

encoding said one or more impulses into a corresponding compressed impulse format, each said compressed impulse format comprising a first and a second indicator, said first indicator indicating a polarity of said one or more same polarity bits of the corresponding impulse and said second indicator indicating the quantity of said same polarity bits; and processing, according to a selected operation, a first series of the compressed impulse formats representing a first one of the bit strings with a second series of compressed impulse formats representing a second one of the bit strings, and thereby forming a resultant bit string, comprising a series of compressed impulse formats, if any, and intermixed, runs representations, if any, where each such run representation represents a series of binary bits of the same binary value in the resultant bit string.

64. The method of claim 63 further comprising the step of converting the resultant series of compressed impulse formats and run representations into a series of contiguous compressed impulse formats representing the resultant bit string.

65. The method of claim 63 or 64 comprising the step of storing each said compressed impulse format into a memory.

66. The method of claim 63 or 64 wherein the step for encoding comprises forming said second indicator to indicate the quantity of the said same polarity bits with said ending bit having said opposite polarity.

67. An apparatus using a computer for creating and processing a compressed representation of a set of data, said apparatus comprising:

means for separating a bit string into one or more impulses, each said one or more impulses comprising a run of one or more bits of the same polarity and an ending bit at one end of the contiguous bits having a polarity opposite from said same polarity of the associated impulse;

means for encoding said one or more impulses into a corresponding compressed impulse format, each said compressed impulse format comprising a first and a second indicator, said first indicator indicating a polarity of said one or more same polarity bits of the corresponding impulse and said second indicator indicating the quantity the said same polarity bits; and means for processing, according to a selected operation, a first series of the compressed impulse formats representing a first one of the bit strings with a second series of the compressed impulse formats representing a second one of the bit strings, and thereby forming a resultant bit string comprising a series of the compressed impulse formats, if any, and intermixed, runs representations, if any, where each such run representation represents a series of binary bits of the same binary value in the resultant bit string.

68. The apparatus of claim 67 further comprising means for converting the resultant series of compressed impulse formats and run representations into a series of contiguous compressed impulse formats representing the resultant bit string.

69. The apparatus of claim 67 or 68 comprising the means for storing each said compressed impulse formats into a memory.

70. The apparatus of claim 67 or 68 wherein the means for encoding comprises means for forming in said second indicator an indication of the quantity of the said same polarity bits and said associated ending bit having said appropriate polarity.

71. A method using a computer for efficiently processing an operation on a first and a second impulse to determine a resultant run or impulse, said first and said second impulses comprising a run, said run comprising a string of one or more contiguous bits of a same polarity, and each said impulse comprising an ending bit at one end of the contiguous bits having an opposite polarity, said method for processing said impulses comprising the steps of:

comparing said length of said first impulse with said length of said second impulse to determine a minimum length, said minimum length being the length of said resultant run or impulse;

determining said polarity of said same polarity bits for said first and said second impulses; and processing a selected operation on said first and said second impulses to determine whether said resultant bit string is a run or an impulse.

72. The method claim 71 further comprising the step of comparing said length of said first impulse with said length of said second impulse to determine whether the length of said first impulse is less than, greater than, or equal to the length of said second impulse.

73. The method claim 71 further comprising the step of storing said polarity, said type (run or impulse) and said length of one or more of said runs or impulses into a temporary memory and combining a plurality of said runs into a single said run.

74. The method of claim 71 or 72 further comprising the step of storing said polarity (run or impulse) and said length of one or more of said runs or impulses into a temporary memory area and combining said one or more runs or impulses into one or more impulses.

75. The method of claim 71 wherein said step for processing said selected operation further includes the step of forming an index table to determine said selected operation, said index table comprising a plurality of said operations.

76. The method of claim 75 wherein said step of forming an index table further comprises the step of representing each said operation by one or more subtables, each said subtable comprising a first, a second, and a third index, said first index for identifying a polarity of said first impulse, said second index for identifying a polarity of said second impulse, and said third index for identifying whether the length of said first impulse is less than, greater than, or equal to the length of said second impulse.

77. The method of claim 76 wherein said step for forming said index table further comprises the step of referencing said first, said second, and said third indexes to reference said selected operations.

78. The method of claim 71 wherein said step for performing a selected operations further comprises the step of determining whether said first and said second impulses are equal or unequal in length.

79. The method of claim 71 wherein said step for processing said selected operation further includes the step of performing a Boolean operation.

80. The method of claim 72 wherein said step for processing includes the step of evaluating a set of rules if the length of said first impulse and said second impulse are not equal:
1. when said operation is a Boolean AND operation, said polarity of said longer impulse indicates whether said resultant bit string is a run or an impulse;
2. when said function is a Boolean OR operation, said polarity of said longer impulse indicates whether the resultant bit string is a run or an impulse;
3. when said function is a Boolean EXCLUSIVE OR operation, the resultant bit string is an impulse.

81. The method of claim 71 wherein said step for processing includes the step of evaluating a set of rules if the length of said first impulse, and said second impulse are equal:
1. when said function is either a Boolean AND or Boolean OR operation and the polarity of said first and said second impulses is different, said resultant bit string is a run;
2. when said function is either a Boolean AND or a Boolean OR operation, and the polarity of said first and said second impulses is the same, said resultant bit string is an impulse.
3. when said function is a Boolean EXCLUSIVE OR, said resultant bit string is a run.

82. An apparatus using a computer for efficiently processing an operation on a first and a second impulse to determine a resultant run or impulse, said first and said second impulses comprising a run, said run comprising a string of one or more contiguous bits of a same polarity and each said impulse comprising an ending bit at one end of the contiguous bits having an opposite polarity, said apparatus:
means for comparing said length of said first impulse with said length of said second impulse to determine a minimum length, said minimum length of bits being the length of said resultant run or impulse;
means for determining said binary value of said same binary value bits for said first and said second impulses; and
means for processing a selected operation on said first and said second impulses to determine whether said resultant bit string is a run or an impulse.

83. The apparatus of claim 82 further comprising means for comparing said length of said first impulse with said length of said second impulse to determine whether the length of said first impulse is less than, greater than, or equal to the length of said second impulse.

84. The apparatus of claim 82 further comprising the means for storing said polarity, said type (run or impulse) and said length of one or more of said run or impulses into a temporary memory area and means for combining a plurality of said runs into a single said run.

85. The apparatus of claim 82 or 83 further comprising the means for storing said polarity, said type (run or impulse) and said length of one or more of said run or impulse into a temporary memory area and combining said one or more run or impulse into one or more impulses.

86. The apparatus of claim 82 wherein said means for processing said selected operation further includes the step of forming an index table to determine said selected operation, said index table comprising plurality of said operations.

87. The apparatus of claim 86 wherein said means for forming an index table further comprises means for representing each said operation by one or more subtables, each said subtable comprising a first, a second, and a third index, said first index for identifying a polarity of said first impulse, said second index for identifying a polarity of said second impulse, and said third index for identifying whether the length of said first impulse is less than, greater than, or equal to the length of said second impulse.

88. The apparatus of claim 87 wherein said means for forming said index table further comprises means for referencing said first, said second, and said third indexes to reference said selected operation.

89. The apparatus of claim 82 wherein said means for performing a selected operation further comprises means determining whether said first and said second impulses are equal or unequal in length.

90. The apparatus of claim 82 wherein said means for processing said selected operation further includes means for performing a Boolean operation.

91. The apparatus of claim 83 wherein said means for processing includes the step of evaluating a set of rules if the length of said first impulse and said second impulse are not equal:
1. when said operation is a Boolean AND operation, said polarity of said longer impulse indicates whether said resultant bit string is a run or an impulse;
2. when said function is a Boolean OR operation, said polarity of said longer impulse indicates whether the resultant bit string is a run or an impulse;
3. when said function is a Boolean EXCLUSIVE OR operation, the resultant bit string is an impulse.

92. The apparatus of claim 83 wherein said means for processing includes evaluating a set of rules if the length of said first impulse and said second impulse are equal:
1. when said function is either a Boolean AND or Boolean OR operation and the polarity of said first and said second impulses is different, said resultant bit string is a run;
2. when said function is either a Boolean AND or a Boolean OR operation, and the polarity of said first and said second impulses is the same, said resultant bit string is an impulse.

3. when said function is a Boolean EXCLUSIVE OR, said resultant bit string is a run.

93. A method using a computer for efficiently processing a Boolean operation on a first and a second impulse to determine a resultant bit string, said first and second impulses comprising a run, said run comprising a string of one or more contiguous bits of a same polarity and each said impulse comprising an ending bit at one end of the contiguous bits having a polarity opposite said same polarity, each said impulse encoded in a compressed impulse format, said compressed impulse format comprising at least a first and a second indicator, said first indicator for indicating a polarity of said same polarity bits and said second indicator for indicating a length of said impulse, wherein said length of bits is a quantity of said same polarity bits, said method comprising the steps of:

comparing said length of said first impulse with said length of said second impulse to determine a minimum length, said minimum length being the length of bits for said resultant bit string;

referencing an index table to determine a predefined operation to perform on said first and said second impulses, said index table comprising one or more subtables, each said subtable comprising first, second, and third indexes, said first index for identifying the polarity of said first impulse, said second index for identifying the polarity of said second impulse and said third index for identifying whether said first impulse is less than, greater than or equal to said second impulse, whereby said first, said second, and said third indexes are used to determine which predefined operation to perform;

separate from the prior recited step of referencing, performing said predefined operation on said minimum length of said first and said second impulses to determine the polarity of said resultant bit string and whether said resultant bit string is a run or an impulse;

whereby a method is provided for processing said operation on said first and said second impulses to determine said resultant bit string.

94. The method of claim 93 wherein said predefined operation is a Boolean operation.

95. The method of claim 93 further comprising the step of adding to said quantity of said same polarity bits said opposite polarity bit.

96. The method of claim 93 or 94 further comprising the step of comparing said length of said first impulse with said length of said second impulse to determine whether the length of said first impulse is less than, greater than or equal to the length of said second impulse.

97. The method of claim 96 further comprising the step of appending to said resultant bit string one or more bits of said first impulse, said one or more bits not processed by said operation, and said length for said first impulse being longer than said length of said second impulse and said operation is Boolean OR or Boolean EXCLUSIVE OR operation.

98. The method of claim 96 further comprising the step of appending to said resultant bit string one or more bits of said second impulse, said one or more bits not processed by said operation, and said length of said second impulse being longer than said length of said first impulse and said operation is Boolean OR or Boolean EXCLUSIVE OR operation.

99. The method of claim 96 further comprising the step of truncating one or more bits from said first impulse, said one or more bits not processed by said operation, and said first impulse is longer than said second impulse, and said operation being Boolean AND operation.

100. The method of claim 96 further comprising the step of truncating from said second impulse one or more bit, said one or more bits not processed by said operation, and said second impulse being longer than said first impulse, said operation being Boolean AND operation.

101. An apparatus for use in a computer for efficiently processing a Boolean operation on a first and a second impulse to determine a resultant bit string, said first and second impulses comprising a run, each said run comprising a string of one or more contiguous bits of a same polarity and each said impulse comprising an ending bit at one end of the contiguous bits having a polarity opposite said same polarity, each said impulse encoded in a compressed impulse format, said compressed impulse format comprising at least a first and a second indicator, said first indicator for indicating a polarity of said run and said second indicator for indicating a length in said impulse, wherein said length is a quantity of said same polarity bits and said opposite polarity bit, said apparatus for processing said impulses comprising:

means for comparing said length of said first impulse with said length of said second impulse to determine a minimum length, said minimum length being the length of bits for said resultant bit string;

means for referencing an index table to determine a predefined operation to perform on said first and said second impulses, said index table comprising one or more subtables, each said subtable comprising first, second, and third indexes, said first index for identifying the polarity of said first impulse, said second index for identifying the polarity of said second impulse and said third index for identifying whether said first impulse is less than, greater than or equal to said second impulse, whereby said first, said second, and said third indexes are used separate from the prior recited means for referencing, means for performing said predefined operation on said minimum length of said first and said second impulses to determine the polarity of said resultant bit string and whether said resultant bit string is a run or an impulse;

whereby an apparatus is provided for processing said operation on said first and said second impulses to determine said resultant bit string.

102. The apparatus of claim 101 wherein said predefined operation is a Boolean operation.

103. The apparatus of claim 101 further comprising means for adding to said quantity of said same polarity bits said opposite polarity bits.

104. The apparatus of claim 101 or 102 further comprising means for comparing said length of said first impulse with said length of bits of said second impulse to determine whether the length of said first impulse is less than, greater than or equal to the length of said second impulse.

105. The apparatus of claim 104 further comprising means for appending to said resultant bit string one or more bits of said first impulse, said one or more bits not processed by said operation, and said length of said first impulse being longer than said length of said second impulse and said operation being Boolean OR or Boolean EXCLUSIVE OR operation.

106. The apparatus of claim 104 further comprising means for appending to said resultant bit string one or more bits of said second impulse, said one or more bits not processed by said operation, and said length of bits of said second impulse being longer than said length of bits of said first impulse length of bits and said operation being Boolean OR or Boolean EXCLUSIVE OR operation.

107. The apparatus of claim 104 further comprising means for truncating one or more bits from said first impulse, said one or more bits not processed by said operation, and said first impulse being longer than said second impulse, and said operation being Boolean AND operation.

108. The apparatus of claim 104 further comprising means for truncating one or more bits from said second impulse, said one or more bits not processed by said operation, and said second impulse being longer than said first impulse, and said operation being Boolean AND operation.

109. A method using a computer for efficiently processing a Boolean operation on a first and a second one-dimensional-compressed-array of binary bits (bit string) and for constructing a resultant-compressed bit string (resultant bit string), said resultant bit string resulting from said Boolean operation, said first and said second bit strings comprising one or more impulses, each said one or more impulses comprising a run, said run comprising a string of one or more contiguous bits of a same polarity and each said one or more impulses comprising an ending bit at one end of the contiguous bits having a polarity opposite said same polarity, each said one or more impulses encoded in a compressed impulse format, said compressed impulse format comprising at least a first and a second indicator, said first indicator for indicating a polarity of said one or more same polarity bits, and said second indicator for indicating a length in said impulse, wherein said length is a quantity of said same polarity bits and said opposite polarity bit, said method comprising the steps of:

comparing said length of a first impulse with said length of bits of a second bit string impulse to determine a minimum length, said minimum length being a length for an intermediate-resultant compressed bit string (intermediate bit string);

determining the polarity of said intermediate bit string and whether said intermediate bit string is a run type or an impulse type;

reducing said length of said first and said second impulses by said minimum length to account for said bits which have been processed by said predefined function;

separate from the prior recited step of reducing, determining whether the length of said first and/or said second impulses has been reduced to zero;

obtaining said polarity and said length for a next impulse of said first and said second bit strings when both said first and said second impulses are reduced to a zero length of bits;

obtaining said polarity and said length for a next impulse of said first or said second bit string which is reduced to a zero length of bits, when either said first or said second impulse is reduced to a zero length of bits; and performing said prior recited steps until no more impulses reside in said first and said second bit strings, whereby a method is provided for processing said Boolean operation on said first and said second bit strings to construct said resultant bit string.

110. The method of claim 109 further comprising the step of storing said polarity, said length and said type of said intermediate bit string in a temporary memory area until said intermediate bit strings can be represented as one or more said impulses.

111. The method of claim 109 wherein said step for determining includes the step of forming an index table, said index table comprising one or more operations.

112. The method of claim 111 wherein said step for forming said index table further comprises the step of forming one or more subtables, each said subtable comprising first, second, and third indexes, said first index for identifying the polarity of said first impulse, said second index for identifying the polarity of said second impulse and said third index for identifying whether the length of said first impulse is less than, greater than or equal to the length of said second impulse.

113. The method of claim 112 wherein said step for forming said subtable further comprises the step of forming a fourth and a fifth index, said fourth index for identifying said first bit string end-of-bit string condition and said fifth index for identifying said second bit string end-of-bit string condition.

114. The method of claim 112 wherein said step for forming said subtable further comprises the step of forming a signal indicating an end-of-bit string condition in said first and said second bit string.

115. The method of claim 109 further comprising the step of appending to said resultant bit string one or more bits of said first bit string, said one or more bits not processed by said Boolean operation, and said first bit string being longer than said second bit string, and said Boolean operation being an OR or an EXCLUSIVE OR operation.

116. The method of claim 109 further comprising the step of appending to said resultant bit string one or more bits of said second bit string, said one or more bits not processed by said Boolean operation, and said second bit string being longer than said first bit string, and said Boolean operation being an OR or an EXCLUSIVE OR operation.

117. The method of claim 109 further comprising the step of truncating one or more bits from said first bit string, said one or more bits not processed by said Boolean operation, and said first bit string being longer than said second bit string, and said Boolean operation being an AND operation.

118. The method of claim 109 further comprising the step of truncating one or more bits from said second bit string, said one or more bits not processed by said Boolean operation, and said second bit string being longer than said first bit string, and said Boolean operation being an AND operation.

119. The method of claim 110 wherein said step for storing further includes the step of appending one or more bits to said intermediate bit string to form an impulse, said intermediate bit string being the run type.

120. An apparatus using a computer for efficiently processing a Boolean operation on a first and a second one-dimensional-compressed-array of binary bits (bit string) and said apparatus for constructing a resultant-compressed bit string (resultant bit string), said resultant bit string resulting from said Boolean operation, said first and said second bit strings comprising one or more impulses, each said one or more impulses comprising a run, said run comprising a string of one or more bits of a same polarity and each said one or more impulses comprising an ending bit having a polarity opposite said same polarity, each said one or more impulses encoded in a compressed impulse format, said compressed impulse format comprising at least a first and a second indicator, said first indicator for indicating a polarity of said run and said second indicator for indicating a length in said impulse, wherein said length is a quantity of said same polarity bits and said opposite polarity bit, said apparatus comprising:

means for comparing said length of a first impulse with said length of a second impulse to determine a minimum length, said minimum length being a length for an intermediate-resultant compressed bit string (intermediate bit string);

means for determining the polarity of said intermediate bit string and whether said intermediate bit string is a run type or an impulse type;

means for reducing said length of said first and said second impulses by said minimum length to account for said bits which have been processed by said predefined function;

separate from the prior recited means for reducing, means for determining whether the length of said first and/or said second bit string impulses has been reduced to zero;

means for obtaining said polarity and said length for a next impulse of said first and said second bit strings when both said first and said second bit string impulses are reduced to a zero length;

means for obtaining said polarity and said length for a next impulse of said first or said second bit string which is reduced to a zero length, when either said first or said second bit string impulse is reduced to a zero length of bits; and means for performing said prior recited steps until no more impulses reside in said first and/or said second bit strings, whereby an apparatus is provided for processing of said Boolean operation on said first and said second bit strings to construct said resultant bit string.

121. The apparatus of claim 120 further comprising:
    means for storing said polarity, said length of bits and said type of said intermediate bit string in a temporary memory area until said intermediate bit strings can be represented as one or more said impulses.

122. The apparatus of claim 120 wherein said means for determining includes means for forming an index table, said index table comprising one or more operations.

123. The apparatus of claim 119 wherein said means for forming said index table further comprises means for forming one or more subtables, each said subtable comprising first, second, and third indexes, said first index for identifying the polarity of said first impulse said second index for identifying the polarity of said second impulse and said third index for identifying whether the length of said first impulse is less than, greater than or equal to the length said second impulse.

124. The apparatus of claim 123 wherein said means for forming said subtable further comprises means for forming a fourth and a fifth index, said fourth index for identifying said first bit string end-of-bit-string condition and said fifth index for identifying said second bit string end-of-bit-string condition.

125. The apparatus of claim 123 wherein said means for forming said subtable further comprises means forming an end-of-bit-string condition in said first and/or said second bit string.

126. The apparatus of claim 120 further comprises means for appending to said resultant bit string one or more bits of said first bit string, said one or more bits not processed by said Boolean operation and said first bit string being longer than said second bit string, and said Boolean operation being an OR or an EXCLUSIVE OR operation.

127. The apparatus of claim 120 further comprises means for appending to said resultant bit string one or more bits of said second bit string, said one or more bits not processed by said Boolean operation and said second bit string being longer than said first bit string, and said Boolean operation being an OR or an EXCLUSIVE OR operation.

128. The apparatus of claim 120 further comprises means for truncating one or more bits from said first bit string, said one or more bits not processed by said Boolean operation, and said first bit string being longer than said second bit string, and said Boolean operation being an AND operation.

129. The apparatus of claim 120 further comprises means for truncating one or more bits from said second bit string, said one or more bits not processed by said Boolean operation, and said second bit string being longer than said first bit string, and said Boolean operation being an AND operation.

130. The apparatus of claim 120 wherein said means for storing further includes means for appending one or more bits to said intermediate bit string to form an impulse, said intermediate bit string being a run type.

131. A method using a computer for efficiently processing the Boolean operations AND, OR or EXCLUSIVE OR on a first and a said second impulse, said first and second impulses comprising a run, said run comprising a string of one or more contiguous bits of a same polarity and each said impulse comprising an ending bit at one end of the contiguous bits having a binary value opposite said same binary value, each said impulse encoded in a compressed impulse format, said compressed impulse format comprising at least a first and a second indicator, said first indicator for indicating a polarity of said one or more same polarity bits and said second indicator for indicating a length in said impulse, wherein said length of bits is a quantity of said same polarity bits, said method for processing said impulses comprising the steps of:

determining a resultant bit string when said first and said second impulses are unequal in length, said step of determining comprising the steps of:

a) comparing said length of said first impulse with said length of said second impulse to determine which said impulse has a longer length of bits and which said impulse has a shorter length of bits, said shorter length being the length of said resultant bit string;

b) determining the polarity of said longer impulse by referring to said polarity indicator of said longer impulse;

c) determining whether said resultant bit string is an impulse type or a run type, said step for determining comprising the step for evaluating a set of rules:

1) when said Boolean operation is an AND operation, said polarity of said longer impulse indicates whether said resultant bit string is said run type or said impulse type;
2) when said Boolean operation is an OR operation, the complement of said polarity of said longer impulse indicates whether the resultant bit string is said run type or said impulse type;
3) when said Boolean operation is an EXCLUSIVE OR operation, the resultant bit string is said impulse type;

determining a resultant bit string when said first and said second impulses are equal in length, said step of determining comprising the steps of:
a) designating the length of said resultant bit string equal to said length of said first or said second impulse;
b) determining whether said resultant bit string is said impulse type or said run type, said step for determining comprising the step for evaluating a set of rules:
1) when said Boolean operation is either an AND or an OR and the polarity of said first and said second impulses is different, said resultant bit string is said run type;
2) when said Boolean operation is either an AND or an OR and the polarity of said first and said second impulses is the same, said resultant bit string is said impulse type;
3) when said Boolean operation is EXCLUSIVE OR, said resultant bit string is said run type;

whereby a method is provided for processing said Boolean operations, AND, OR, or EXCLUSIVE OR, on said first and said second impulses to determine said resultant bit string.

132. The method of claim 131 further comprising the step of adding to said quantity of said same polarity bits the quantity of said opposite polarity bit.

133. The method of claim 131 further comprising the step of performing said Boolean operation on said first indicator of said first impulse with said first indicator of said second impulse to determine a polarity of said intermediate bit string.

134. The method of claim 131 further comprising the step of comparing said length of said first impulse with said length of said second impulse to determine whether said first and said second impulses have equal or unequal lengths.

135. The method of claim 131 further comprising the step of appending to said resultant bit string one or more bits of said first impulse, said one or more bits not processed by said Boolean operation, and said length of said first impulse being longer than said length of said second impulse, and said Boolean operation being an OR or an EXCLUSIVE OR operation.

136. The method of claim 131 further comprising the step of adding to said resultant bit string one or more bits of said second impulse, said one or more bits not processed by said Boolean operation, and said length of said second impulse being longer than said length of said first impulse, and said Boolean operation being an OR or an EXCLUSIVE OR operation.

137. The method of claim 131 comprising the step of truncating one or more bits from said first impulse, said one or more bits not processed by said Boolean operation, and said first impulse being longer than said second impulse, and said Boolean operation being an AND operation.

138. The method of claim 131 further comprising the step of truncating one or more bits from said second impulse, said one or more bits not processed by said Boolean operation, and said second impulse being longer than said first impulse, and said Boolean operation being an AND operation.

139. An apparatus using a computer for efficiently processing the Boolean operations AND, OR or EXCLUSIVE OR on a first and a said second impulse, each said first and second impulses comprising a run, said run comprising a string of one or more contiguous bits of a same polarity and each said one or more impulses comprising an ending bit at one end of the contiguous bits having a polarity opposite said same polarity, each said impulse encoded in a compressed impulse format, said compressed impulse format comprising at least a first and a second indicator, said first indicator for indicating a polarity of said same binary value bits and said second indicator for indicating a length of bits in said impulse, wherein said length is a quantity of said same polarity bits and said opposite polarity bit, said apparatus for efficiently processing said Boolean operations and for constructing said resultant bit string comprising:

means for determining a resultant bit string when said first and said second impulses are unequal in length, said means for determining comprising:
a) means for comparing said length of said first impulse with said length of said second impulse to determine which said impulse has a longer length of bits and which impulse has a shorter length of bits, said shorter length being the length of said resultant bit string;
b) means for determining the polarity of said longer impulse by referring to said polarity indicator of said longer impulse;
c) means for determining whether said resultant bit string is an impulse type or a run type, said means for determining comprising means for evaluating a set of rules:
1) when said Boolean operation is an AND operation, said polarity of said longer impulse indicates whether said resultant bit string is said run type or said impulse type;
2) when said Boolean operation is an OR operation, the complement of said polarity of said longer impulse indicates whether the resultant bit string is said run type or said impulse type;
3) when said Boolean operation is an EXCLUSIVE OR operation, the resultant bit string is said impulse type;

means for determining a resultant bit string when said first and said second impulses are equal in length, said means for determining comprising the steps:
a) means for designating the length of said resultant bit string equal to said length of said first or said second impulses;
b) means for determining whether said resultant bit string is said impulse type or said run type, said means for determining comprising means for evaluating a set of rules:
1) when said Boolean operation is either an AND or an OR and the polarity of said first and said second impulses is different, said resultant bit string is said run type;
2) when said Boolean operation is either an AND or an OR and the polarity of said first and said resultant bit string is said impulse type;

3) when said Boolean operation is EXCLUSIVE OR, said resultant bit string is said run type;

whereby an apparatus is provided for processing said Boolean operations, AND, OR, or EXCLUSIVE OR, on said first and second impulses to determine said resultant bit string.

140. The apparatus of claim 139 further comprising means for adding to said quantity of said same binary value bits, the quantity of said opposite binary value bit.

141. The apparatus of claim 140 comprising means for performing said Boolean operation on said first indicator of said first impulse with said first indicator of said second impulse to determine a polarity of said intermediate resultant bit string;

142. The apparatus of claim 139 further comprising for comparing said length of said first impulse with said length said second impulse to determine whether said first and said second impulses have equal or unequal lengths.

143. The apparatus of claim 139 further comprising means for appending to said resultant bit string one or more bits of said first impulse, said one or more bits not processed by said Boolean operation, and said length of said first impulse being longer than said length of said second impulse, and said Boolean operation being an OR or an EXCLUSIVE OR operation.

144. The apparatus of claim 139 further comprising means for appending to said resultant bit string one or more bits of said second impulse, said one or more bits not processed by said Boolean operation, and said length of bits of said second impulse being longer than said length of bits of said first impulse, and said Boolean operation being an OR or an EXCLUSIVE OR operation.

145. The apparatus of claim 139 further comprising means for truncating one or more bits from said first impulse, said one or more bits not processed by said Boolean operation, and said first impulse is longer than said second impulse, and said Boolean operation being an AND operation.

146. The apparatus of claim 139 further comprising means for truncating one or more bits from said second impulse, said one or more bits not processed by said Boolean operation, and said second impulse is longer than said first impulse, and said Boolean operation being an AND operation.

147. A method using a computer for efficiently processing a Boolean operation on a first and a second one-dimensional-compressed-array of binary bits (bit string), said first and said second bit strings comprising one or more impulses, each said one or more impulses comprising a run, said run comprising a string of one or more contiguous bits of a same polarity and each said one or more impulses comprising an ending bit at one end of the contiguous bits having a polarity opposite said same polarity, each said one or more impulses encoded in a compressed impulse format, said compressed impulse format comprising at least a first and a second indicator, said first indicator for indicating a polarity of said one or more same binary value bits and said second indicator for indicating a length in said impulse, wherein said length is a quantity of said same binary value bits, said method for processing said Boolean operation comprising the steps of:

determining an intermediate-resultant-compressed bit string (intermediate bit string) when a first and a second impulse are unequal in length, said step of determining comprising the steps of:

a) comparing said second indicator of said first impulse with said second indicator of said second impulse to determine which said impulse has a longer length and which impulse has a shorter length, said shorter length being the length of said intermediate bit string;

b) determining the polarity of said longer impulse by referring to said first indicator of said longer impulse;

c) determining whether said intermediate bit string is an impulse type or a run type, said step for determining comprising the step of evaluating a set of rules:

1) when said Boolean operation is an AND operation, said polarity of said longer impulse indicates whether said intermediate bit string is said run type or said impulse type;

2) when said Boolean operation is an OR operation, the complement of said polarity of said longer impulse indicates whether the intermediate bit string is said run type or said impulse type;

3) when said Boolean operation is an EXCLUSIVE OR operation, the inter mediate bit string is said impulse type;

determining said intermediate bit string when said first and said second impulses are equal in length, said step of determining comprising the steps of:

a) designating the length of said intermediate bit string equal to said length of said first or said second impulses;

b) determining whether said intermediate bit string is an impulse type or a run type, said step for determining comprising the step of evaluating a set of rules:

1) when said Boolean operation is either an AND or an OR and the polarity of said first and said second impulses is different, said intermediate bit string is said run type;

2) when said Boolean operation is either an AND or an OR and the polarity of said first and said second impulses is the same, said intermediate bit string is said impulse type;

3) When said Boolean operation is EXCLUSIVE OR, said intermediate bit string is said run type; and performing said Boolean operation on said first indicator of said first impulse with said first indicator of said second impulse to determine a polarity of said intermediate resultant bit string;

performing the previously recited steps on each said impulse in said first and said second bit strings, whereby a method is provided for processing said Boolean operations AND, OR, or EXCLUSIVE OR on said first and said second bit strings.

148. The method of claim 147 further comprising the step of adding to said quantity cf same polarity bits the opposite polarity bits.

149. The method of claim 147 further comprising the step of comparing said length of said first bit string impulse with said length of said second bit string impulse to determine whether said first and said second bit string impulses have equal or unequal lengths.

150. The method of claim 147 further comprising the step of reducing said length of said first and second impulses by said length of said intermediate bit string to account for said bits which have been processed.

151. The method of claim 150 further comprising the step of determining whether said length of said first and/or said second impulses has been reduced to zero length.

152. The method of claim 151 further comprising the step of obtaining said polarity and said length for a next impulse of said first and second bit string when said first and second impulses are reduced to zero length.

153. The method of claim 151 further comprising the step of obtaining said polarity and said length for a next impulse of said first or said second bit string, when said first or second impulse is reduced to a zero length.

154. The method of claim 147 further comprising the step of constructing a resultant bit string, said resultant bit string comprising one or more of said intermediate bit strings, said step of constructing comprising the steps of storing the polarity and the length of said one or more intermediate bit strings into a temporary memory area and combining said one or more intermediate bit strings into one or more impulses of said resultant bit string, whereby a method is provided for processing said Boolean operations, AND, OR, or EXCLUSIVE OR, on said first and said second bit strings and for constructing said resultant bit string.

155. The method of claim 147 wherein said step for storing further includes the step of appending one or more bits to said intermediate bit string to form an impulse, said intermediate bit string being the run type.

156. The method of claim 147 further comprising the step of truncating one or more bits from said first bit string, said one or more bits not processed by said Boolean operation, and said first bit string being longer than said second bit string, and said Boolean operation being an AND operation.

157. The method of claim 147 further comprising the step of truncating one or more bits from said second bit string, said one or more bits not processed by said Boolean operation, and said second bit string being longer than said first bit string, and said Boolean operation being an AND operation.

158. The method of claim 147 further comprising the step of appending to said intermediate bit string one or more bits of said first bit string, said one or more bits not processed by said Boolean operation, and said first bit string being longer than said second bit string, and said Boolean operation being an OR or an EXCLUSIVE OR operation.

159. The method of claim 147 further comprising the step of appending to said intermediate bit string one or more bits of said second bit string, said one or more bits not processed by said Boolean operation, and said second bit is longer than said first bit string, and said Boolean operation being an OR or an EXCLUSIVE OR operation.

160. An apparatus using a computer for efficiently processing the Boolean operations AND, OR or EXCLUSIVE OR on a first and a second one-dimensional-compressed-array of binary bits (bit string), said first and said second bit strings comprising one or more impulses, each said one or more impulses comprising a run, said run comprising a string of one or more contiguous bits of a same polarity and each said one or more impulses comprising an ending bit at one end of the contiguous bits having a polarity opposite said same polarity, each said one or more impulses encoded in a compressed impulse format, said compressed impulse format comprising at least a first and a second indicator, said first indicator for indicating a polarity of said one or more same binary value bits and said second indicator for indicating a length in said impulse, wherein said length is a quantity of said same polarity bits, said apparatus for efficiently processing a Boolean operation comprising:

means for determining an intermediate-resultant-compressed bit string (intermediate bit string) when a first and a second impulse are unequal in length, said means for determining comprising:
 a) means for comparing said second indicator of said first impulse with said second indicator of said second impulse to determine which said bit string impulse has a longer length and which bit string impulse has a shorter length, said shorter length being the length of said intermediate bit string;
 b) means for determining the polarity of said longer impulse by referring to said first indicator of said longer impulse;
 c) means for determining whether said intermediate bit string is an impulse type or a run type, said means for determining comprising means for evaluating a set of rules:
  1) when said Boolean operation is an AND operation, said polarity of said longer impulse indicates whether the intermediate bit string is said run type or said impulse type;
  2) when said Boolean operation is an OR operation, the complement of said polarity of said longer impulse indicates whether the intermediate bit string is said run type or said impulse type;
  3) when said Boolean operation is an EXCLUSIVE OR operation, the inter mediate bit string is said impulse type;
means for determining said intermediate bit string when said first and said second impulses are equal in length, said means for determining comprising:
 a) means for designating the length of said intermediate bit string equal to said length of said first and said second impulses;
 b) means for determining whether said inter mediate bit string is an impulse type or a run type, said means for determining comprising means for evaluating a set of rules:
  1) when said Boolean operation is either an AND or an OR and the polarity of said first and said second impulses is different, said intermediate bit string is said run type;
  2) when said Boolean operation is either an AND or an OR and the polarity of said first and said second impulses is the same, said intermediate bit string is said
  3) when said Boolean operation is EXCLUSIVE OR, said intermediate bit string is said run type;
means for performing said Boolean operation on said first indicator of said first impulse with said first indicator of said second impulse to determine a polarity of said intermediate resultant bit string;
means for performing the previously recited steps on each said impulse in said first and said second bit string, whereby a method is provided for processing said Boolean operations AND, OR, or EXCLUSIVE OR on said first and said second bit strings.

161. The apparatus of claim 160 further comprising means for adding to said quantity of same polarity bits the opposite polarity bit.

162. The apparatus of claim 160 further comprising means for reducing said length of said first and said second impulses by said length of said intermediate bit string to account for said bits which have been processed.

163. The apparatus of claim 162 further comprising means for determining whether said length of said first and/or said second impulses has been reduced to zero length.

164. The apparatus of claim 163 further comprising means for obtaining said polarity and said length for a next impulse of said first and second bit string when said first and second impulse are reduced to zero length.

165. The apparatus of claim 163 further comprising means for obtaining said polarity and said length for said first or said second impulse which is reduced to a nonzero length of bits and means for obtaining said polarity and said length for a next impulse of said first or said second bit string having an impulse which is reduced to zero length.

166. The apparatus of claim 160 a further comprising means for constructing said resultant bit string, said resultant bit string comprising one or more of said intermediate bit strings, said means for constructing comprising means for storing the polarity and the length of said one or more intermediate bit strings into a temporary memory area and means for combining said one or more intermediate bit strings into one or more impulses of said resultant bit strings.

167. The apparatus of claim 166 wherein said means for storing further includes means for appending one or more bits to said intermediate bit string to form one or more impulses, said intermediate bit string being the run type.

168. The apparatus of claim 160 further comprising means for truncating one or more bits from said first bit string, said one or more bits not processed by said Boolean operation, and said first bit string being longer than said second bit string, and said Boolean operation being an AND operation.

169. The apparatus of claim 160 further comprising means for truncating one or more bits from said second bit string, said one or more bits not processed by said Boolean operation, and said second bit string being longer than said first bit string, and said Boolean operation being an AND operation.

170. The apparatus of claim 160 further comprising means for appending to said intermediate bit string one or more bits of said first bit string, said one or more bits not processed by said Boolean operation, and said first bit string being longer than said second bit string, and said Boolean operation being an OR or an EXCLUSIVE OR operation.

171. The apparatus of claim 160 further comprising means for appending to said intermediate bit string one or more bits of said second bit string, said one or more bits not processed by said Boolean operation, and said second bit being longer than said first bit string, and said Boolean operation being an OR or an EXCLUSIVE OR operation.

172. A method using a computer for efficiently processing a Boolean operation on a first and a second run, said first and said second runs comprising a string of one or more contiguous bits of a same polarity, each said run encoded in a compressed format, said compressed format comprising at least a first and a second indicator, said first indicator for indicating a polarity of said one or more same polarity bits and said second indicator for indicating a length of bits in said run, wherein said length is a quantity of said same polarity bits, said method for processing said runs comprises the steps of:
  determining a resultant bit string when said first and said second bit string runs are unequal in length, said step of determining comprising the step comparing said length of said first run with said length of bits of said second run to determine which said run has a longer length and which said run has a shorter length, said shorter length being the length of said resultant bit string;
  determining a resultant bit string when said first and said second runs are equal in length, said step of determining comprising the step designating the length of said resultant bit string equal to said length of said first or said second run;
  determining the polarity of said resultant bit string by performing said Boolean operation on said first indicator of said first run with said first indicator of said second run.

173. The method of claim 172 further comprising the step of comparing said length of said first run with said length of bits of said second run to determine whether said first and said second runs have equal or unequal bit lengths.

174. The method of claim 172 further comprising the step of appending to said resultant bit string one or more bits of said first run, said one or more bits not processed by said Boolean operation, and said length of said first run being longer than said length of said second run, and said Boolean operation being an OR or an EXCLUSIVE OR operation.

175. The method of claim 172 comprising the step of truncating one or more bits from said first run, said one or more bits not processed by said Boolean operation, and said first run being longer than said second run, and said Boolean operation being an AND operation.

176. An apparatus using a computer for efficiently processing a Boolean operation on a first and a second run, said first and second runs comprising a string of one or more contiguous bits of a same polarity, each said run encoded in a compressed format, said compressed format comprising at least a first and a second indicator, said first indicator for indicating a polarity of said same polarity bits and said second indicator for indicating a length of bits in said run, wherein said length is a quantity of said same polarity bits and said opposite polarity bit, said apparatus for efficiently processing said runs comprising:
  means for determining a resultant bit string when said first and said second runs are unequal in length, said means for determining comprising means for comparing said length of said first impulse with said length of said second impulse to determine which said run has a longer length and which run has a shorter length, said shorter length being the length of said resultant bit string;
  means for determining a resultant bit string when said first and said second runs are equal in length, said means for determining comprising the step means for designating the length of said resultant bit string equal to said length of said first or said second runs;
  means for determining the polarity of said resultant bit string by performing said Boolean operation on said first indicator of said first run with said first indicator of said second run.

177. The apparatus of claim 176 further comprising means for comparing said length of bits of said first run with said length of bits of said second run to determine whether said first and second runs have equal or unequal bit lengths.

178. The apparatus of claim 176 further comprising means for appending to said resultant bit string one or more bits of said first run, said one or more bits not processed by said Boolean operation, and said length of said first run being longer than said length of second run, and said Boolean operation being an OR or an EXCLUSIVE OR operation.

179. The apparatus of claim 176 further comprising means for truncating one or more bits from said first run, said one or more bits not processed by said Boolean operation, and said first run is longer than said second run, and said Boolean operation being an AND operation.

* * * * *